United States Patent
Du et al.

(10) Patent No.: US 11,790,847 B2
(45) Date of Patent: Oct. 17, 2023

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Kaipeng Sun, Beijing (CN); Hongjun Zhou, Beijing (CN); Yue Long, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/792,736

(22) PCT Filed: Aug. 11, 2021

(86) PCT No.: PCT/CN2021/112124
§ 371 (c)(1),
(2) Date: Jul. 14, 2022

(87) PCT Pub. No.: WO2022/057528
PCT Pub. Date: Mar. 24, 2022

(65) Prior Publication Data
US 2023/0030891 A1    Feb. 2, 2023

(30) Foreign Application Priority Data

Sep. 21, 2020   (CN) .......................... 202010994036.1

(51) Int. Cl.
*G09G 3/3233*   (2016.01)
*H10K 59/131*   (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ................ G09F 3/3233; H10K 59/131; G09G 2300/0426; G09G 2300/0452;
(Continued)

(56) References Cited

U.S. PATENT DOCUMENTS

2009/0316102  A1*  12/2009  Cho ..................... G09G 3/3611
                                                     349/48
2011/0222004  A1*   9/2011  Kim ........................ G09G 3/36
                                                     349/139
(Continued)

*Primary Examiner* — Peter D McLoone
(74) *Attorney, Agent, or Firm* — Chiwin Law LLC

(57) ABSTRACT

A display substrate and a display device are provided, which includes: a base substrate, a plurality of reset signal lines and a first electrode layer, the first electrode layer includes a plurality of first power supply voltage lines, a plurality of first signal lines, a plurality of first transfer electrodes, a plurality of second transfer electrodes and a plurality of third transfer electrodes, a value of a ratio of an area of an overlapping portion of an orthographic projection of the first body sub-portion and an orthographic projection of the first electrode layer on the board surface of the base substrate, and an area of an overlapping portion of an orthographic projection of the second body sub-portion on the board surface of the base substrate and the orthographic projection of the first electrode layer on the board surface of the base substrate ranges from 0.82 to 1.02.

20 Claims, 22 Drawing Sheets

(52) U.S. Cl.
CPC .............. *G09G 2300/0452* (2013.01); *G09G 2300/0819* (2013.01); *G09G 2300/0842* (2013.01); *G09G 2310/08* (2013.01); *G09G 2330/021* (2013.01)

(58) Field of Classification Search
CPC ... G09G 2300/0819; G09G 2300/0842; G09G 2310/08; G09G 2310/021
See application file for complete search history.

(56) References Cited

U.S. PATENT DOCUMENTS

2022/0328570 A1\* 10/2022 Shang .................. H10K 59/123
2022/0415975 A1\* 12/2022 Hong ................... H10K 59/353

\* cited by examiner

DISPLAY SUBSTRATE AND DISPLAY DEVICE

This application is a U.S. National Phase Entry of International Application No. PCT/CN2021/112124, filed on Aug. 11, 2021, designating the United States of America and claiming priority to Chinese Patent Application No. 202010994036.1, filed on Sep. 21, 2020. The present application claims priority to and the benefit of the above-identified applications and the above-identified applications are incorporated by reference herein in their entirety.

TECHNICAL FIELD

Embodiment of the present disclosure relates to a display substrate and a display device.

BACKGROUND

In the display industry, organic light emitting diode (OLED) display panel has been widely used in various fields such as TV, smartphone, smart wearable, virtual device and automotive display due to its advantages such as light and thin, flexible, excellent seismic performance, fast response, and adaptability to wearable product. With the development of OLED display product, nowadays, "screen ratio" has become a very popular word in appearance of OLED smart products such as smart phones and wearable devices. However, a size of a product cannot be increased indefinitely, getting a higher screen ratio can only start from reducing a size of a frame of the display screen. Therefore, with consumers' pursuit of portable and viewing angle effect of the display product, extreme narrow frame and even full-screen display have become a new trend in the development of OLED products.

SUMMARY

At least one embodiment of the present disclosure provides a display substrate, and the display substrate comprises: a base substrate, a plurality of reset signal lines and a first electrode layer, the base substrate comprises a display region, in which the display region comprises a plurality of sub-pixels, and each of the plurality of sub-pixels comprises a pixel driving circuit and a light-emitting element, the light-emitting element comprises a light-emitting region and a first electrode located in the light-emitting region of the light-emitting element, the pixel driving circuit is configured to drive the light-emitting element to emit light, in which the pixel driving circuit comprises a driving sub-circuit, a data writing sub-circuit, a compensation sub-circuit, a storage sub-circuit, a first light emission control sub-circuit, a second light emission control sub-circuit, a first reset sub-circuit and a second reset sub-circuit, the driving sub-circuit is electrically connected to a first node and a second node, and is configured to control a driving current flowing through the light-emitting element under a control of a level of the first node; the data writing sub-circuit is electrically connected to the second node, and is configured to receive a scanning signal and write a data signal to the driving sub-circuit in response to the scanning signal; the compensation sub-circuit is electrically connected to the first node and a third node, and is configured to receive the scanning signal and perform threshold compensation on the driving sub-circuit in response to the scanning signal; the storage sub-circuit is electrically connected to the first node and is configured to store the data signal; the first light emission control sub-circuit is electrically connected to the second node, and is configured to apply the first power supply voltage to the driving sub-circuit in response to a light emission control signal; the second light emission control sub-circuit is electrically connected to the third node and a fourth node, and is configured to enable the driving current to be applied to the light-emitting element in response to the light emission control signal; the first reset sub-circuit is electrically connected to the first node, and is configured to apply a first reset voltage to the first node in response to a first reset control signal; the second reset sub-circuit is electrically connected to the fourth node, and is configured to apply a second reset voltage to the fourth node in response to a second reset control signal; the driving sub-circuit comprises a first transistor, the data writing sub-circuit comprises a second transistor, the compensation sub-circuit comprises a third transistor, and the storage sub-circuit comprises a storage capacitor, the first light emission control sub-circuit comprises a fourth transistor, the second light emission control sub-circuit comprises a fifth transistor, the first reset sub-circuit comprises a sixth transistor, the second reset sub-circuit comprises a seventh transistor, the plurality of reset signal lines extend along a first direction, and each of the plurality of reset signal lines is electrically connected to the pixel driving circuits of the plurality of sub-pixels located in one row in one-to-one correspondence to provide a reset signal; the first electrode layer comprises a plurality of first power supply voltage lines, a plurality of first signal lines, a plurality of first transfer electrodes, a plurality of second transfer electrodes and a plurality of third transfer electrodes, each of the first transfer electrodes, each of the second transfer electrodes, and each of the third transfer electrodes are located in the pixel driving circuit of each of the plurality of sub-pixels, in which the plurality of first power supply voltage lines extend along a second direction different from the first direction, the plurality of first power supply voltage lines are electrically connected to the pixel driving circuits of the plurality of sub-pixels, and the plurality of first power supply voltage lines are configured to provide the first power supply voltages to the pixel driving circuits, the plurality of first signal lines extend along the second direction and are arranged side by side with the plurality of first power supply voltage lines, and the plurality of first signal lines are configured to provide first display signals to the pixel driving circuits of the plurality of sub-pixels, each of the first transfer electrodes extends along the second direction and is electrically connected to the first transistor and the third transistor, each of the second transfer electrodes extends along the second direction and is electrically connected to the sixth transistor and the reset signal line, each of the third transfer electrodes is electrically connected to the fifth transistor and the light-emitting element, in which the first electrode of each of the plurality of sub-pixels comprises a body portion, the body portion comprises a first body sub-portion and a second body sub-portion, and the first body sub-portion and the second body sub-portion are located at two sides of a center line extending in the second direction of the body portion, a value of a ratio of an area of an overlapping portion of an orthographic projection of the first body sub-portion on a board surface of the base substrate and an orthographic projection of the first electrode layer on the board surface of the base substrate, to an area of an overlapping portion of an orthographic projection of the second body sub-portion on the board surface of the base substrate and the orthographic projection of the first electrode layer on the board surface of the base substrate ranges from 0.82 to 1.02.

For example, in the display substrate provided by at least one embodiment of the present disclosure, a width of a region between two adjacent first power supply voltage lines along the first direction is larger than a width of the light-emitting region of the light-emitting element of each of the plurality of sub-pixels along the first direction.

For example, in the display substrate provided by at least one embodiment of the present disclosure, the light-emitting regions of the light-emitting elements of at least a part of the sub-pixels are located between the orthographic projections of two adjacent first power supply voltage lines on the board surface of the base substrate.

For example, in the display substrate provided by at least one embodiment of the present disclosure, the light-emitting regions of the light-emitting elements of a part of the sub-pixels do not overlap with the orthographic projections of the plurality of first power supply voltage lines on the board surface of the base substrate.

For example, in the display substrate provided by at least one embodiment of the present disclosure, a center line extending along the second direction of the light-emitting regions of the light-emitting elements of a part of the plurality of sub-pixels at least partially overlaps with an orthographic projection of one of the plurality of first power supply voltage lines on the board surface of the base substrate.

For example, in the display substrate provided by at least one embodiment of the present disclosure, the light-emitting regions of the light-emitting elements of a part of sub-pixels partially overlap with an orthographic projection of at least one of the plurality of first power supply voltage lines on the board surface of the base substrate, an overlapping portion of an orthographic projection of at least one of the plurality of first power supply voltage lines on the board surface of the base substrate and the light-emitting regions of the light-emitting elements of a part of the plurality of sub-pixels are symmetrical about a center line extending in the second direction of the light-emitting regions.

For example, the display substrate provided by at least one embodiment of the present disclosure further comprises a pixel definition layer, in which the pixel definition layer is disposed on a side of the pixel driving circuits of the plurality of sub-pixels away from the base substrate, and the pixel definition layer comprises a plurality of openings, the plurality of openings are located in the light-emitting elements of the plurality of sub-pixels in one-to-one correspondence, and each of the plurality of openings is configured to expose the body portion of the first electrode to form the light-emitting region of the light-emitting element.

For example, in the display substrate provided by at least one embodiment of the present disclosure, a value range of a width of a region between two adjacent first power supply voltage lines is 21 microns to 23 microns, a value range of a width of the light-emitting region of the light-emitting element of each of the plurality of sub-pixels along the first direction is about 10 microns to 20.5 microns.

For example, in the display substrate provided by at least one embodiment of the present disclosure, a value range of a distance between center points of corresponding positions of the two adjacent first power supply voltage lines along the first direction is about 24 microns to 30 microns; and a value range of a width of each of the plurality of first power supply voltage lines along the first direction is about 3.3 microns to 7.3 microns.

For example, in the display substrate provided by at least one embodiment of the present disclosure, the light-emitting regions of the light-emitting elements of a part of the sub-pixels do not overlap with orthographic projections of the plurality of first signal lines on the board surface of the base substrate.

For example, the display substrate provided by at least one embodiment of the present disclosure, further comprises a plurality of sub-pixel units arranged in a plurality of rows and a plurality of columns, in which each of the plurality of pixel units comprises a plurality of sub-pixels, the sub-pixels of each of the pixel units comprise a first sub-pixel, a second sub-pixel and a third sub-pixel, the first sub-pixel comprises a first light-emitting element and a first pixel driving circuit, the second sub-pixel comprises a second light-emitting element and a second pixel driving circuit, the third sub-pixel comprises a third light-emitting element and a third pixel driving circuit, a first electrode of the first light-emitting element and a first electrode of the second light-emitting element are arranged along the second direction, and a first electrode of the third light-emitting element is located on a side of both the first electrode of the first light-emitting element and the first electrode of the second light-emitting element along the first direction, in which an orthographic projection of a first electrode of the first sub-pixel on the board surface of the base substrate partially overlaps with an orthographic projection of the first pixel driving circuit and an orthographic projection of the third pixel driving circuit on the board surface of the base substrate, an orthographic projection of a first electrode of the second sub-pixel on the board surface of the base substrate partially overlaps with the orthographic projection of the first pixel driving circuit and the orthographic projection of the third pixel driving circuit on the board surface of the base substrate, and an orthographic projection of a first electrode of the third sub-pixel on the board surface of the base substrate partially overlaps with an orthographic projection of the second pixel driving circuit and the orthographic projection of the third pixel driving circuit on the board surface of the base substrate.

For example, in the display substrate provided by at least one embodiment of the present disclosure, an orthographic projection of the first body sub-portion of the first electrode of the first light-emitting element on the board surface of the base substrate partially overlaps with the orthographic projections of the first power supply voltage line and the first signal line electrically connected to the third pixel driving circuit on the board surface of the base substrate, an orthographic projection of the second body sub-portion of the first electrode of the first light-emitting element on the board surface of the base substrate partially overlaps with the orthographic projection of the first power supply voltage line electrically connected to the first pixel driving circuit on the board surface of the base substrate, an overlapping portion of the orthographic projection of the second body sub-portion and the orthographic projection of the first power supply voltage line electrically connected to the first pixel driving circuit on the board surface of the base substrate is larger than an overlapping portion of the orthographic projection of the first body sub-portion and the orthographic projection of the first power supply voltage line electrically connected to the third pixel driving circuit on the board surface of the base substrate.

For example, in the display substrate provided by at least one embodiment of the present disclosure, the light-emitting region of the first light-emitting element does not overlap with the orthographic projection of the first power supply voltage line of the sub-pixel unit where the first light-emitting element is located on the board surface of the base substrate.

For example, in the display substrate provided by at least one embodiment of the present disclosure, each of the plurality of first power supply voltage lines comprises an S-shaped bent portion, an orthographic projection of the first body sub-portion of the first electrode of the second light-emitting element on the board surface of the base substrate partially overlaps with an orthographic projection of the bent portion of the first power supply voltage line electrically connected to the third pixel driving circuit and the orthographic projection of the first signal line on the board surface of the base substrate, an orthographic projection of the second body sub-portion of the first electrode of the second light-emitting element on the board surface of the base substrate partially overlaps an orthographic projection of the bent portion of the first power supply voltage line electrically connected to the first pixel driving circuit, an orthographic projection of a first connection electrode of the first pixel driving circuit and an orthographic projection of a second connection electrode of the first pixel driving circuit on the board surface of the base substrate.

For example, in the display substrate provided by at least one embodiment of the present disclosure, a center line of a first connection electrode of the second pixel driving circuit extending along the second direction and a center line of the first signal line electrically connected to the second pixel driving circuit extending along the second direction are symmetrical with respect to a center line extending along the second direction of the body portion of the first electrode of the third light-emitting element, an orthographic projection of the first body sub-portion of the first electrode of the third light-emitting element on the board surface of the base substrate partially overlaps with an orthographic projection of a first connection electrode of the second pixel driving circuit on the board surface of the base substrate, an orthographic projection of the second body sub-portion of the first electrode of the third light-emitting element on the board surface of the base substrate partially overlaps with the orthographic projection of the first signal line electrically connected to the second pixel driving circuit on the board surface of the base substrate, an orthographic projection of the center line of the body portion of the first electrode of the third light-emitting element on the board surface of the base substrate partially overlaps with the orthographic projection of the first power supply voltage line electrically connected to the second pixel driving circuit on the board surface of the base substrate.

For example, in the display substrate provided by at least one embodiment of the present disclosure, the first sub-pixel is a red sub-pixel, the second sub-pixel is a green sub-pixel, and the third sub-pixel is a blue sub-pixel.

At least one embodiment of the present disclosure further provides a display device, and the display device comprises any one of the display substrates mentioned above.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical terms and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. Similarly, the terms such as "one", or "the" does not mean a quantitative limit, but at least one. The terms "comprises," "comprising," "includes," "including," etc., are intended to specify that the elements or the objects stated before these terms encompass the elements or the objects listed after these terms as well as equivalents thereof. For convenience of description, "up", "down", "front" and "back" are given in some drawings. In the embodiments of the present disclosure, the vertical direction is a direction from top to bottom, the vertical direction is the gravity direction, the horizontal direction is a direction perpendicular to the vertical direction, and the horizontal direction from right to left is the direction from front to back.

At present, in a frame surrounding a display region of a display panel, the biggest limitation of an extreme narrow frame technology is the design of a bottom frame (such as a region where a data driving circuit is set). Reducing a size of the bottom frame is also a problem that needs to be solved to achieve a narrow frame.

Figure 1:
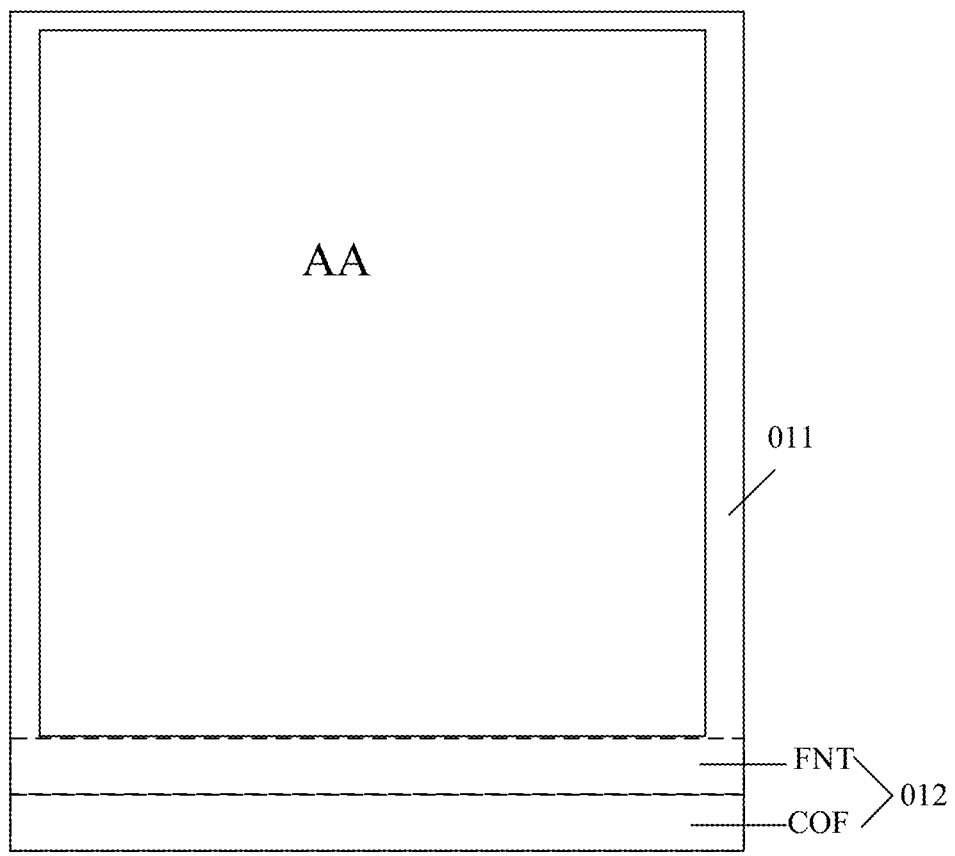
FIG. 1 is a schematic diagram of a display substrate.

FIG. 1 is a schematic diagram of a display substrate. As illustrated in FIG. 1, the display substrate 1 comprises a display region AA and a peripheral region 011 surrounding the display region AA. The peripheral region 011 comprises a lower border 012 on a side of the display region AA. For example, the lower border 012 comprises a fanout region FNT and a bonding region COF. The fanout region FNT is located between the display region AA and the bonding region COF. The bonding region COF is configured to be bonded with a signal input element, for example, the signal input element comprises an integrated circuit (IC), and for another example, the signal input element comprises a data driving circuit IC. The fanout region FNT comprises a plurality of lines electrically connected to signal lines located in the display region AA, and the plurality of lines are further electrically connected to the signal input elements at the bonding region COF. The display region AA comprises a plurality of sub-pixels arranged in an array for displaying a picture.

Whether it is a rigid OLED or a flexible OLED product, the fanout region FNT of the lower frame 012 is connected to the display region AA, and a distance that a metal layer of a row of sub-pixels in the display region (for example, an anode layer of a light-emitting element of the sub-pixel) located close to the fanout region FNT extending out of the display region AA will also occupy a position of the lower frame 012. Therefore, it is possible by arranging a relative position of the anode layer of the light-emitting element of the sub-pixel in the display region AA to reduce the lower frame of the display panel.

At least one embodiment of the present disclosure provides a display substrate, and the display substrate comprises: a base substrate and a plurality of reset signal lines. The base substrate comprises a display region, the display region comprises a plurality of pixel units arranged in a plurality of rows and a plurality of columns, each of the plurality of pixel units comprises a plurality of sub-pixels, and each of the plurality of sub-pixels comprises a pixel driving circuit and a light-emitting element. The light-emitting element comprises a light-emitting region and a first electrode located in the light-emitting region of the light-emitting element, the pixel driving circuit is configured to drive the light-emitting element to emit light; and the plurality of reset signal lines extending along a first direction, and each of the plurality of reset signal lines is electrically connected to the pixel driving circuit of each row of pixel units in one-to-one correspondence to provide a reset signal. Orthographic projections of the first electrodes of the light-emitting elements of the sub-pixels of the plurality of pixel units on a board surface of the base substrate at least partially overlap with orthographic projections of the pixel driving circuits of the sub-pixels of the plurality of pixel units on the board surface of the base substrate, and are located on a same side of the reset signal line electrically connected to the pixel driving circuits of the sub-pixels of the plurality of pixel units.

In the display substrate provided by the above embodiment, the orthographic projections of the first electrodes of the light-emitting elements of the sub-pixels of the plurality of pixel units, at least partially overlap with the orthographic projections of the pixel driving circuits of the sub-pixels of the plurality of pixel units on the board surface of the base substrate, and are located on the same side of the reset signal line electrically connected to the pixel driving circuits of the sub-pixels of the plurality of pixel units, so that the first electrodes of the sub-pixels of the pixel units are all located on a side that the pixel driving circuits of the reset signal lines are located, thereby the light-emitting elements of the sub-pixels do not occupy a space of the lower frame, and the size of the lower frame can be reduced, which is beneficial to realize the narrow frame.

At least one embodiment of the present disclosure further provides a display device comprising any one of the above-mentioned display substrates.

Embodiments of the present disclosure and examples thereof will be described in detail below with reference to accompanying drawings.

Figure 2:
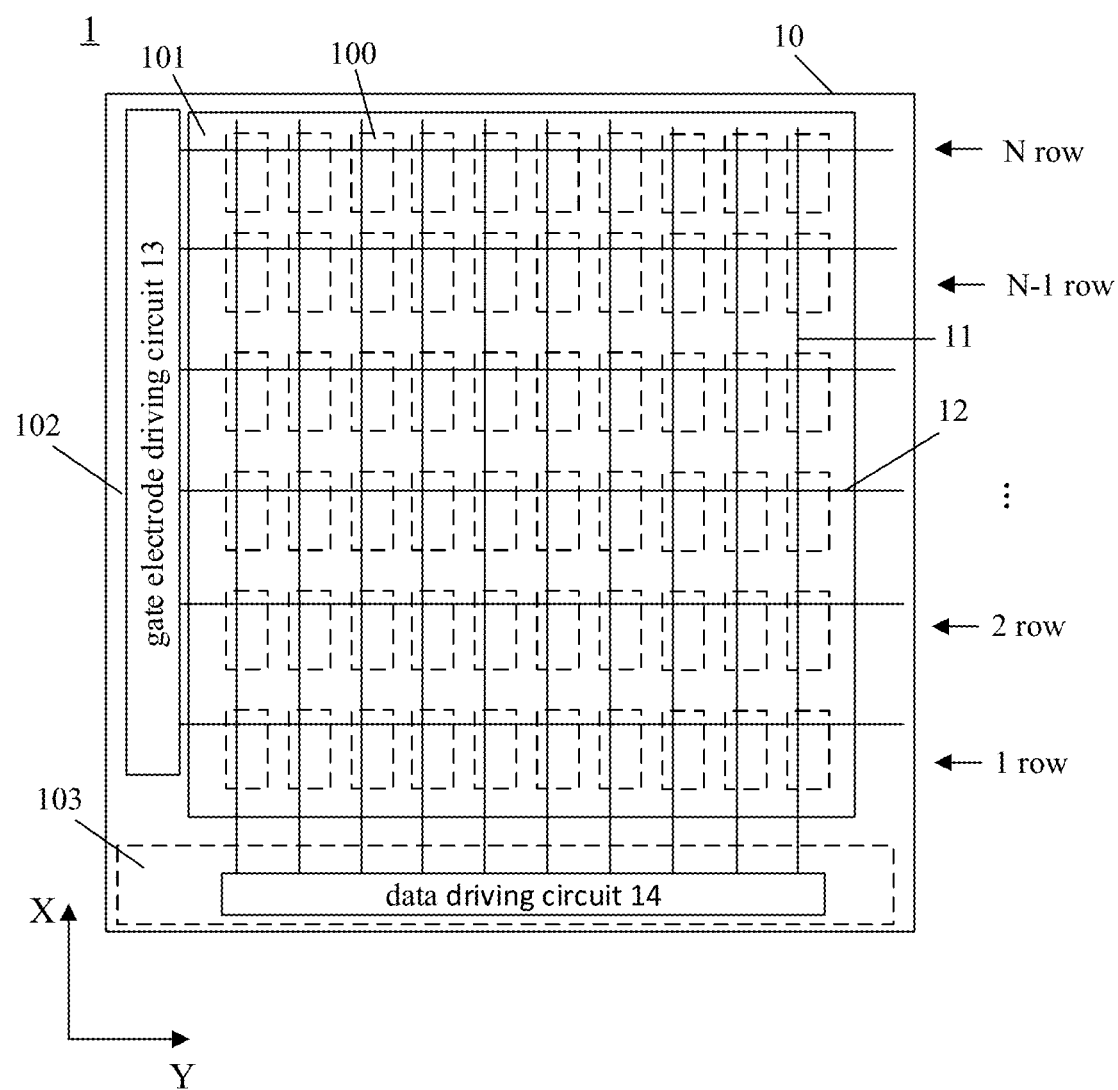
FIG. 2 is a schematic diagram of a display substrate provided by an embodiment of the present disclosure.
Figure 3:
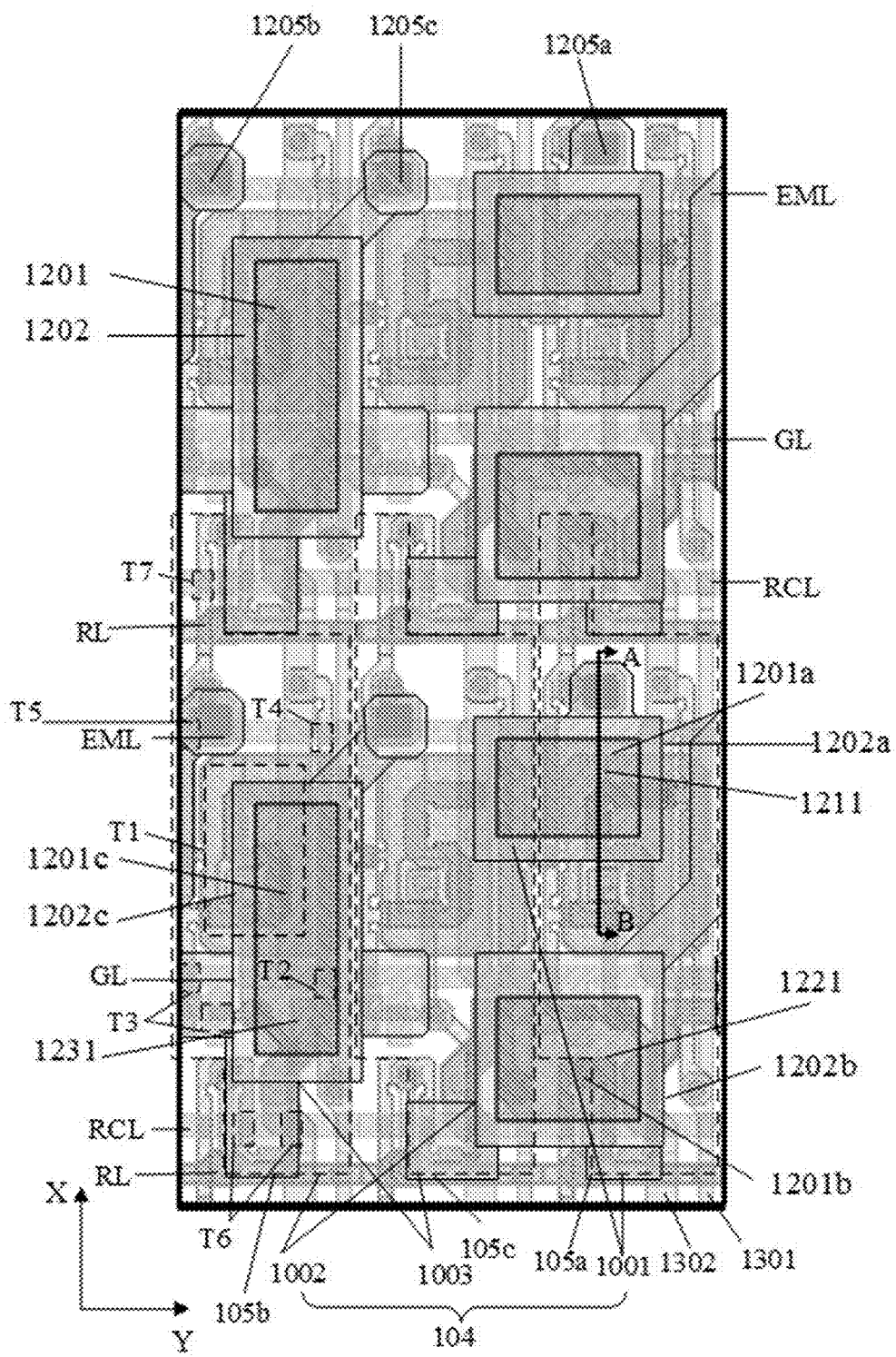
FIG. 3 is a layout diagram of a pixel unit of a display substrate provided by an embodiment of the present disclosure.

FIG. 2 is a schematic diagram of a display substrate provided by an embodiment of the present disclosure; FIG. 3 is a layout diagram of a pixel unit of the display substrate provided by an embodiment of the present disclosure.

As illustrated in FIG. 2, a display substrate 1 comprises a base substrate, and the base substrate comprises a display region 101 and a peripheral region 102. The display region 101 comprises a plurality of sub-pixels 100. The peripheral region 102 comprises a bonding region 103. The bonding region 103 is located on a side of the display region 101 (for example, a lower part in the figure). For example, the plurality of sub-pixels 100 are arranged in a plurality of rows and a plurality of columns along a first direction Y and a second direction X. The first direction Y and the second direction X are different, for example, they are orthogonal.

Figure 4A:
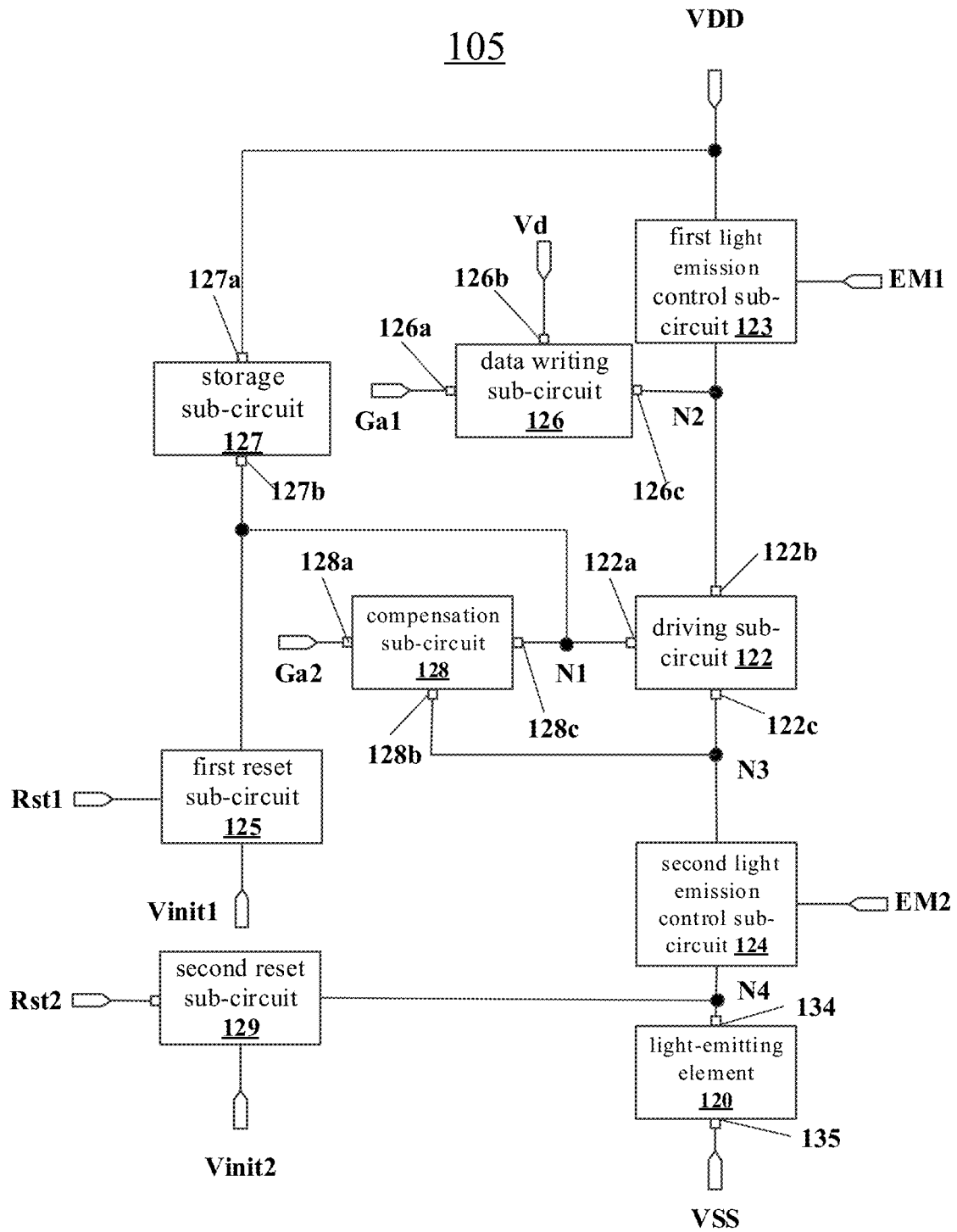
FIG. 4A is a schematic diagram of a pixel driving circuit of the display substrate provided by an embodiment of the present disclosure.
Figure 12:
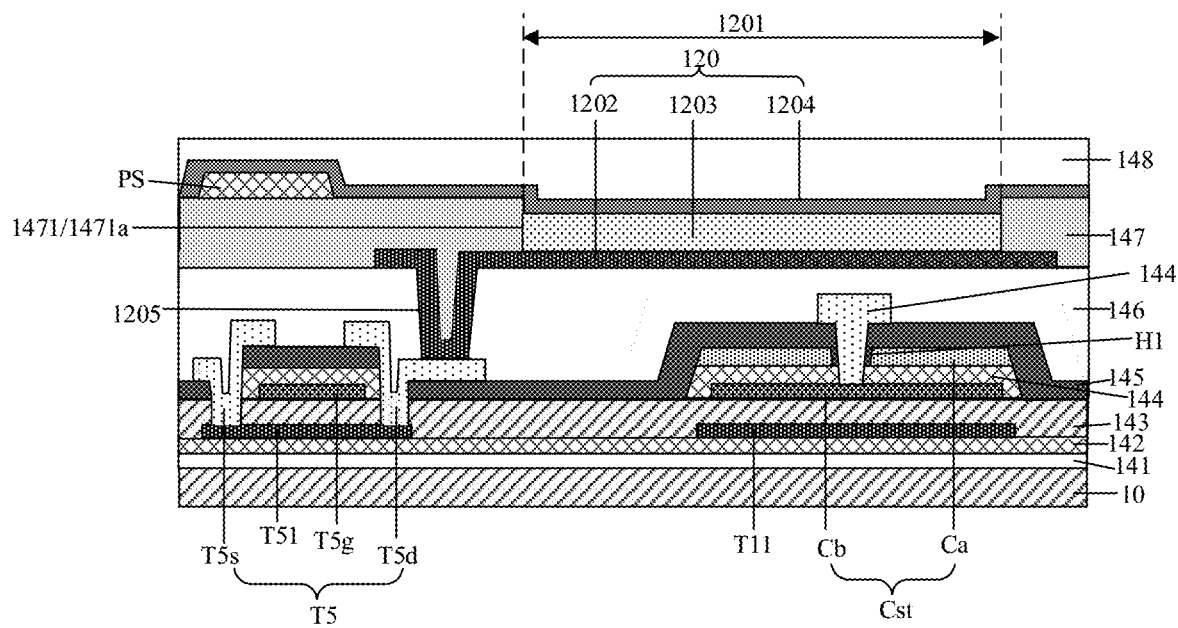
FIG. 12 is a cross-sectional diagram of the display substrate illustrated in FIG. 3 by taking along a line of A-B.

Each of the sub-pixels 100 comprises a light-emitting element 120 (as illustrated in FIG. 12) and a pixel driving circuit 105 (as illustrated in FIG. 4A) that drives the light-emitting element 120 to emit light. For example, a plurality of pixel driving circuits 105 are arranged in an array along the first direction Y and the second direction X. For example, the sub-pixels can be in a manner of conventional RGB. In other embodiments, the sub-pixels may further constitute a pixel unit in a manner of sharing the sub-pixels (for example, pentile) to realize a full-color display, and the present disclosure is not limited to the arrangement of the sub-pixels.

For example, as illustrated in FIG. 2, the display substrate 1 further comprises a plurality of gate lines 12 (for example, scanning signal lines, light emission control lines, reset control lines, etc.), a plurality of data lines 11 and a plurality of pixel regions located in the display region 101, and one sub-pixel 100 is correspondingly set in each of the pixel regions. For example, the gate lines 12 extend along the first direction Y, and the data lines 11 extend along the second direction X. FIG. 2 only illustrates the approximate positional relationship of the gate lines 12, the data lines 11 and the sub-pixels 100 in the display substrate, which can be specifically designed according to actual needs.

The pixel driving circuit 105 is, for example, a 2T1C (that is, two transistors and one capacitor) pixel driving circuit, and an nTmC (n, m are positive integers) pixel driving circuit such as 4T2C, 5T1C, and 7T1C. In different embodiments, the pixel driving circuit 105 may further comprise a compensation sub-circuit, the compensation sub-circuit comprises an internal compensation sub-circuit or an external compensation sub-circuit, and the compensation sub-circuit may comprise a transistor, a capacitor, and the like. For example, according to requirement, the pixel driving circuit 105 may further comprise a reset circuit, a light emission control sub-circuit, a detection circuit, and so on.

For example, the display substrate 1 further comprises a gate electrode driving circuit 13 located in the peripheral region 102 and a data driving circuit 14 located in the bonding region 103. The gate electrode driving circuit 13 is electrically connected to the pixel driving circuit 105 through the gate line 12 to provide various scanning signals (for example, a gate electrode scanning signal, a light emission control signal, a reset control signal, etc.), and the data driving circuit 14 is electrically connected to the pixel driving circuit 105 through the data line 11 to provide a data signal. A positional relationship of the gate electrode driving circuit 13, the data driving circuit 14, the gate line 12 and the data line 11 in the display substrate illustrated in FIG. 2 is just an example, and an actual arrangement position can be designed according to requirement.

For example, the display substrate 1 further comprises a control circuit (not illustrated). For example, the control circuit is configured to control the data driving circuit 14 to apply the data signal, and to control the gate electrode driving sub-circuit to apply the scanning signal. An example of the control circuit is a timing control circuit (T-con). The control circuit may be in various forms, and comprises, for example, a processor and a memory, the memory comprises an executable code, and the processor runs the executable code to perform the detection method described above.

For example, the processor is a central processor unit (CPU) or a processor device with data processing capability and/or instruction execution capability in other forms, which may comprise, for example, a microprocessor, a programmable logic controller (PLC) and so on.

For example, a storage device comprises one or more computer program products, which may comprise computer-readable storage media in various forms, such as a volatile memory and/or a non-volatile memory. The volatile memory may comprise, for example, a random access memory (RAM) and/or a cache memory (cache), and the like. The non-volatile memory may comprise, for example, a read only memory (ROM), a hard disk, a flash memory, and the like. One or more computer program instructions may be stored on the computer-readable storage media, and the processor may run the function desired by the program instructions. Various application programs and various data can further be stored in the computer-readable storage media.

For example, as illustrated in FIG. 3, the display region comprises a plurality of pixel units 104, and each of the pixel units 104 comprises a plurality of sub-pixels 100. For example, each of the pixel units 104 comprises a first sub-pixel 1001, a second sub-pixel 1002 and a third sub-pixel 1003. The light-emitting element 120 of each of the sub-pixels 100 comprises a light-emitting region 1201. For example, the light-emitting element 120 of the first sub-pixel 1001 comprises a light-emitting region 1201a, the light-emitting element of the second sub-pixel 1002 comprises a light-emitting region 1201b, and the light-emitting element 120 of the third sub-pixel 1003 comprises a light-emitting region 1201c.

For example, as illustrated in FIG. 3, the display substrate 1 further comprises a plurality of reset signal lines RL. The plurality of reset signal lines RL extend along the first direction Y. Each of the plurality of reset signal lines RL is electrically connected to the pixel driving circuits 105 of the sub-pixels 100 of each row of the pixel units 104 in a one-to-one correspondence to provide a reset signal (for example, a reset voltage). For example, FIG. 3 illustrates two reset signal lines RL, and the reset signal line RL located at the bottom of the figure is electrically connected to a pixel driving circuit 105a of the first sub-pixel 1001, a pixel driving circuit 105b of the second sub-pixel 1002, and a pixel driving circuit 105c of the third sub-pixel 1003.

For example, as illustrated in FIG. 3, orthographic projections of first electrodes 1202 of the light-emitting elements 120 of each of the sub-pixels 100 of the pixel unit 104 on a board surface S of the base substrate 10, at least partially overlap with the orthographic projections of the pixel driving circuits 105 of each of the sub-pixels 100 of the pixel units 104 on the board surface S of the base substrate 10, and are located on a same side of the reset signal line RL electrically connected to the pixel driving circuits 105 of the sub-pixels 100 of the plurality of pixel units 104. For example, an orthographic projection of the first electrode 1202a of the first sub-pixel 1001 on the board surface S of the base substrate 10, partially overlaps with an orthographic projection of the first pixel driving circuit 105a and an orthographic projection of the third pixel driving circuit 105c on the board surface S of the base substrate 10. An orthographic projection of the first electrode 1202b of the second sub-pixel 1002 on the board surface S of the base substrate 10, partially overlaps with the orthographic projection of the first pixel driving circuit 105a and the orthographic projection of the third pixel driving circuit 105c on the board surface S of the base substrate 10, and an orthographic projection of the first electrode 1202c of the third sub-pixel 1003 on the board surface S of the base substrate 10, partially overlaps with an orthographic projection of the second pixel driving circuit 105b and the orthographic projection of the third pixel driving circuit 105c on the board surface S of the base substrate 10. Orthographic projections of the first electrode 1202a of the first sub-pixel 1001, the first electrode 1202b of the second sub-pixel 1002 and the first electrode 1202c of the third sub-pixel 1003 on the board surface S of the base substrate 10 are located on the upper side of the reset signal line RL (located at the bottom of FIG. 3), so that the orthographic projection of the first electrode 1202 of the light-emitting element 120 of the sub-pixel 100 of on the board surface of the base substrate, does not protrude outside the reset signal line RL in a direction perpendicular to the reset signal line RL (for example, at the bottom of the reset signal line RL), thereby the light-emitting element 120 of the sub-pixel 100 does not occupy the space of the lower frame, which can reduce the size of the lower frame, and is beneficial to realize the narrow frame.

For example, as illustrated in FIG. 2, the plurality of sub-pixels 100 in the display region 101 are arranged in N rows from the side close to the bonding region 103 to the side away from the bonding region 103. N is an integer greater than or equal to 2. The gate electrode driving circuit 13 scans line by line from the side close to the bonding region 103 to the side far away from the bonding region 103 to drive the plurality of sub-pixels 100 to display images, for example, to provide the scanning signals, the light emission control signals and the reset control signals to the plurality of sub-pixels 100 line by line.

For example, the pixel driving circuit 105 comprises a driving sub-circuit, a data writing sub-circuit, a compensation sub-circuit, and a storage sub-circuit, and may further comprise the light emission control sub-circuit, the reset circuit, and so on according to requirements. For example, the lighting control sub-circuit may comprise a first light emission control sub-circuit and a second light emission control sub-circuit. The reset circuit may comprise a first reset sub-circuit and a second reset sub-circuit.

Figure 4B:
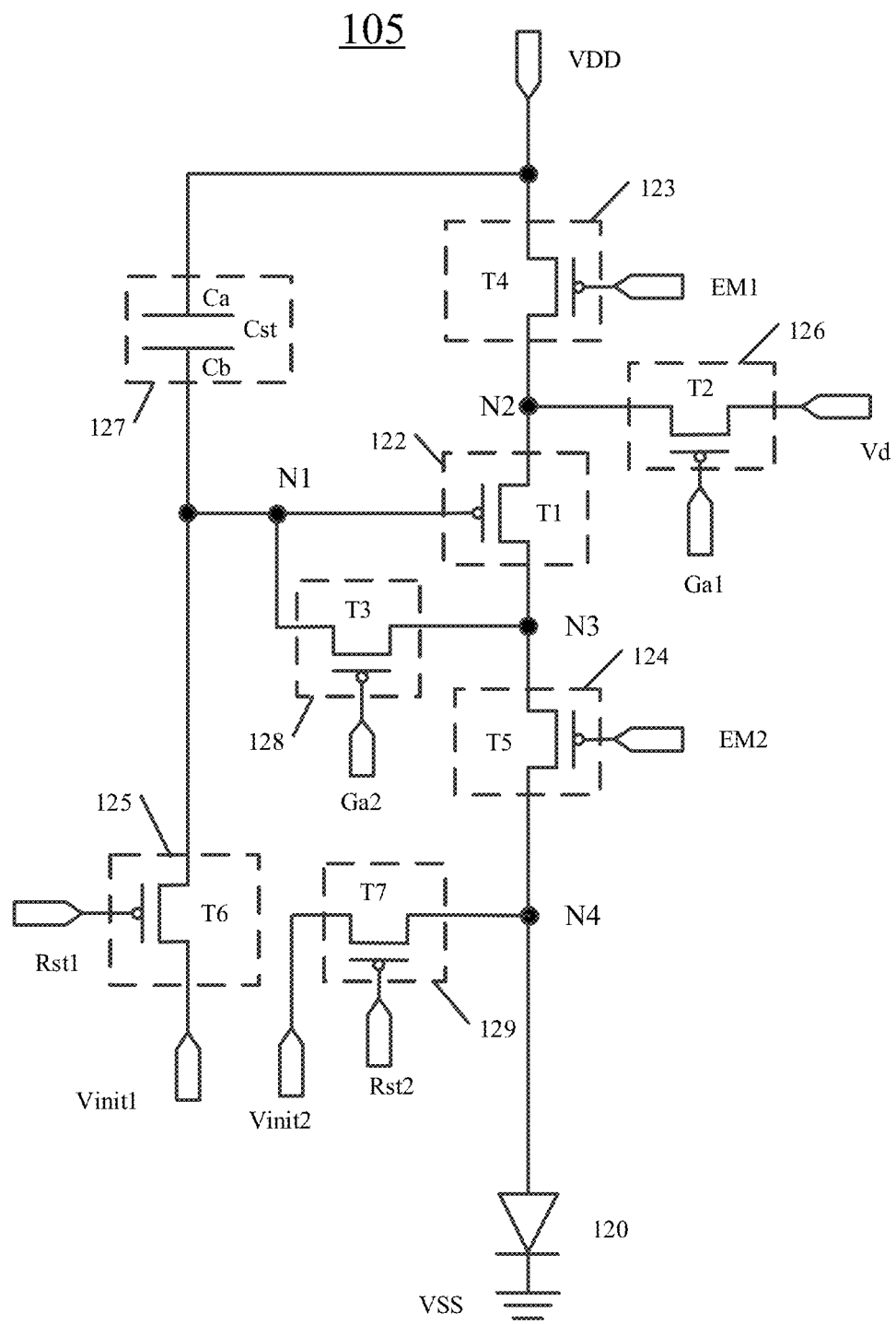
FIG. 4B is a schematic diagram of a pixel driving circuit of the display substrate provided by another embodiment of the present disclosure.

FIG. 4A is a schematic diagram of a pixel driving circuit of the display substrate provided by an embodiment of the present disclosure; FIG. 4B is a schematic diagram of a pixel driving circuit of the display substrate provided by another embodiment of the present disclosure.

As illustrated in FIG. 4A, the pixel driving circuit 105 comprises a driving sub-circuit 122 and a compensation sub-circuit 128.

For example, the driving sub-circuit 122 is electrically connected to a first node N1 and a second node N2, and is configured to control a driving current flowing through the light-emitting element 120 under a control of a level of the first node N1. The driving sub-circuit 122 comprises a control terminal (control electrode) 122a, a first terminal (first electrode) 122b, and a second terminal (second electrode) 122c, and is configured to be connected to the light-emitting element 120 and to control the driving current flowing through the light-emitting element 120. The control terminal 122a of the driving sub-circuit 122 is connected to the first node N1, the first terminal 122b of the driving sub-circuit 122 is connected to the second node N2, and the second terminal 122c of the driving sub-circuit 122 is connected to the third node N3.

For example, the compensation sub-circuit 128 is electrically connected to the first node N1 and the third node N3, and is configured to receive the scanning signal and perform threshold compensation on the driving sub-circuit 122 in response to the scanning signal. For example, the scanning signal is the gate electrode scanning signal provided by the scanning signal line. The compensation sub-circuit 128 comprises a control terminal (control electrode) 128a, a first terminal (first electrode) 128b and a second terminal (second electrode) 128c, the control terminal 128a of the compensation sub-circuit 128 is configured to receive a scanning signal Ga2, the first terminal 128b and the second terminal 128c of the compensation sub-circuit 128 are respectively electrically connected to the second terminal 122c and the control terminal 122a of the driving sub-circuit 122, and the compensation sub-circuit 128 is configured to perform threshold compensation on the driving sub-circuit 122 in response to the scanning signal Ga2.

For example, the pixel driving circuit 105 further comprises a data writing sub-circuit 126, a storage sub-circuit 127, a first light emission control sub-circuit 123, a second light emission control sub-circuit 124, a first reset sub-circuit 125 and a second reset sub-circuit 129.

For example, the data writing sub-circuit is electrically connected to the second node N2, and is configured to receive the scanning signal and write the data signal to the driving sub-circuit data 122 in response to the scanning signal. The writing sub-circuit 126 comprises a control terminal 126a, a first terminal (first electrode) 126b and a second terminal (second electrode) 126c, the control terminal 126a is configured to receive a scanning signal Ga1, and the first terminal 126b is configured to receive a data signal Vd, the second terminal 126c is connected to the first terminal 122b (that is, the second node N2) of the driving sub-circuit 122. The data writing sub-circuit 126 is configured to write the data signal Vd to the first terminal 122b of the driving sub-circuit 122 in response to the scanning signal Ga1. For example, the first terminal 126b of the data writing sub-circuit 126 is connected to a data line 1301 (as illustrated in FIG. 3) to receive the data signal Vd, and the control terminal 126a is connected to a scanning signal line GL (as illustrated in FIG. 3) to receive the scanning signal Ga1. For example, in a data writing and compensation stage, the data writing sub-circuit 126 can be turned on in response to the scanning signal Ga1, so as to write the data signal into the first terminal 122b (the second node N2) of the driving sub-circuit 122, and storing the data signal in the storage sub-circuit 127, and generating a driving current for driving the light-emitting element 120 to emit light according to the data signal during, for example, a light-emitting stage.

For example, the scanning signal Ga1 may be the same as the scanning signal Ga2. For example, the scanning signal Ga1 may be connected to a same signal output terminal as the scanning signal Ga2. For example, the scanning signal Ga1 may be transmitted through a same scanning signal line GL as the scanning signal Ga2.

In other examples, the scanning signal Ga1 may be different from the scanning signal Ga2. For example, the scanning signal Ga1 and the scanning signal Ga2 are connected to a different signal output terminals. For example, the scanning signal Ga1 and the scanning signal Ga2 may be transmitted through different scanning signal lines GL respectively.

For example, the storage sub-circuit 127 is electrically connected to the first node N1 and is configured to store the data signal. The storage sub-circuit 127 comprises a first terminal (also referred to as a first storage electrode) 127a and a second terminal (also referred to as a second storage electrode) 127b, the first terminal 127a of the storage sub-circuit is configured to receive a first power supply voltage VDD, and the second terminal 127b of the storage sub-circuit is electrically connected to the control terminal 122a of the driving sub-circuit. For example, in the data writing and compensation stage, the compensation sub-circuit 128 can be turned on in response to the scanning signal Ga2, so that the data signal written by the data writing sub-circuit 126 can be stored in the storage sub-circuit 127; at the same time, the compensation sub-circuit 128 can electrically connect the control terminal 122a with the second terminal 122c of the driving sub-circuit 122, so that relevant information of the threshold voltage of the driving sub-circuit 122 can also be correspondingly stored in the storage sub-circuit, thereby, for example, in the light-emitting stage, the driving sub-circuit 122 can be controlled by using the stored data signal and the threshold voltage, so that an output of the driving sub-circuit 122 is compensated.

For example, in the data writing and compensation stage, the compensation sub-circuit 128 can be turned on in response to the scanning signal Ga2, so that the data signal written by the data writing sub-circuit 126 can be stored in the storage sub-circuit 127. For example, in the data writing and compensation stages, the compensation sub-circuit 128 can electrically connect the control terminal 122a with the second terminal 122c of the driving sub-circuit 122, so that the relevant information of the threshold voltage of the driving sub-circuit 122 can further be stored accordingly in the storage sub-circuit, for example, the stored data signal and the threshold voltage can be used to control the driving sub-circuit 122 in the light-emitting stage, so that the output of the driving sub-circuit 122 is compensated.

For example, the first light emission control sub-circuit 123 is electrically connected to the second node N2, and is configured to apply the first power supply voltage VDD to the driving sub-circuit 122 in response to the light emission control signal. The first light emission control sub-circuit 123 is connected to the first terminal 122b (the second node N2) of the driving sub-circuit 122 and the first power supply voltage terminal VDD, and is configured to supply the first power supply voltage VDD of the first power supply voltage terminal VDD to the first terminal 122b of the driving sub-circuit 122 in response to the light emission control signal EM1. For example, as illustrated in FIG. 4B, the first light emission control sub-circuit 123 is connected to a light emission control terminal EM1, the first power supply voltage terminal VDD and the second node N2.

For example, the second light emission control sub-circuit 124 is electrically connected to a third node N3 and a fourth node N4, and is configured to enable the driving current to be applied to the light-emitting element 120 in response to the light emission control signal. The second light emission control sub-circuit 124 is connected to a light emission control terminal EM2, a first terminal (first electrode) 134 of the light-emitting element 120, and the second terminal 122c of the driving sub-circuit 122, and is configured to enable driving current to be applied to the light-emitting element 120 in response to the light emission control signal EM2.

For example, in the light-emitting stage, the second light emission control sub-circuit 124 is turned on in response to the light emission control signal EM2 provided by the light emission control terminal EM2, so that the driving sub-circuit 122 can be electrically connected to the light-emitting element 120 through the second light emission control sub-circuit 123, thereby the light-emitting element 120 is driven to emit light under the control of the driving current; and in a non light-emitting stage, the second light emission control sub-circuit 123 is turned off in response to the second light emission control signal EM2, so as to avoid current flowing through the light-emitting element 120 to make it emit light, which improves a contrast ratio of a corresponding display device.

For another example, in an initialization stage, the second light emission control sub-circuit 124 may further be turned on in response to the second light emission control signal, so as to perform a reset operation on the driving sub-circuit 122 and the light-emitting element 120 combining with a reset circuit.

For example, the light emission control signal EM2 is the same as the light emission control signal EM1. For example, the light emission control signal EM2 and the light emission control signal EM1 can be connected to a same signal output terminal. For example, the light emission control signal EM2 and the light emission control signal EM1 can be transmitted through a same light emission control signal line EML (illustrated in FIG. 3).

In other examples, the light emission control signal EM2 may be different from the light emission control signal EM1. For example, the light emission control signal EM2 and light emission control signal EM1 may be respectively connected to different signal output terminals. For example, the light emission control signal EM2 and the light emission control signal EM1 may be transmitted through different light emission control lines, respectively.

For example, the first reset sub-circuit 125 is electrically connected to the first node N1, and is configured to apply a first reset voltage Vinit1 to the first node N1 in response to a first reset control signal Rst1. The first reset sub-circuit 125 is connected to a first reset voltage terminal Vinit1 and the control terminal 122a (the first node N1) of the driving sub-circuit 122, and is configured to supply the first reset voltage Vinit1 (for example, the first node N1) to the control terminal 122a of the driving sub-circuit 122 in response to the first reset control signal Rst1.

For example, the second reset sub-circuit 129 is electrically connected to the fourth node N4, and is configured to apply a second reset voltage Vinit2 to the fourth node N4 in response to a second reset control signal Rst2. The second reset sub-circuit 129 is connected to a second reset voltage terminal Vinit2 and the first terminal 122b (the fourth node N4) of the light-emitting element 122, and is configured to supply the second reset voltage Vinit2 (that is the second reset signal) to the first terminal 134 of the light-emitting element 120 in response to the second reset control signal Rst2.

For example, the first reset sub-circuit 125 and the second reset sub-circuit 129 may be turned on in response to the first reset control signal Rst1 and the second reset control signal Rst2, respectively, so that the second reset voltage Vinit2 may be applied to the first node N1, and the first reset voltage Vinit1 is applied the first terminal 134 of the light-emitting element 120, respectively, so that the driving sub-circuit 122, the compensation sub-circuit 128 and the light-emitting element 120 can be reset to eliminate an influence of the previous light-emitting stage.

For example, the first reset control signal Rst1 and the first reset voltage Vinit1 of each row of sub-pixels 100 are provided by the reset control signal line RCL (as illustrated in FIG. 3) and the reset signal line RL electrically connected to the row of the sub-pixels 100. For example, the second reset control signal Rst2 and the second reset voltage Vinit2 of each row of the sub-pixels 100 are provided by the reset control signal line RCL (as illustrated in FIG. 3) and the reset signal line RL electrically connected to the next row of sub-pixels 100 of the row of the sub-pixels 100.

For example, the light-emitting element 120 comprises the first terminal (also referred to as a first electrode) 134 and a second terminal (also referred to as a second electrode) 135, and the first terminal 134 of the light-emitting element 120 is configured to be connected with the second terminal 122c of the driving sub-circuit 122, and the second terminal 135 (for example, the second electrode) of the light-emitting element 120 is configured to be connected to a second power supply voltage terminal VSS. For example, in an example, as illustrated in FIG. 4B, the first terminal 134 of the light-emitting element 120 may be connected to the fourth node N4 through the second light emission control sub-circuit 124. Embodiments of the present disclosure comprise, but are not limited to this situation.

For example, in the embodiments of the present disclosure, a second power supply voltage VSS provided by the second power supply voltage terminal VSS is supplied to the second terminal 135 of the light-emitting element 120. The first power supply voltage VDD is at a high level, and the second power supply voltage VSS is at a low level.

It should be noted that, in the descriptions of the embodiments of the present disclosure, the first node N1, the second node N2, the third node N3 and the fourth node N4 do not necessarily represent actual components, but represent junctions of related circuit connections in a circuit diagram.

It should be noted that, in the descriptions of the embodiments of the present disclosure, a symbol Vd can represent both the data signal terminal and a level of the data signal, and similarly; symbols Ga1 and Ga2 can represent both the scanning signals and the scanning signal terminals; Rst1 and Rst2 can represent the first reset control terminal and the second reset control terminal respectively, and can also represent the first reset control signal and the second reset control signal respectively; symbols Vinit1 and Vinit2 can represent the first reset voltage terminal and the second reset voltage terminal respectively, and can also represent the first reset voltage and the second reset voltage respectively; the symbol VDD can represent both the first power supply voltage terminal and the first power supply voltage, and the symbol VSS can represent both the second power supply voltage terminal and the second power supply voltage. Following embodiments are the same and will not be repeated.

As illustrated in FIG. 4B, the pixel driving circuit 105 comprises a first transistor T1, a second transistor T2, a third transistor T3, a fourth transistor T4, a fifth transistor T5, a sixth transistor T6, a seventh transistor T7, and a storage capacitor Cst. For example, the first transistor T1 is used as a driving transistor, and the other for example, the second transistor to the seventh transistor are used as switching transistors.

For example, as illustrated in FIG. 4B, the driving sub-circuit 122 may be implemented as the first transistor T1. A gate electrode of the first transistor T1 serves as the control terminal 122a of the driving sub-circuit 122, and is connected to the first node N1. A first electrode of the first transistor T1 serves as the first terminal 122b of the driving sub-circuit 122 and is connected to the second node N2; a second electrode of the first transistor T1 serves as the second terminal 122c of the driving sub-circuit 122 and is connected to the third node N3.

For example, as illustrated in FIG. 4B, the data writing sub-circuit 126 may be implemented as the second transistor T2. The gate electrode of the second transistor T2 is connected to the scanning signal line GL (the scanning signal terminal Ga1) to receive the scanning signal Ga1, the first electrode of the second transistor T2 is connected to the data line 1301 (the data signal terminal Vd) to receive the data signal Vd, the second electrode of the second transistor T2 is connected to the first terminal 122b (the second node N2) of the driving sub-circuit 122.

For example, as illustrated in FIG. 4B, the compensation sub-circuit 128 may be implemented as the third transistor T3. The gate electrode, the first electrode and the second electrode of the third transistor T3 serve as the control electrode 128a, the first electrode 128b and the second electrode 128c of the compensation sub-circuit, respectively. The gate electrode of the third transistor T3 is configured to be connected to the scanning signal line GL (the scanning signal terminal Ga2) to receive the scanning signal Ga2, the first electrode of the third transistor T3 is connected to the second terminal 122c of the driving sub-circuit 122 (the third node N3), and the second electrode of the third transistor T3 is connected to the control terminal 122a (the first node N1) of the driving sub-circuit 122.

For example, as illustrated in FIG. 4B, the storage sub-circuit 127 may be implemented as the storage capacitor Cst, the storage capacitor Cst comprises a first capacitor electrode Ca and a second capacitor electrode Cb, the first capacitor electrode Ca is coupled to the first power supply voltage terminal VDD, for example, electrically connected, the second capacitor electrode Cb and the control terminal 122a of the driving sub-circuit 122 are coupled, for example, electrically connected.

For example, as illustrated in FIG. 4B, the first light emission control sub-circuit 123 may be implemented as the fourth transistor T4. The gate electrode of the fourth transistor T4 is connected to the light emission control line EML (the light emission control terminal EM1) to receive the light emission control signal EM1, the first electrode of the fourth transistor T4 is connected to the first power supply voltage terminal VDD to receive the first power supply voltage VDD, the second electrode of the fourth transistor T4 is connected to the first terminal 122b (the second node N2) of the driving sub-circuit 122.

For example, the light-emitting element 120 is implemented as a light-emitting diode (LED), such as the organic light-emitting diode (OLED), a quantum dot light-emitting diode (QLED), or an inorganic light-emitting diode, such as a micro light-emitting diode (Micro LED) or a micro OLED. For example, the light-emitting element 120 may be a top emission structure, a bottom emission structure, or a double-sided emission structure. The light-emitting element 120 can emit red light, green light, blue light or white light, and so on. The embodiments of the present disclosure do not limit the specific structure of the light-emitting element.

For example, the first electrode 134 (for example, an anode) of the light-emitting element 120 is connected to the fourth node N4 and configured to be connected to the second terminal 122c of the driving sub-circuit 122 through the second light emission control sub-circuit 124, and the second electrode 135 (for example, a cathode) of the light-emitting element 120 is configured to be connected to the second power supply voltage terminal VSS to receive the second power supply voltage VSS. The electric current flowing from the second terminal 122c of the driving sub-circuit 122 to the light-emitting element 120 determines the brightness of the light-emitting element. For example, the second power supply voltage terminal may be grounded, that is, the VSS may be 0V. For example, the second voltage supply voltage VSS may be a negative voltage.

For example, the second lighting control sub-circuit 124 may be implemented as the fifth transistor T5. The gate electrode of the fifth transistor T5 is connected to the light emission control line EML (light emission control terminal EM2) to receive the light emission control signal EM2. The first electrode of the fifth transistor T5 is connected to the second terminal 122c (third node N3) of the driving sub-circuit 122, and the second electrode of the fifth transistor T5 is connected to the first terminal 134 (fourth node N4) of the light-emitting element 120.

For example, the first reset sub-circuit 125 may be implemented as the sixth transistor T6, and the second reset sub-circuit may be implemented as the seventh transistor T7. The gate electrode of the sixth transistor T6 is configured to be connected to the first reset control terminal Rst1 to receive the first reset control signal Rst1, the first electrode of the sixth transistor T6 is connected to the first reset voltage terminal Vinit1 to receive the first reset voltage Vinit1, the second electrode of the sixth transistor T6 is configured to be connected to the first node N1. The gate electrode of the seventh transistor T7 is configured to be connected to the second reset control terminal Rst2 to receive the second reset control signal Rst2, and the first electrode of the seventh transistor T7 is connected to the second reset voltage terminal Vinit2 to receive the second reset voltage Vinit2, the second electrode of the seventh transistor T7 is configured to be connected to the fourth node N4.

It should be noted that, the transistors used in the embodiments of the present disclosure may all be thin film transistors, field effect transistors, or other switching devices with the same characteristics, and the thin film transistors are used as examples in the embodiments of the present disclosure. A source electrode and a drain electrode of the transistor used here may be symmetrical in structure, so that the source electrode and the drain electrode of the transistor may be the same in structure. In the embodiments of the present disclosure, in order to distinguish the two electrodes of the transistor except the gate electrode, one electrode is directly described as the first electrode, and the other electrode is the second electrode.

In addition, transistors can be divided into an N-type transistor and a P-type transistor according to their characteristics. In the case where the transistor is the P-type transistor, a turn-on voltage is a low level voltage (for example, 0V, −5V, −10V, or other suitable voltages), and a turn-off voltage is a high level voltage (for example, 5V, 10V, or other suitable voltages); in the case where the transistor is the N-type transistor, the turn-on voltage is a high level voltage (for example, 5V, 10V or other suitable voltage), and the turn-off voltage is a low level voltage (for example, 0V, −5V, −10V or other suitable voltage). For example, as illustrated in FIG. 4B, the first transistor to the seventh transistor T1 to T7 are all P-type transistors, such as low temperature polysilicon thin film transistors. However, the embodiments of the present disclosure do not limit the type of the transistors, and in the case where the type of the transistors changes, a connection relationship of the circuit can be adjusted accordingly.

Figure 4C:
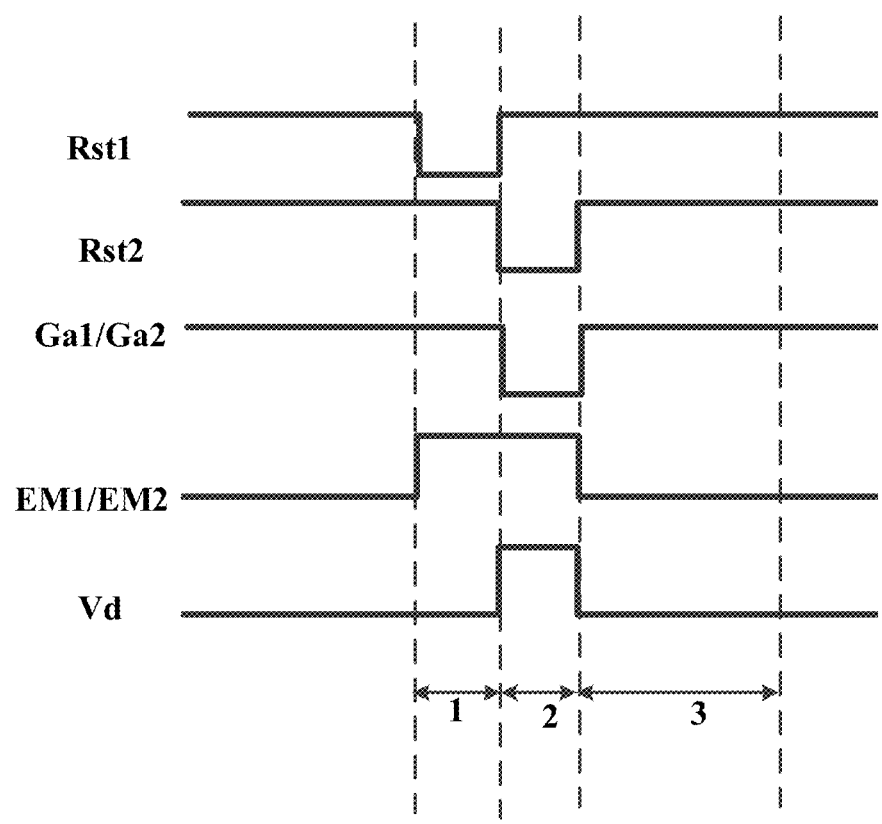
FIG. 4C is a timing signal diagram of the pixel driving circuit illustrated in FIG. 4B provided by an embodiment of the present disclosure.

FIG. 4C is a timing signal diagram of the pixel driving circuit illustrated in FIG. 4B provided by an embodiment of the present disclosure. An operation principle of the pixel driving circuit illustrated in FIG. 4B will be described below with reference to the signal timing diagram illustrated in FIG. 4C.

As illustrated in FIG. 4C, a display process of each frame of image comprises three stages, which are an initialization stage 1, a data writing and compensation stage 2, and a light-emitting stage 3.

As illustrated in FIG. 4C, in the present embodiment, the scanning signal Ga1 and the scanning signal Ga2 use the same signal, the light emission control signal EM1 and the light emission control signal EM2 use the same signal; and a waveform of the second reset control signal Rst2 is the same as a waveform of the scanning signal Ga1/Ga2, that is, the second reset control signal Rst2 and the scanning signal Ga1/Ga2 can adopt the same signal; the waveform of the first reset voltage vinit1 of the sub-pixel in the row is the same as that of the scanning signal Ga1/Ga2 of the sub-pixel in the previous row, that is, the same signal is used. However, this is not a limitation of the present disclosure. In other embodiments, different signals may be used as the scanning signal Ga1, the scanning signal Ga2, the first reset control signal Rst1, and the second reset control signal Rst2, respectively, and different signals may be used as the light emission control signal EM1 and the light emission control signal EM2, respectively.

In the initialization stage 1, the first reset control signal Rst1 is input to turn on the sixth transistor T6, and the first reset voltage Vinit1 is applied to the gate electrode of the first transistor T1, thereby resetting the first node N1.

In the data writing and compensation stage 2, the scanning signal Ga1/Ga2 and the data signal Vd are input, the second transistor T2 and the third transistor T3 are turned on, the data signal Vd is written into the second node N2 by the second transistor T2, and the first node N1 is charged by the first transistor T1 and the third transistor T3 until the potential of the first node N1 changes to Vd+Vth and the first transistor T1 is cut off, in which the Vth is the threshold voltage of the first transistor T1. The voltage level of the first node N1 is stored in the storage capacitor Cst and maintained, that is, a voltage information with the data signal and the threshold voltage Vth is stored in the storage capacitor Cst, so as to be used to provide a grayscale display data and compensate for the threshold voltage of the first transistor T1 itself in the subsequent light-emitting stage.

In the data writing and compensation stage 2, the second reset control signal Rst2 is input to turn on the seventh transistor T7, and the second reset voltage Vinit2 is applied to the fourth node N4, thereby resetting the fourth node N4. For example, the reset of the fourth node N4 may also be performed in the initialization stage 1, for example, the first reset control signal Rst1 and the second reset control signal Rst2 may be the same, which are not limited in the embodiments of the present disclosure.

In the light-emitting stage 3, the light emission control signal EM1/EM2 is input to turn on the fourth transistor T4, the fifth transistor T5 and the first transistor T1, and the fifth transistor T5 applies a driving current to the OLED to make it emit light. The value of the driving current I flowing through the OLED can be obtained according to the following formula:

$$I=K(V_{GS}-Vth)^2=K[(Vdata+Vth-VDD)-Vth]^2=K(Vdata-VDD)^2,$$ in which $K$ is a conductivity of the first transistor.

In the above formula, Vth represents the threshold voltage of the first transistor T1, $V_{GS}$ represents the voltage between the gate electrode and the source electrode (herein the first electrode) of the first transistor T1, and K is a constant value related to the first transistor T1 itself. It can be seen from the above calculation formula of I that the driving current I flowing through the OLED is no longer related to the threshold voltage Vth of the first transistor T1, so that the compensation of the pixel driving circuit can be realized, and a problem of threshold voltage drift of the driving transistor (the first transistor T1 in the embodiment of the present disclosure) caused by a manufacturing process and a long-term operation can be solved, and its influence on the driving current I is eliminated, so that a display effect of the display device using the driving current I can be improved.

The structure of the display substrate provided by at least one embodiment of the present disclosure will be exemplarily described below by taking the pixel driving circuit illustrated in FIG. 4B as an example and in combination with FIG. 3 and FIG. 5A to FIG. 13.

As illustrated in FIG. 3, the first sub-pixel 1002 comprises a first pixel driving circuit 105a (the region illustrated by the large dashed box in FIG. 3) and a first light-emitting element, and the second sub-pixel 1002 comprises a second pixel driving circuit 105b and a second light-emitting element, the third sub-pixel 1003 comprises a third pixel driving circuit 105c and a third light-emitting element.

The first pixel driving circuit 105a of the first sub-pixel 1002, the second pixel driving circuit 105b of the second sub-pixel 1002, and the third pixel driving circuit 105c of the third sub-pixel 1003 are arranged side by side and adjacent to each other along the first direction Y. The first pixel driving circuit 105a is located on a right side of the figure, the second pixel driving circuit 105b is located on a left side in the figure, and the third pixel driving circuit 105c is located in the middle of the figure (between the first pixel driving circuit 105a and the second pixel driving circuit 105b), the embodiments of the present disclosure is not limited to the arrangement order of the driving circuits of the first sub-pixel 1002, the second sub-pixel 1002, and the third sub-pixel 1003. The first electrode (for example, anode) 1202*a* of the first light-emitting element of the first sub-pixel 1002 and the first electrode 1202*b* of the second light-emitting element of the second sub-pixel 1002 are arranged along the second direction X (for example, as illustrated in the figure, the first electrode 1202*a* is located above the first electrode 1202*b*), the first electrode 1202*c* of the third light-emitting element of the third sub-pixel 1003 is located at a side of both the first electrode 1202*a* of the first light-emitting element and the first electrode 1202*b* of the second light-emitting element along the first direction Y (left side).

In some embodiments, the pixel driving circuit of each sub-pixel may have the same structure except for a connection structure with the light-emitting element, that is, the pixel driving circuit is repeatedly arranged in the row direction and the column direction, and the connection structures of different sub pixels with the light-emitting elements may be different according to the arrangement shape and position of the electrodes of the light-emitting structures of each of the sub-pixels. In some embodiments, general frames of the pixel driving circuits of different color sub-pixels, such as shapes and positions of each signal lines, are basically the same, and the relative position relationship of each transistors is also basically the same, but the width and the shape of some signal lines or connection lines, or for example, the channel size and the shape of some transistors, or the connection lines used to connect with the light-emitting elements of different sub-pixels, or positions of the via holes can be different, which can be adjusted according to each layout structures and the sub-pixel arrangement.

For example, as illustrated in FIG. 3, an orthographic projection of the first electrode 1202*a* of the first light-emitting element of the first sub-pixel 1001 on the board surface S of the base substrate 10, partially overlaps with an orthographic projection of the first pixel driving circuit 105*a* and an orthographic projection of the third pixel driving circuit 105*c* on the board surface S of the base substrate 10. For example, the first electrode 1202*a* is provided on the first pixel driving circuit 105*a* and the third pixel driving circuit 105*c*. The orthographic projection of the first electrode 1202*b* of the second light-emitting element of the second sub-pixel 1002 on the board surface S of the base substrate 10 partially overlaps with the orthographic projection of the first pixel driving circuit 105*a* and the orthographic projection of the third pixel driving circuit 105*c* on the board surface S of the base substrate 10. For example, the first electrode 1202*b* is provided on the first pixel driving circuit 105*a* and the third pixel driving circuit 105*c*. The orthographic projection of the first electrode 1202*c* of the third light-emitting element of the third sub-pixel 1003 on the board surface S of the base substrate 10, partially overlaps with the orthographic projection of the second pixel driving circuit 105*b* and the orthographic projection of the third pixel driving circuit 105*c* on the board S of the base substrate 10. For example, the first electrode 1202*c* is provided on the second pixel driving circuit 105*b* and the third pixel driving circuit 105*c*. In this way, it can improve the utilization of the layout space of the pixel unit.

For example, as illustrated in FIG. 3, the first sub-pixel 1001, the second sub-pixel 1002, and the third sub-pixel 1003 are respectively a red sub-pixel, a green sub-pixel, and a blue sub-pixel, for example, configured to emit the red light, the green light and the blue light. The pixel unit 104 constitutes a repeating unit of the display substrate 1.

Figure 5A:
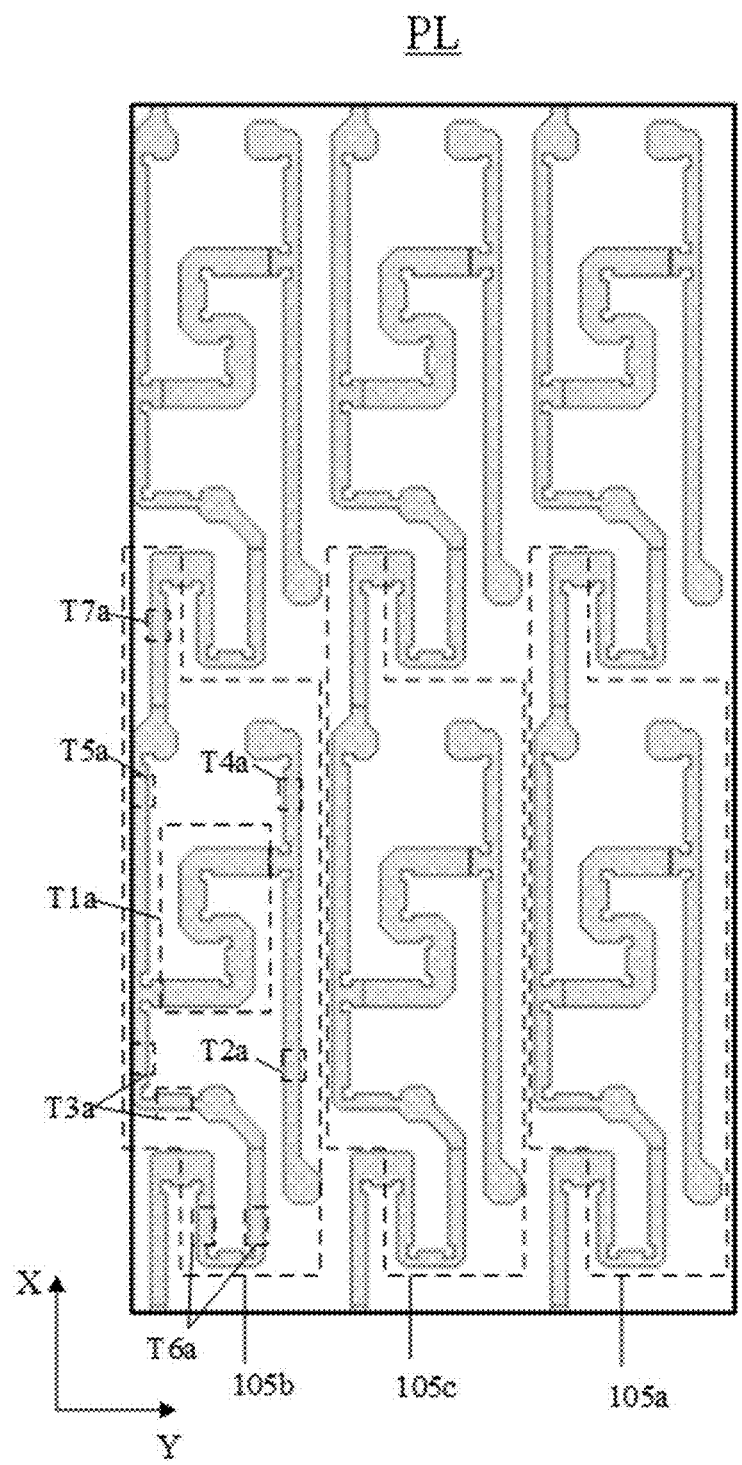
FIG. 5A is a layout diagram of a semiconductor layer of the pixel unit illustrated in FIG. 3.
Figure 5B:
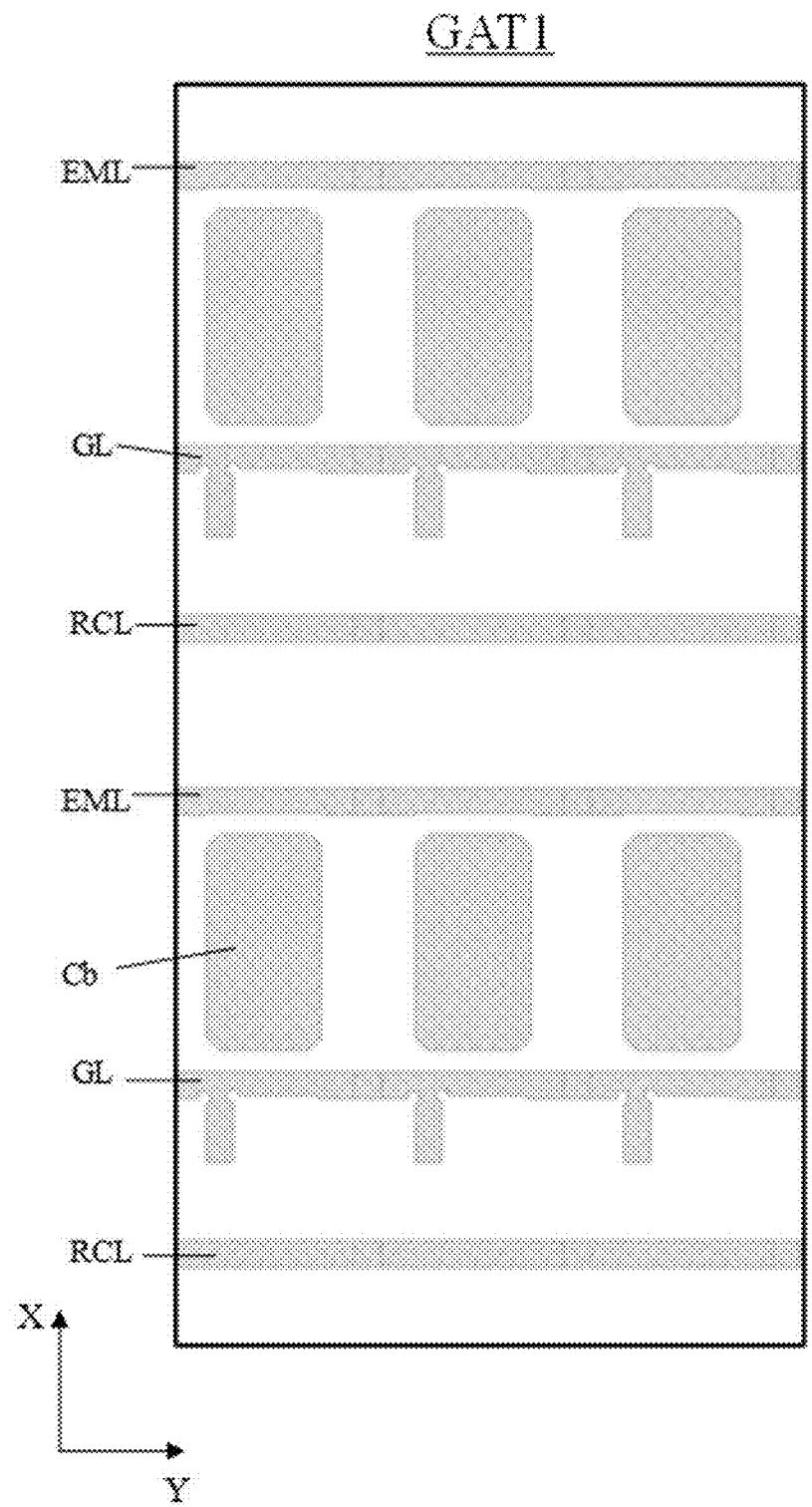
FIG. 5B is a layout diagram of a first conductive layer of the pixel unit illustrated in FIG. 3.
Figure 6A:
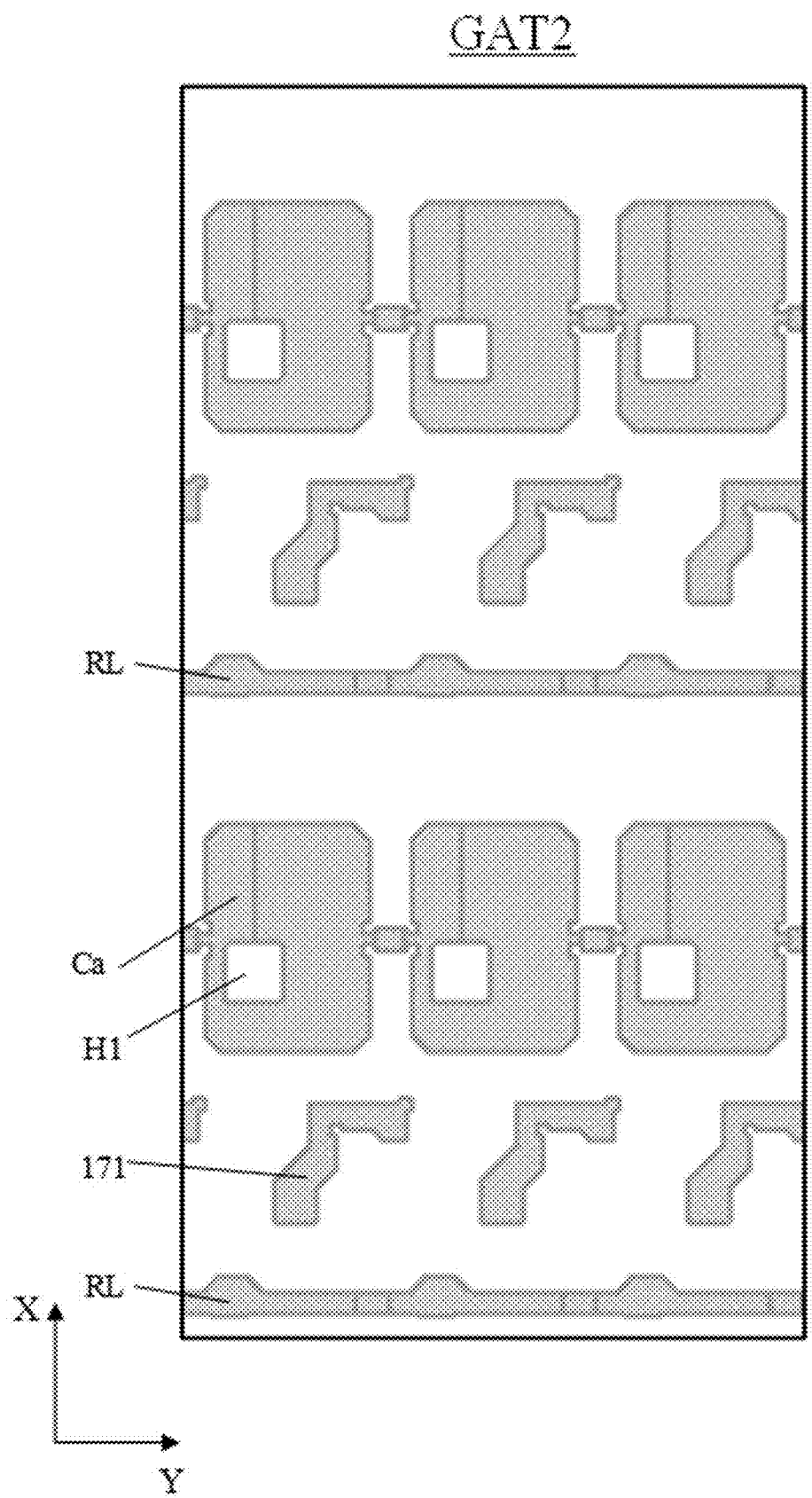
FIG. 6A is a layout diagram of a second conductive layer of the pixel unit illustrated in FIG. 3.
Figure 7A:
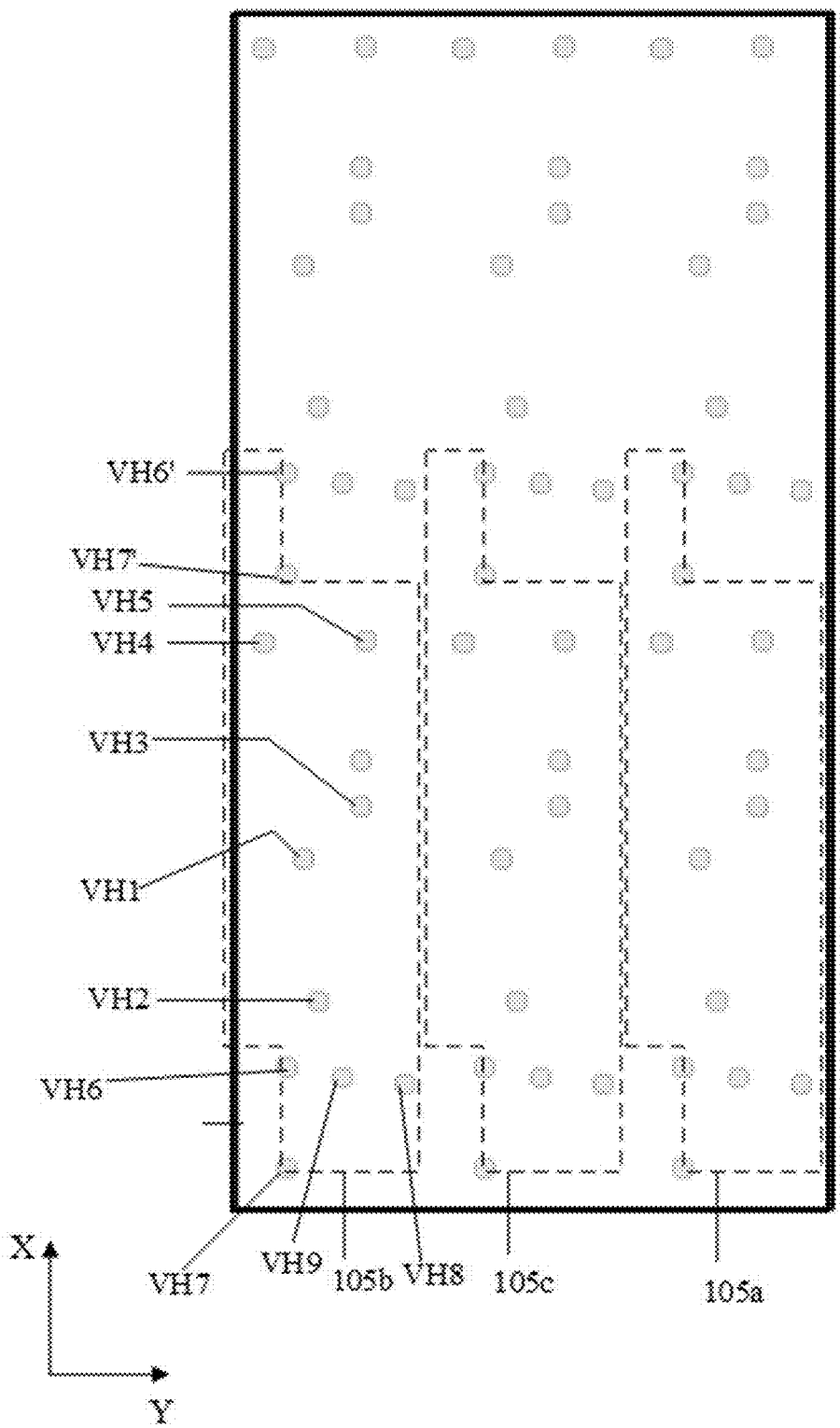
FIG. 7A is a layout diagram of via holes in an insulating layer of the pixel unit illustrated in FIG. 3.
Figure 8A:
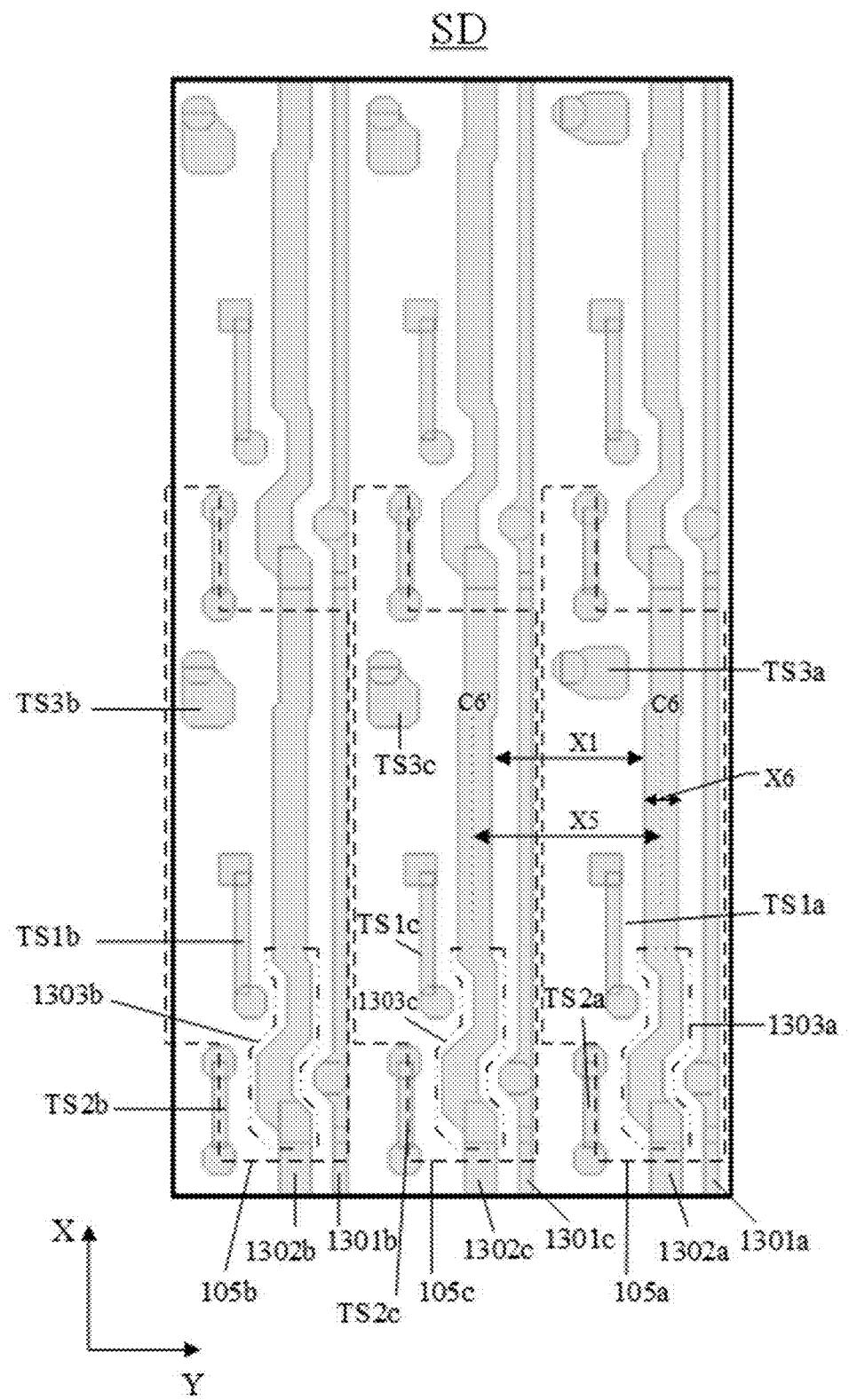
FIG. 8A is a layout diagram of a first electrode layer of the pixel unit illustrated in FIG. 3.
Figure 9A:
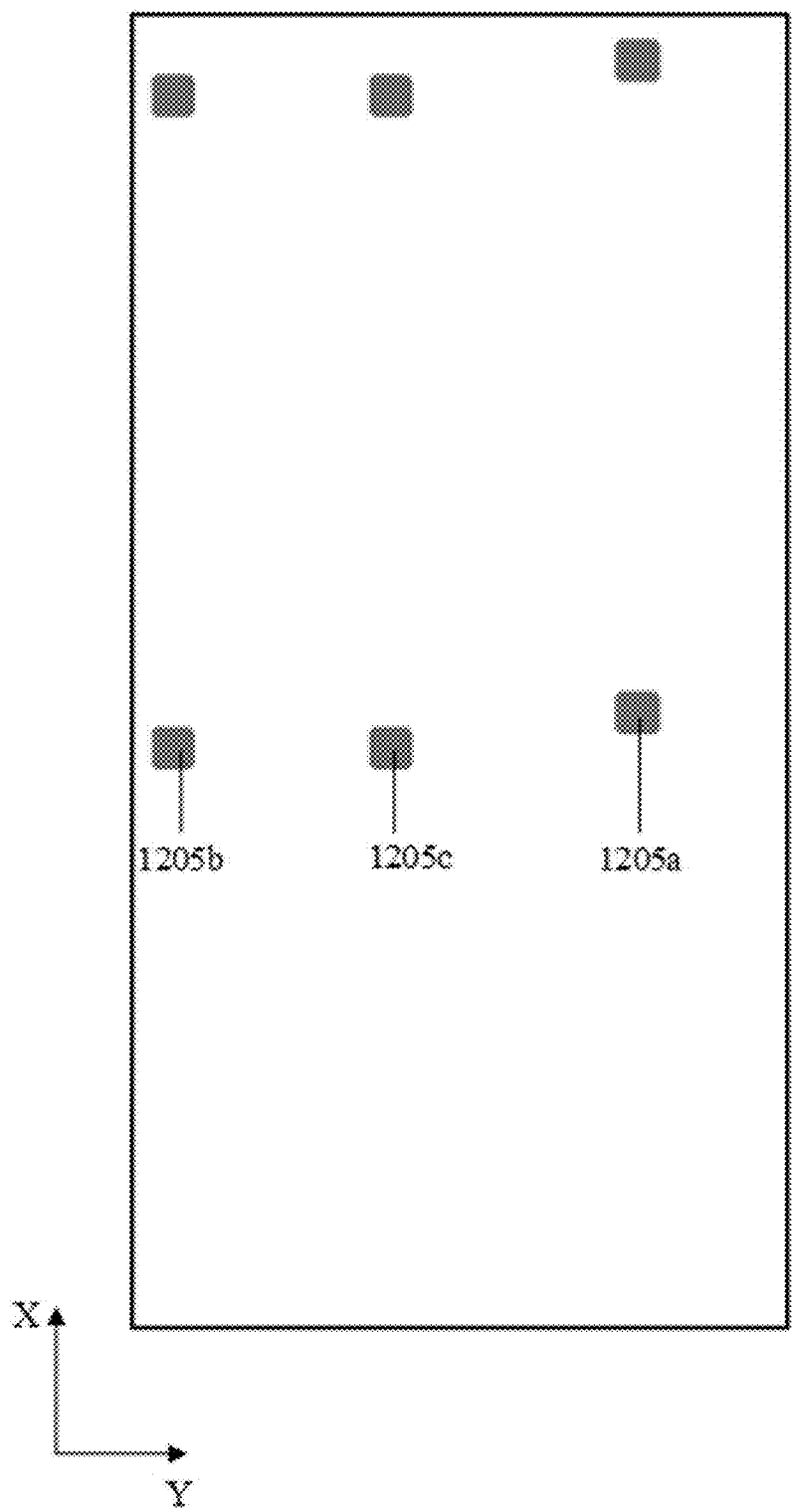
FIG. 9A is a layout diagram of first via hole structures of the pixel unit illustrated in FIG. 3.
Figure 10A:
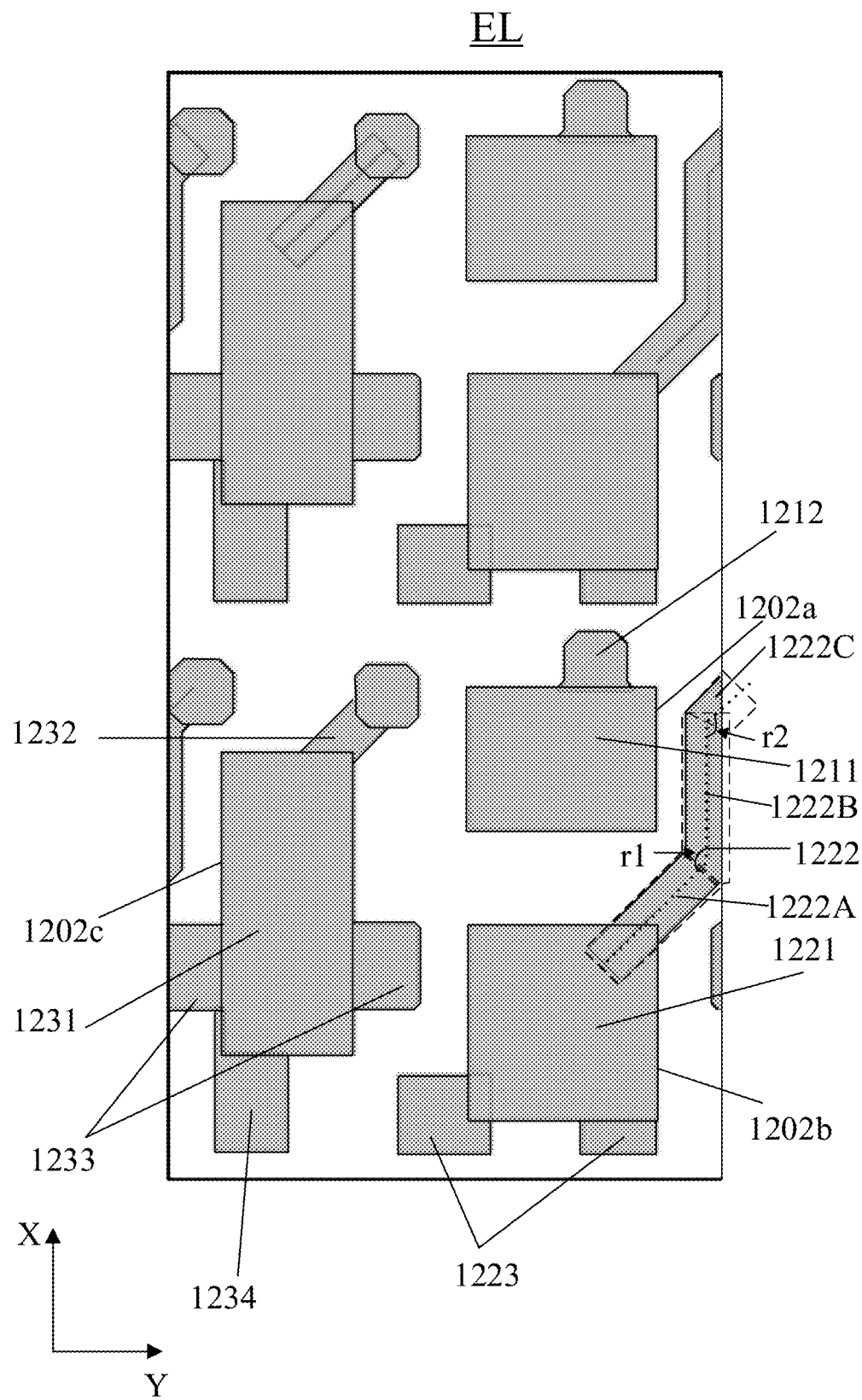
FIG. 10A is a layout diagram of a second electrode layer of the pixel unit illustrated in FIG. 3.
Figure 11:
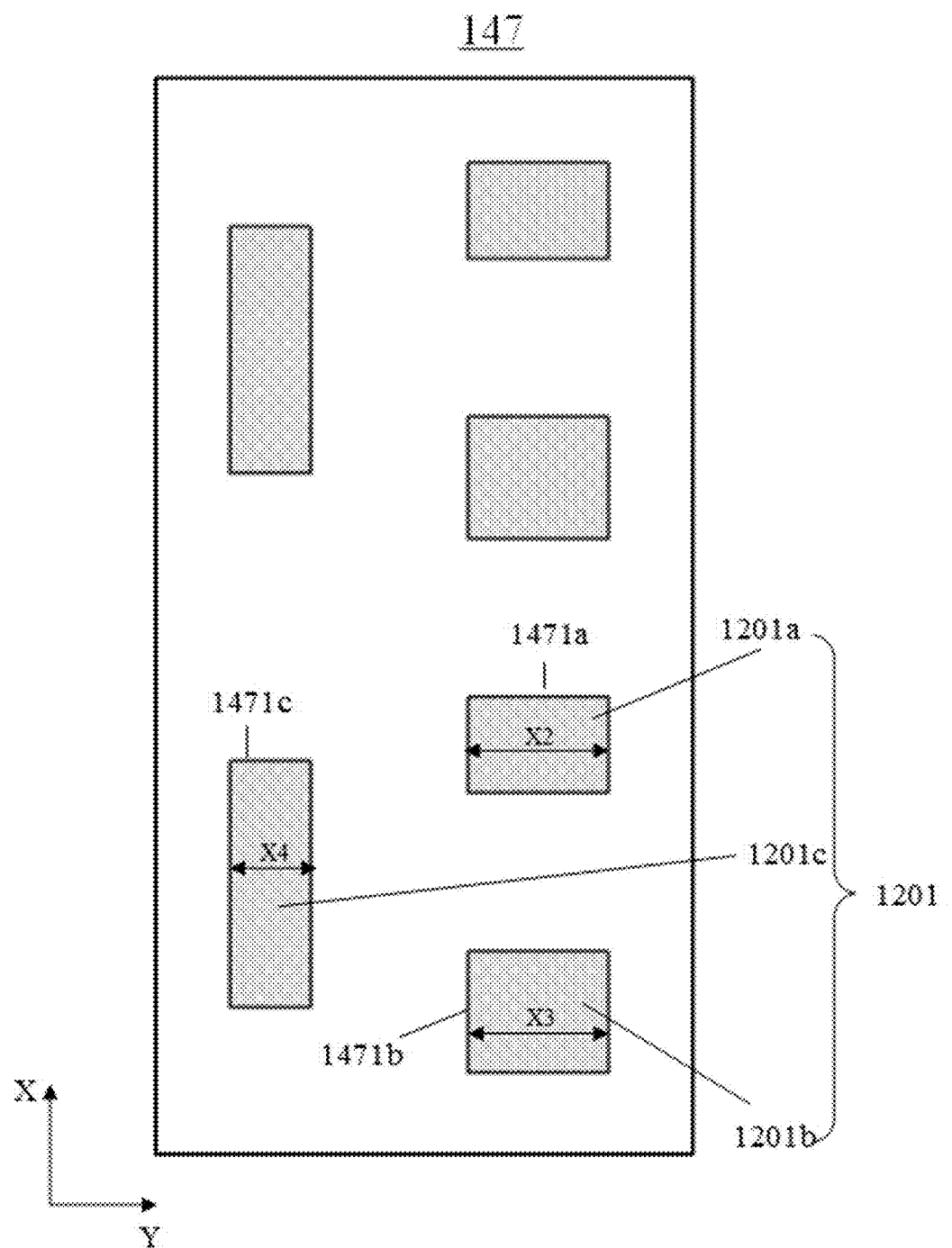
FIG. 11 is a layout diagram of a pixel definition layer of a display substrate provided by an embodiment of the present disclosure.

FIG. 5A is a layout diagram of a semiconductor layer of the pixel unit illustrated in FIG. 3; FIG. 5B is a layout diagram of a first conductive layer of the pixel unit illustrated in FIG. 3; FIG. 6A is a layout diagram of a second conductive layer of the pixel unit illustrated in FIG. 3; FIG. 7A is a layout diagram of a via hole in an insulating layer of the pixel unit illustrated in FIG. 3; FIG. 8A is a layout diagram of a first electrode layer of the pixel unit illustrated in FIG. 3; FIG. 9A is a layout diagram of first via hole structures of the pixel unit illustrated in FIG. 3; FIG. 10A is a layout diagram of a second electrode layer of the pixel unit illustrated in FIG. 3; FIG. 11 is a layout diagram of a pixel definition layer in the display substrate provided by an embodiment of the present disclosure; and FIG. 12 is a cross-sectional diagram of the display substrate illustrated in FIG. 3 taken along a line A-B.

With reference to FIG. 5A, FIG. 5B, FIG. 6A, FIG. 7A, FIG. 8A, FIG. 9A, FIG. 10A, FIG. 11 and FIG. 12, it can be seen that a semiconductor layer PL, a first gate insulating layer 143, a first conductive layer GAT1, a second gate insulating layer 144, a second conductive layer GAT2, an interlayer insulating layer 145, a first electrode layer SD, a second electrode layer EL, and a pixel definition layer 147 are sequentially disposed on the base substrate 10 to form the display substrate 1 as illustrated in FIG. 3.

It should be noted that, the film layers listed above are not all film layers of the display substrate 1, and a film layer structure of the display substrate 1 will be described in detail later.

Figure 5C:
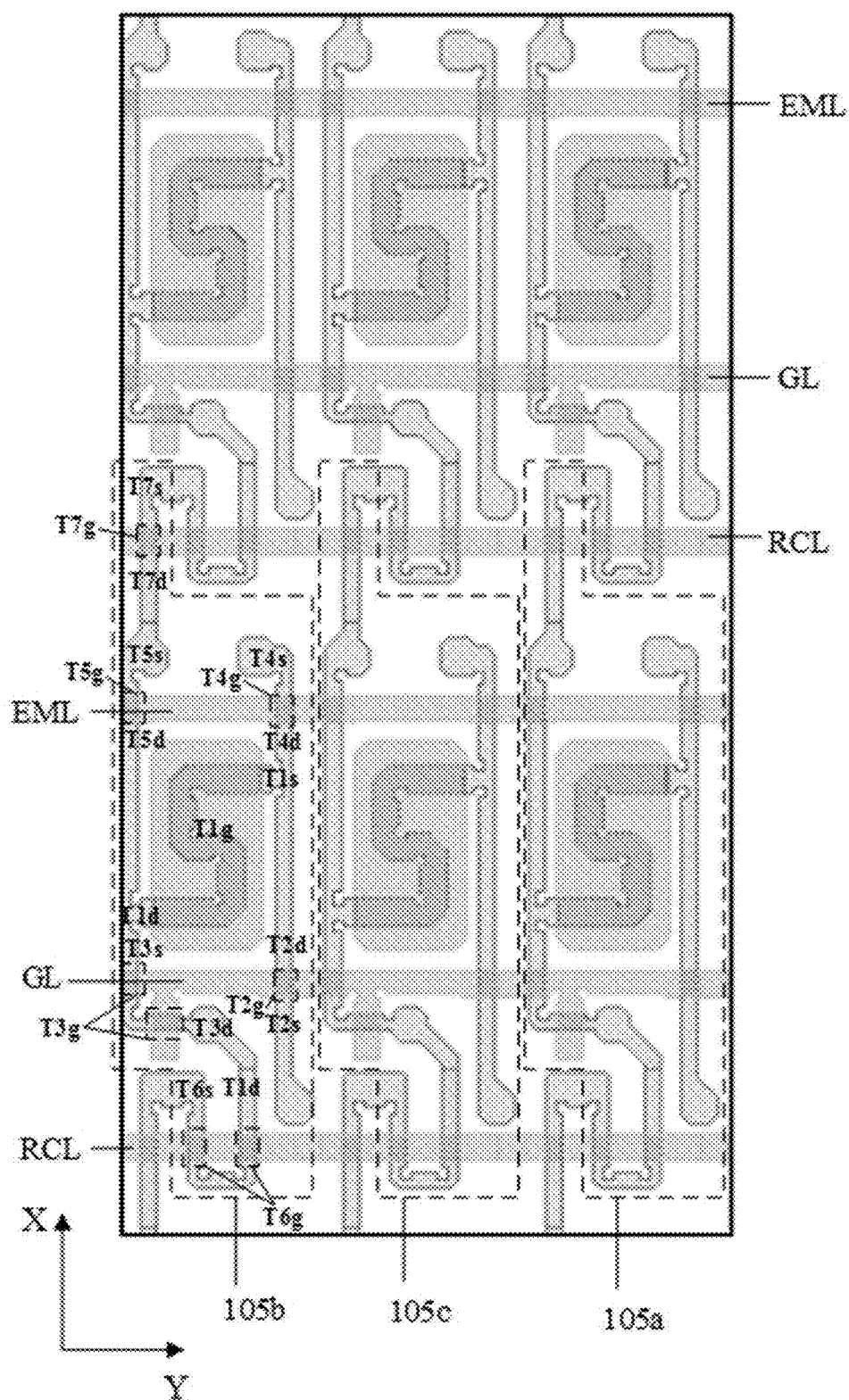
FIG. 5C is a layout diagram of FIG. 5A and FIG. 5B after stacking.

FIG. 5A corresponds to FIG. 3 and illustrates the semiconductor layers PL of the transistor T1 to the transistor T7 in the pixel unit 104, and FIG. 5B corresponds to FIG. 3 and illustrates the first conductive layer (a gate electrode layer) GAT1 of the transistor T1 to the transistor T7 in the pixel unit 104, FIG. 5C is a layout diagram of FIG. 5A and FIG. 5B after stacking, and FIG. 5C illustrates the semiconductor layer PL and the first conductive layer GAT1.

For convenience of description, in the following descriptions, Tng, Tns, Tnd, and Tna are used to represent the gate electrode, the first electrode, the second electrode and a channel region of the n-th transistor Tn, respectively, in which n is 1 to 7.

It should be noted that, the "same layer arrangement" in the embodiments of the present disclosure means structures formed by two (or more than two) structures formed by a same deposition process and patterned by a same patterning process, materials of the two structures can be the same or different. The "integrated structure" in the present disclosure refers to two (or more than two) structures formed by the same deposition process and patterned by the same patterning process to form the structures connected to each other, and the materials of the two structures may be the same or different.

For example, as illustrated in FIG. 5A, the semiconductor layer PL comprises active layers T1*a* to T7*a* of the first transistor T1 to the seventh transistor T7. A structure in which the active layers T1*a* to T7*a* of the first transistor T1 to the seventh transistor T7 are connected to each other as a whole. For example, the semiconductor layers PL in each column of sub-pixels are an integral structure connected to each other, and the semiconductor layers in two adjacent columns of sub-pixels are spaced apart from each other.

For example, the material of the semiconductor layer PL comprises polysilicon or an oxide semiconductor (for example, indium gallium zinc oxide).

As illustrated in FIG. 5A, in one sub-pixel, for example, the second sub-pixel 1002 is taken as an example. The figure illustrates the position of the active layer T7*a* of the transistors T1 to T7, and the small dotted frames in the figure are the channel regions of the active layer T7a of the transistors T1 to T7, such as the positions of the region overlapping with the gate electrode layer. The active layer of the third transistor T3 comprises two channel regions T3a, for example, the third transistor T3 is implemented as a double-gate electrode structure, so as to improve the switching capability of the third transistor T3 and prevent leakage current from occurring in an off state of the third transistor T3. The active layer of the sixth transistor T6 also comprises two channel regions T6a. For example, the sixth transistor T6 is implemented as a double-gate electrode structure, so as to improve the switching capability of the sixth transistor T6 and prevent leakage current from occurring in the off state of the sixth transistor T6. The double-gate electrode structure is used to improve the gate electrode control capability of the third transistor T3 and the sixth transistor T6, which helps to reduce the leakage current of the transistors and thus helps to maintain the voltage of the N1 node. Therefore, in the compensation stage, the threshold voltage of the first transistor T1 is helpful to obtain sufficient compensation, thereby improving a display uniformity of the display substrate in the light-emitting stage.

For example, as illustrated in FIG. 5B and FIG. 5C, the first conductive layer GAT1 comprises a plurality of first routing lines GL (for example, scanning signal lines), a plurality of second routing lines EML (for example, light emission control signal lines), and a plurality of third routing lines RCL (for example, reset control signal lines). The plurality of first routing lines GL, the plurality of second routing lines EML, and the plurality of third routing lines RCL extend along the first direction Y, and are respectively configured to provide the scanning signals Ga1/Ga2, the light emission control signals EM1/EM2, and the reset control signals to the pixel driving circuit 105 of each of the plurality of pixel units 104. For example, the sixth transistor T6 of the pixel driving circuit 105 located in the large dashed box in the figure is electrically connected to the third routing line RCL electrically connected to the pixel driving circuit 105 of the row (for example, the pixel driving circuit 105b), and the sixth transistor T6 receives the first reset control signal Rst1. For example, the seventh transistor T7 of the pixel driving circuit 105 in the large dotted line box in the figure receives the second reset control signal Rst2. For example, the seventh transistor T7 receives the reset control signal provided by the third routing line RCL (the middle in the figure) electrically connected to the pixel driving circuit of the next row.

It should be noted that, in the embodiments of the present disclosure, the arrangement direction of rows is from bottom to top in the figure, that is, they are arranged row by row from the side close to the bonding region 103.

For example, the material of the first conductive layer GAT1 comprises a metal material or an alloy material, such as a metal single-layer structure or a multi-layer structure formed by molybdenum, aluminum and titanium, for example, the multi-layer structure is a stack of multiple metal layers (such as a three metal lamination layers of titanium, aluminum and titanium (Ti/Al/Ti)).

For example, as illustrated in FIG. 3 and FIG. 5C, a first routing line GL, a second routing line EML and a third routing line RCL are arranged between two adjacent reset signal lines RCL. For example, the pixel driving circuits 105 arranged in a row are electrically connected to a first routing line GL, a second routing line EML and a third routing line RCL. As illustrated in the figure, the second routing line EML is located on the side of the third routing line RCL away from the bonding region 103, and the first routing line GL is located between the second routing line EML and the third routing line RCL. For example, in the pixel driving circuits 105 located in a row, along the second direction X, the first routing line GL is located in the middle, the second routing line EML is located above the first routing line GL, and the third routing line RCL is located below the second routing line EML.

For example, according to a positional relationship of the first routing line GL, the second routing line EML, and the third routing line RCL, the gate electrode driving circuit 13 adopts a bottom-up driving manner. The plurality of first routing lines GL, the plurality of second routing lines EML and the plurality of third routing lines RCL are electrically connected to the gate electrode driving circuit 13. The gate electrode driving circuit 13 provides the scanning signals, the lighting control signals and the reset control signals to the plurality of sub-pixel driving circuits 105 row by row from the side close to the bonding region 103 to the side away from the bonding region 103 (for example, from bottom to top).

For example, as illustrated in FIG. 5C, the gate electrodes T1g to T7g of the first transistor T1 to the seventh transistor T7 in one sub-pixel 100 are illustrated with small dotted boxes.

For example, as illustrated in FIG. 5C, the first conductive layer GAT1 further comprises the gate electrodes T1g to T7g of the first transistor T1 to the seventh transistor T7 and a second capacitor electrode Cb of the storage capacitor Cst. For example, the display substrate 1 adopts a self-aligned process, and the semiconductor layer PL is subject to a conductor process (for example, doping treatment) by using the first conductive layer GAT1 as a mask, so that a portion of the semiconductor layer PL that is not covered by the first conductive layer GAT1 is conducted, so that portions of the active layers of each of the transistors on two sides of the channel region are conductorized to form the first electrode and second electrode of the transistor, respectively.

For example, as illustrated in FIG. 3, FIG. 5A and FIG. 5C, the gate electrode of the third transistor T3 comprises two gate electrodes T3g. The two channel regions T3a, the first electrode T3s and the second electrode T3d are located in the same semiconductor layer PL and are integrally formed, and have different conductivity by selective conductor process (for example, ion implantation). For example, the two channel regions T3a are shielded by the two gate electrodes T3g, respectively. That is, the orthographic projections of the two channel regions T3a on the base substrate 10 are located within the orthographic projections of the two gate electrodes T3g on the base substrate 10.

For example, as illustrated in FIG. 5B and FIG. 5C, the gate electrode T1g of the first transistor T1 serves as the second capacitor electrode Cb of the storage capacitor Cst, so as to save the arrangement space.

For example, as illustrated in FIG. 3 and FIG. 5C, the second transistor T2 and the third transistor T3 are located on the side of the first transistor T1 close to the bonding region 103, that is, located below the first transistor T1. For example, the second transistor T2 and the third transistor T3 are arranged side by side along the first direction Y to be electrically connected to the first routing line GL. The portions of the first routing line GL overlapping with the semiconductor layer PL are implemented as the gate electrode T2g of the second transistor T2 and the gate electrode T3g of the third transistor T3. The fourth transistor T4 and the fifth transistor T5 are located on the side of the first transistor T1 away from the bonding region 103, that is, located above the first transistor T1. For example, the fourth transistor T4 and the fifth transistor T5 are arranged side by side along the first direction Y to be electrically connected to the second routing line EML. The portions of the second routing line EML overlapping with the semiconductor layer PL are implemented as the gate electrode T4g of the fourth transistor T4 and the gate electrode T5g of the fifth transistor T5. The sixth transistor T6 is located on the side of the second transistor T2 and the third transistor T3 close to the bonding region 103, that is, located below the second transistor T2 and the third transistor T3. The seventh transistor T7 is located on the side of the fourth transistor T4 and the fifth transistor T5 away from the bonding region 103. The portion of the lower third routing line RCL overlapping with the semiconductor layer PL in the figure is implemented as the gate electrode T6g of the sixth transistor T6. The portion of the third routing line RCL located in a middle position in the figure (for example, located in the next row) overlapping with the semiconductor layer PL is implemented as the gate electrode T7g of the seventh transistor T7.

Figure 6B:
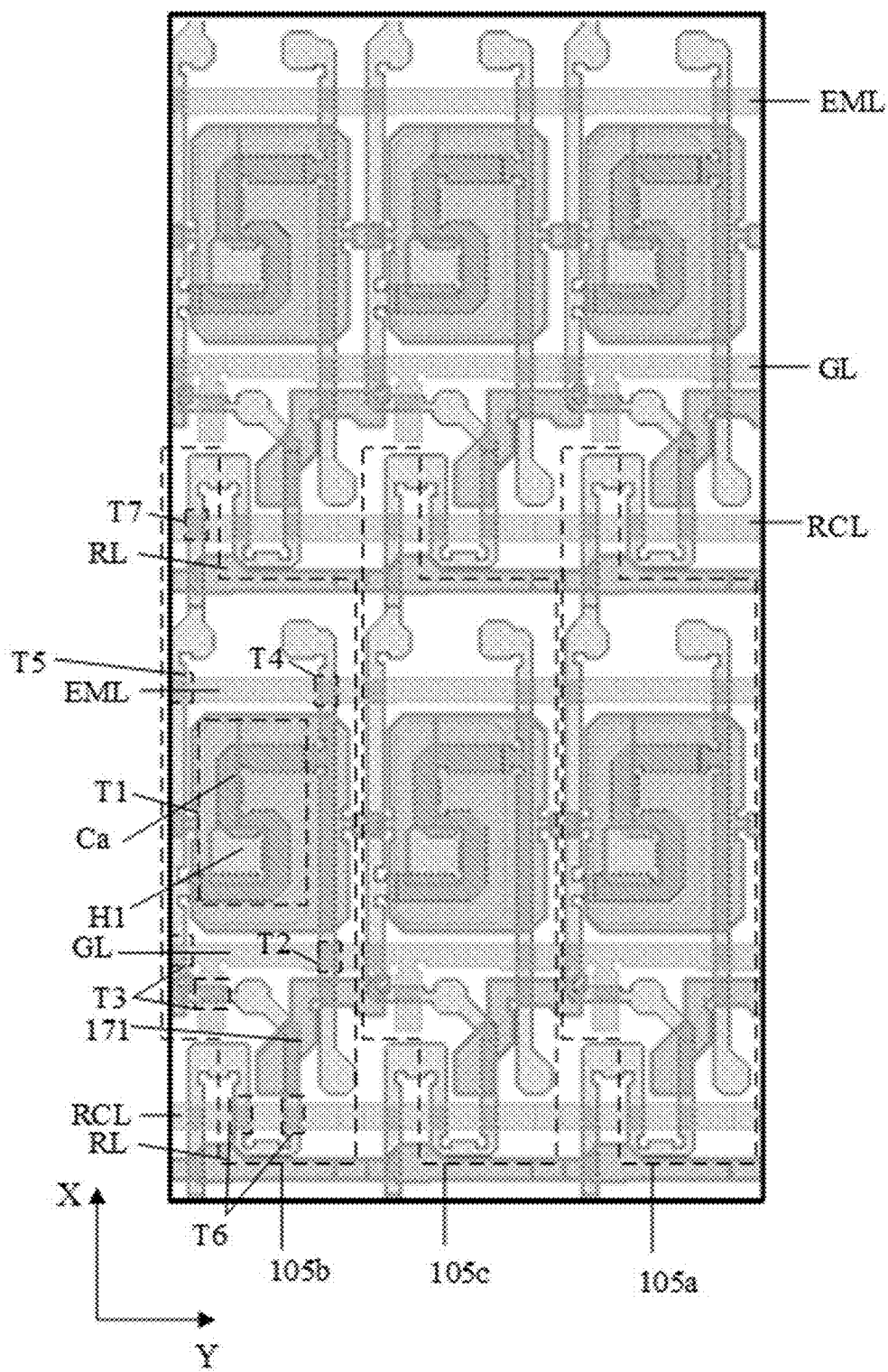
FIG. 6B is a layout diagram of FIG. 5A, FIG. 5B and FIG. 6A after stacking.

For example, as illustrated in FIG. 6A, the second conductive layer GAT2 comprises a shield electrode 171, a first capacitor plate Ca, and a plurality of reset signal lines RL. FIG. 6B is a layout diagram of FIG. 5A, FIG. 5B and FIG. 6A after stacking.

For example, the material of the second conductive layer GAT2 comprises the metal material or the alloy material, such as a metal single-layer or a multi-layer structure formed by molybdenum, aluminum and titanium, for example, the multi-layer structure is a stack of multiple metal layers (such as a three metal lamination layers of titanium, aluminum and titanium (Ti/Al/Ti)).

For example, as illustrated in FIG. 6A and FIG. 6B, the first capacitor electrode Ca overlaps with the second capacitor electrode Cb (for example, the gate electrode T1g of the first transistor T1) in a direction perpendicular to the base substrate 101 to form the storage capacitor Cst. For example, the first capacitor electrode Ca comprises an opening H1, and the opening H1 exposes at least a part of the gate electrode T1g of the first transistor T1, so that the gate electrode T1g is electrically connected to other structures. For example, the first capacitor electrodes Ca of the sub-pixels located in the same pixel row are connected to each other as a whole structure.

For example, as illustrated in FIG. 5C, FIG. 6A, and FIG. 6B, the shielding electrode 171 has a substantially "pistol" shape. The shielding electrode 171 comprises a portion extending along the first direction Y and a portion bending and extending along the second direction X. The portion of the shielding electrode 171 bending and extending along the second direction X overlaps with the first electrode T2s of the second transistor T2 in the direction perpendicular to the base substrate 10 so as to prevent the signal of the first electrode T2s of the second transistor T2 being disturbed by other signals. Because the first electrode T2s of the second transistor T2 is configured to receive the data signal Vd, and the data signal Vd determines the display gray scale of the sub-pixel, the shielding electrode 221 improves the stability of the data signal, thereby improving the display performance.

For example, referring to FIG. 5C and FIG. 6B in combination, the portion of the shielding electrode 171 bending and extending along the second direction X at least partially overlaps with the second electrode T6d of the sixth transistor T6 in the direction perpendicular to the base substrate 10 to improve the stability of the signal in the second electrode T6d, which improves the stability of the sixth transistor T6, and further the gate electrode voltage of the first transistor T1 is stabilized.

For example, referring to FIG. 5C and FIG. 6B in combination, the portion of the shielding electrode 171 extending along the first direction Y further extends to adjacent sub-pixels (for example, the shielding electrode 171 in the second pixel driving circuit 105b extends to the third pixel driving circuit 105c) and at least partially overlap with the conductive region of the conductive layer PL between the two channel regions T3a of the third transistor T3 in the adjacent sub-pixels in the direction perpendicular to the base substrate 10, so as to improve the stability of the signal in the conductive region and the stability of the third transistor T3, and further the gate electrode voltage of the first transistor T1 is stabilized.

For example, a stable capacitance is formed between the shielding electrode 171 and the first electrode T2s of the second transistor T2 or the conductive region between the two channel regions T3a of the third transistor T3 or the second electrode T6d of the sixth transistor T6 directly opposite (overlapping) the shielding electrode 171. The shielding electrode 171 is configured to load a fixed voltage. Since the voltage difference between two ends of the capacitor cannot change abruptly, the voltage stability of the first electrode T2s of the second transistor T2, the conductive region T3c of the third transistor T3 and the second electrode T6d of the sixth transistor T6 is improved. For example, the shielding electrode 171 is electrically connected to a first power supply voltage line 1302 (for example, a first power supply voltage line 1302a) in a third conductive layer SD (as illustrated in FIG. 8A) to load the first power supply voltage VDD.

For example, as illustrated in FIG. 6A and FIG. 6B, the reset signal line RL at the bottom of the figure is connected to the pixel driving circuit 105a of the first sub-pixel 1001, the pixel driving circuit 105b of the second sub-pixel 1002, and the pixel driving circuit 105c of the third sub-pixel 1003. The reset signal line RL transmits the first reset voltage Vinit1, and the reset signal line RL located in the middle (for example, the next row of the reset signal line at the bottom) in the figure transmits the second reset voltage Vinit2. For example, the reset signal line RL is located on the side of the row sub-pixel unit 104 in which it is located close to the first bonding region 103 (for example, below). Combined with FIG. 3, the first electrode 1202 of the light-emitting element 120 of the sub-pixel 100 does not protrude outside the reset signal line RL (for example, below the reset signal line RL), thereby the light-emitting element 120 of the sub-pixel 100 does not occupy the space of the lower frame, which can reduce the size of the lower frame, which is beneficial to realize the narrow frame.

FIG. 7A is a layout diagram of via holes in an insulating layer of the pixel unit illustrated in FIG. 3. The first electrode layer SD is illustrated in FIG. 8A. As illustrated in FIG. 7A and FIG. 12, a first via hole VH1, a second via hole VH2, a third via hole VH3, a fourth via hole VH4, a fifth via hole VH5, a sixth via hole VH6, a seventh via hole VH7, an eighth via hole VH8, a ninth via hole VH9, a sixth via hole VH6', and a seventh via hole VH7' are illustrated in FIG. 7A. The second via hole VH2, the fourth via hole VH4 to the eighth via hole VH8, the sixth via hole VH6' and the seventh via hole VH7' are via holes penetrating through a first gate insulating layer 142, the second gate insulating layer 143 and the interlayer insulating layer 144, the first via hole VH1 is a via hole penetrating through the interlayer insulating layer 145 and the second gate insulating layer 143. The third via hole VH3 and the ninth via hole VH9 are via holes penetrating through the interlayer insulating layer 145.

Figure 7B:
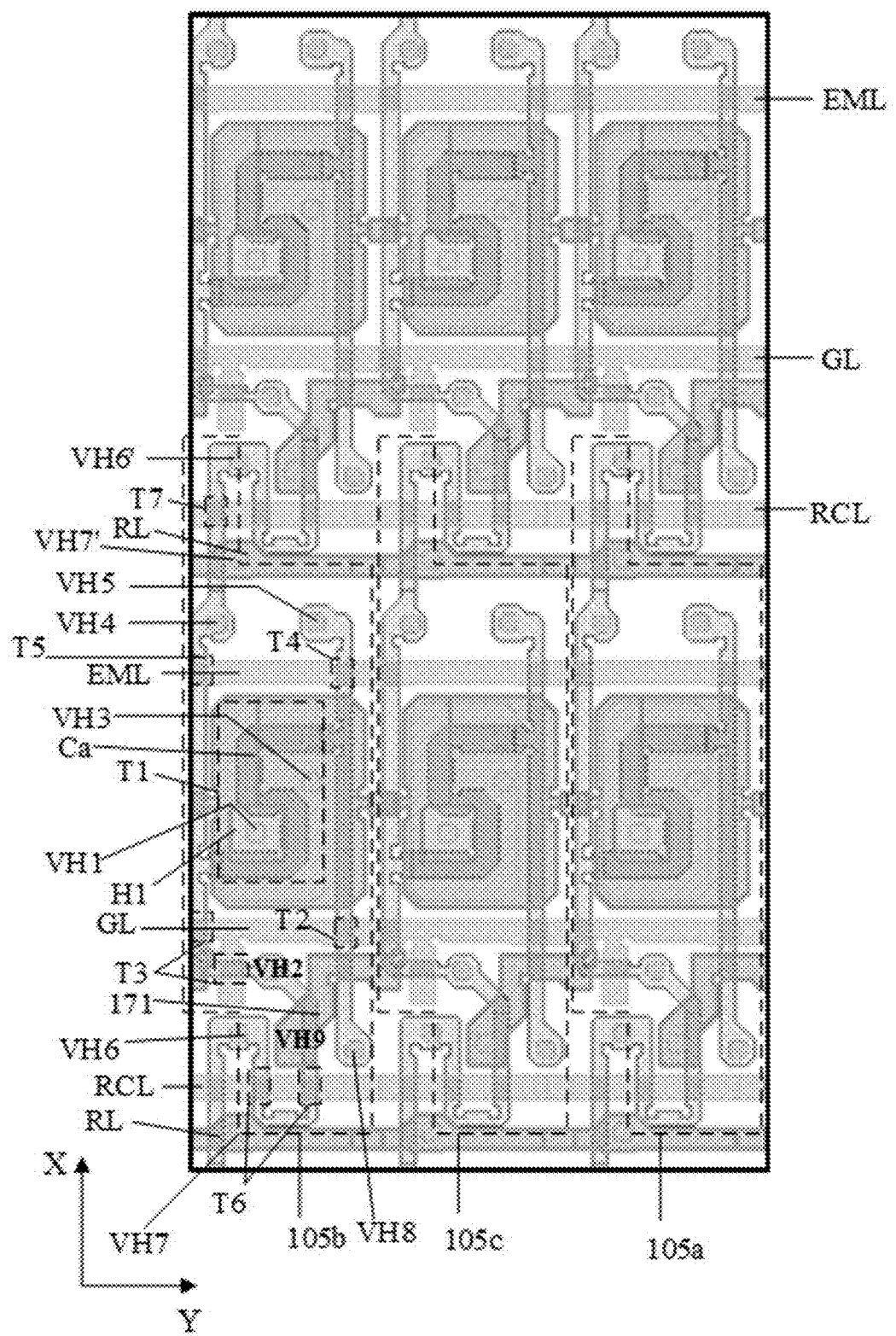
FIG. 7B is a layout diagram of FIG. 5A, FIG. 5B, FIG. 6A and FIG. 7A after stacking.

FIG. 7B is a layout diagram of FIG. 5A, FIG. 5B, FIG. 6A and FIG. 7A after stacking. Combining FIG. 5C and FIG. 7B, the first via hole VH1 passes through a first opening H1 of the first capacitor electrode Ca, and the first via hole VH1 is connected to the gate electrode T1g (that is, the second capacitor electrode Cb) of the first transistor T1. The second via hole VH2 corresponds to a position of the second electrode T3d of the third transistor T3, so as to connect to the second electrode T3d of the third transistor T3. The third via hole VH3 is located on the first capacitor electrode Ca to connect to the first capacitor electrode Ca. The fourth via hole VH4 corresponds to the position of the first electrode T5s of the fifth transistor T5 so as to connect to the first electrode T5s of the fifth transistor T5. The fifth via hole VH5 corresponds to the position of the first electrode T4s of the fourth transistor T4 so as to connect to the first electrode T4s of the fourth transistor T4. The sixth via hole VH6 corresponds to the position of the second electrode T6d of the sixth transistor T6 to connect to the second electrode T6d of the sixth transistor T6. The seventh via hole VH7 is located on the reset signal line RL (at the bottom of FIG. 3) electrically connected with the sixth transistor T6, to connect to the reset signal line RL electrically connected with the sixth transistor T6. The eighth via hole VH8 corresponds to the position of the first electrode T2s of the second transistor T2 and is connected to the first electrode T2s of the second transistor T2. The ninth via hole VH9 is located on the shielding electrode 171 to connect to the shielding electrode 171. The sixth via hole VH6' corresponds to the position of the first electrode T6s of the seventh transistor T7, so as to connect the first electrode T6s of the seventh transistor T7. The seventh via hole VH7' is located on the reset signal line RL electrically connected to the seventh transistor T7 (located in the middle position of FIG. 3, that is, the next row of the pixel unit where the sixth transistor T6 is located), so as to electrically connect to the reset signal line RL connected with the seventh transistor T7.

Figure 8B:
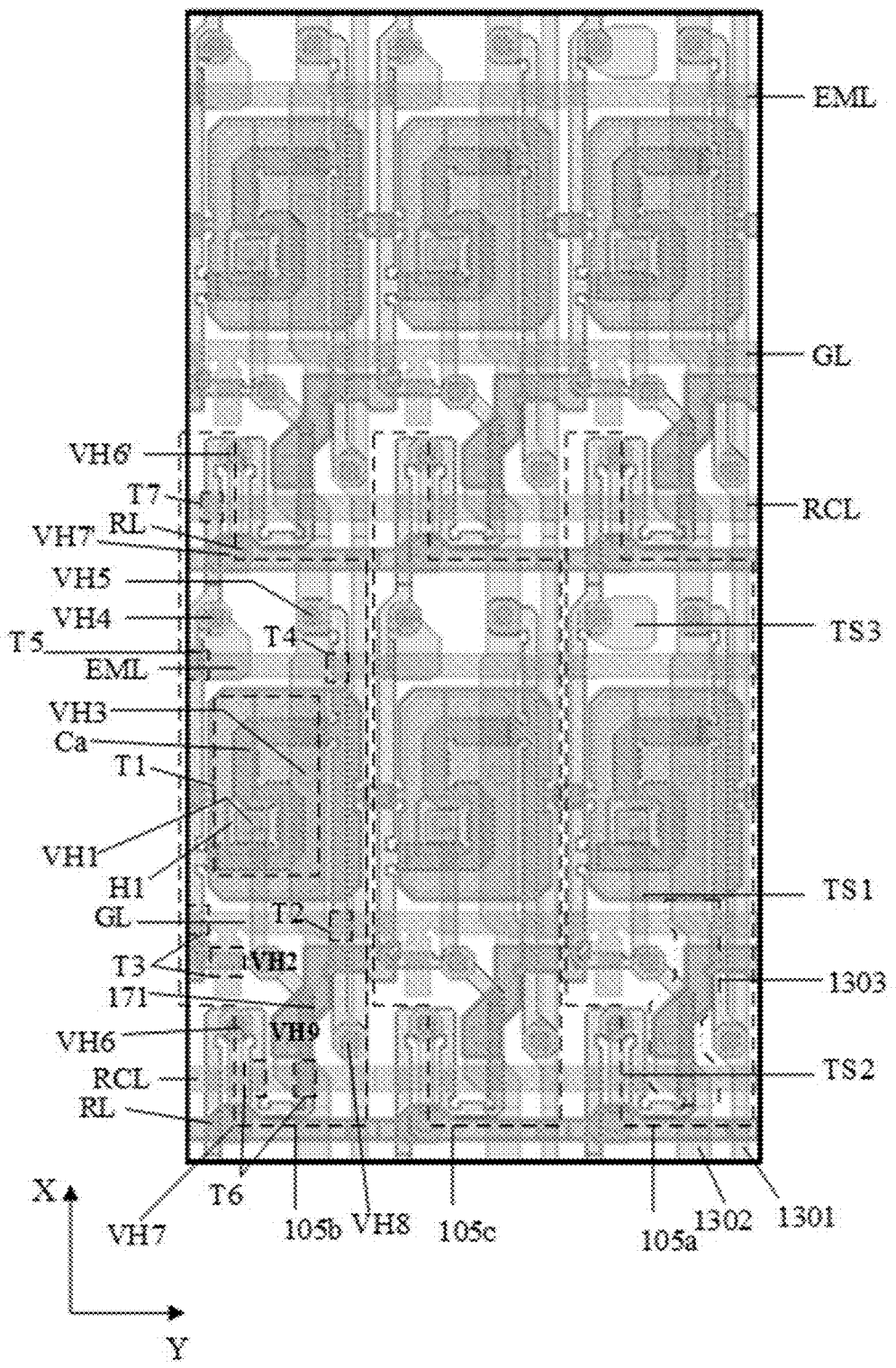
FIG. 8B is a layout diagram of FIG. 5A, FIG. 5B, FIG. 6A, FIG. 7A and FIG. 8A after stacking.

FIG. 8B is a layout diagram of FIG. 5A, FIG. 5B, FIG. 6A, FIG. 7A and FIG. 8A after stacking.

For example, as illustrated in FIG. 8A and FIG. 8B, the first electrode layer SD comprises a plurality of first power supply voltage lines 1302, a plurality of first signal lines 1301 (for example, data lines), a plurality of first transfer electrodes TS1, a plurality of second transfer electrode TS2 and a plurality of third transfer electrodes TS3. For example, each of the first transfer electrodes TS1, each of the second transfer electrodes TS2, and each of the third transfer electrodes TS3 are located in the pixel driving circuits 105 of each of the plurality of sub-pixels 100. The plurality of first power supply voltage lines 1302 extend along the second direction X and are arranged side by side with the plurality of first signal lines 1301, and are configured to supply the first power supply voltage VDD to the pixel driving circuits 105 of each of the plurality of pixel units 100. Each of the pixel driving circuits 105 is located between two adjacent first signal lines 1301.

For example, the material of the second conductive layer GAT2 comprises a metal material or an alloy material, such as a metal single-layer structure or a multi-layer structure formed by molybdenum, aluminum and titanium, for example, the multi-layer structure is a stack of multiple metal layers (such as a three metal lamination layers of titanium, aluminum and titanium (Ti/Al/Ti)).

For example, as illustrated in FIG. 8A, the first pixel driving circuit 105a is provided with a first transfer electrode TS1a, a second transfer electrode TS1a, and a third transfer electrode TS1a. The second pixel driving circuit 105b is provided with a first transfer electrode TS1b, a second transfer electrode TS1b, and a third transfer electrode TS1b. The third pixel driving circuit 105c is provided with a first transfer electrode TS1c, a second transfer electrode TS1c and a third transfer electrode TS1c. For example, the first transfer electrode TS1a, the first transfer electrode TS1b, and the first transfer electrode TS1c have the same shape and the same extending direction. For example, the second transfer electrode TS2a, the second transfer electrode TS2b, and the second transfer electrode TS2c have the same shape and the same extending direction. For example, the third transfer electrode TS3a, the third transfer electrode TS3b, and the third transfer electrode TS3c have the same shape and not exactly the same extending directions. For example, the third transfer electrode TS1a of the first pixel driving circuit 105a extends along the first direction Y, and the third transfer electrode TS1b of the second pixel driving circuit 105b and the first transfer electrode TS1c of the third pixel driving circuit 105c extend along the second direction X.

For example, as illustrated in FIG. 8A and FIG. 8B, the first power supply voltage line 1302a and the first signal line 1301a (right side in the figure) are electrically connected to the first pixel driving circuit 105a. The first power supply voltage line 1302b and the first signal line 1301b (left side in the figure) are electrically connected to the second pixel driving circuit 105b. The first power supply voltage line 1302c and the first signal line 1301c (at the middle of the figure) are electrically connected to the third pixel driving circuit 105c.

For example, as illustrated in FIG. 8B, the first transfer electrode TS1 is electrically connected to the first transistor T1 and the third transistor T3. For example, one terminal of the first transfer electrode TS1 is connected to the gate electrode T1g (that is, the second capacitor electrode Cb) of the first transistor T1 through the first via electrode VH1, and the other terminal of the first transfer electrode TS1 is connected to the second electrode T3d of the third transistor T3 through the second via hole VH2. The first power supply voltage line 1302 is connected to the first capacitor electrode Ca by the third via hole VH3 to transmit the first power supply voltage VDD to the first capacitor electrode Ca. The third transfer electrode TS3 is connected to the first electrode T5s of the fifth transistor T5 by the fourth via hole VH4. The first power supply voltage line 1302 is connected to the first electrode T4s of the fourth transistor T4 by the fifth via hole VH5 to transmit the first power supply voltage VDD to the first capacitor electrode Ca. One end of the second transfer electrode TS2 is connected to the second electrode T6d of the sixth transistor T6 through the sixth via hole VH6, and the other end of the second transfer electrode TS2 is electrically connected to the reset signal line RL connected with the sixth transistor T6 through the seventh via hole VH7, thereby transmitting the first reset voltage Vinin1 to the sixth transistor T6. The first signal line 1301 is connected to the first electrode T2s of the second transistor T2 through the eighth via hole VH8, to transmit the data signal Vd to the second transistor T2. The first power supply voltage line 1302 is connected to the shielding electrode 171 through the ninth via VH9 to apply the first power supply voltage VDD to the shielding electrode 171. One end of the second transfer electrode TS2 of the sub-pixels in the next row is connected to the first electrode T6s of the seventh transistor T7 through the sixth via hole VH6', and the other end of the second transfer electrode TS2 of the sub-pixels in the next row is connected to the reset signal line RL in the next row of the reset signal line RL electrically connected with the sixth transistor T6 through the seventh via hole VH7' (at the middle position in FIG. 8B), thereby transmitting the second reset voltage Vinin2 to the seventh transistor T7.

Figure 9B:
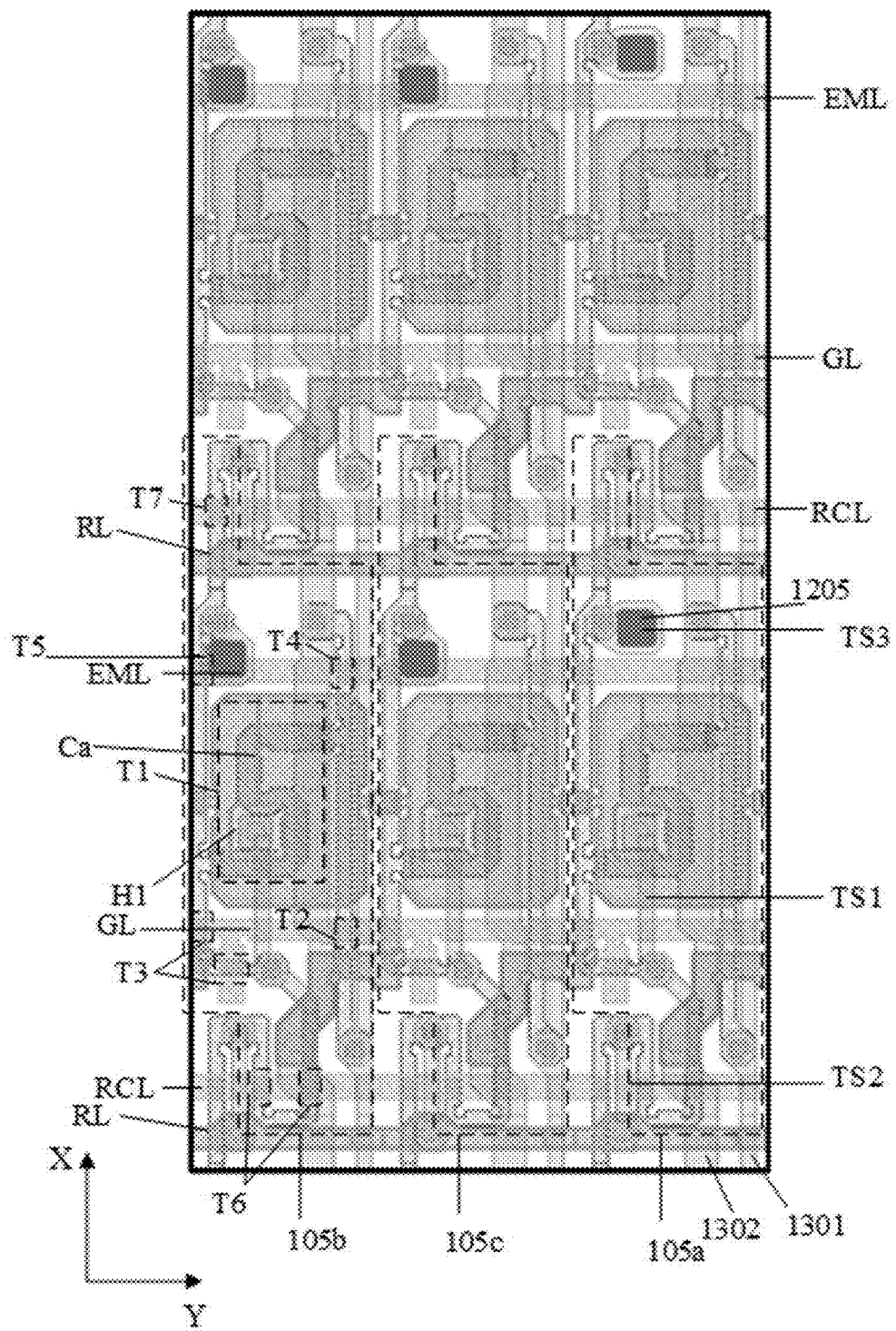
FIG. 9B is a layout diagram of FIG. 5A, FIG. 5B, FIG. 6A, FIG. 7A, FIG. 8A, and FIG. 9A after stacking.

FIG. 9A is a layout diagram of first via hole structures of the pixel unit illustrated in FIG. 3. FIG. 9B is a layout diagram of FIG. 5A, FIG. 5B, FIG. 6A, FIG. 7A, FIG. 8A, and FIG. 9A after stacking. As illustrated in FIG. 9A and FIG. 9B, the sub-pixel 100 comprises a first via hole structure 1205. The first electrode 1202 of the light-emitting element 120 is electrically connected to the pixel driving circuit 105 of the sub-pixel 100 through the first via hole structure 1205. For example, combining with FIG. 3, in one pixel unit 104, the first pixel driving circuit 105a is electrically connected to the first electrode 1202a of the first light-emitting element through the first via hole structure 1205a, the second pixel driving circuit 105b is electrically connected to the first electrode 1202b of the second light-emitting element through the first via hole structure 1205b, and the third pixel driving circuit 105c is electrically connected to the first electrode 1202c of the third light-emitting element through the first via hole structure 1205c.

For example, as illustrated in FIG. 9A and FIG. 5C, the first via hole structures 1205a/1205b/1205c of the light-emitting elements of the plurality of pixel units are located on the side of the first transistor T1 of the driving sub-circuit away from the bonding region. Therefore, in the second direction X, the arrangement space of the first via hole structures 1205a/1205b/1205c is saved, so that the light-emitting elements of the sub-pixels do not occupy the space of the lower frame, which can reduce the size of the lower frame, and is beneficial to realize the narrow frame.

For example, as illustrated in FIG. 9A and FIG. 9B, the first via hole structures 1205 of the light-emitting elements 120 of the plurality of sub-pixels 100 are located on the same side of the light-emitting regions 1201 of the light-emitting elements 120 of the plurality of sub-pixels 100, for example, the side away from the first bonding region 103 (above). For example, the first via hole structure 1205a, the first via hole structure 1205b and the first via hole structure 1205c in FIG. 3 are located, for example, on the side of the light-emitting region 1201a of the first sub-pixel 1001, the light-emitting region 1201b of the second sub-pixel 1002, the light-emitting region 1201c of the third sub-pixel 1003 away from the first bonding region 103 (above). In this way, the first electrode of the light-emitting element 120 can be prevented from protruding from the boundary of the display region close to the first bonding region 103, thereby reducing the size of the lower frame.

Figure 10B:
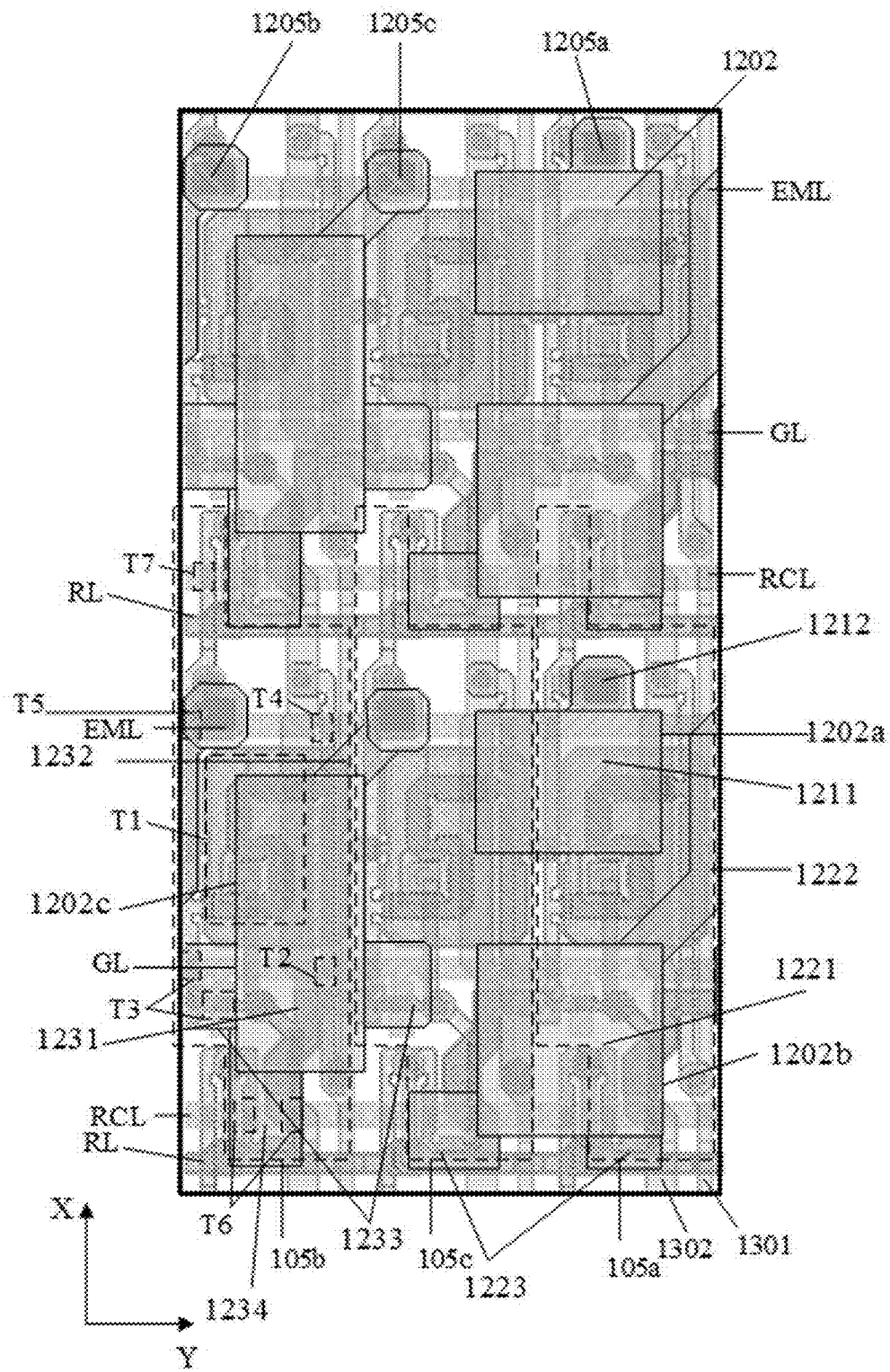
FIG. 10B is a layout diagram of FIG. 5A, FIG. 5B, FIG. 6A, FIG. 7A, FIG. 8A, FIG. 9A and FIG. 10A after stacking.

FIG. 10A is a layout diagram of a second electrode layer of the pixel unit illustrated in FIG. 3. FIG. 10B is a layout diagram of FIG. 5A, FIG. 5B, FIG. 6A, FIG. 7A, FIG. 8A, FIG. 9A and FIG. 10A after stacking. For example, as illustrated in FIG. 10A and FIG. 10B, the second electrode layer EL comprises the first electrode 1202 of the light-emitting element 120 (for example, the first electrode 1202a of the first light-emitting element, the first electrode 1202b of the second light-emitting element, and the first electrode 1202c of the third light-emitting element). For example, in one pixel unit 104, the first electrode 1202a of the first light-emitting element of the first sub-pixel 1001 and the first electrode 1202b of the second light-emitting element of the second sub-pixel 1002 are arranged along the first direction X. The first electrode 1202c of the third light-emitting element of the third sub-pixel 1003 is located on a side of the first electrode 1202a and the first electrode 1202b (for example, the left side).

For example, the material of the second electrode layer EL comprises at least one transparent conductive oxide material, comprising indium tin oxide (ITO), indium zinc oxide (IZO), zinc oxide (ZnO), and the like. In addition, the second electrode layer EL may comprise a metal with high reflectivity, such as silver (Ag), as a reflective layer.

For example, as illustrated in FIG. 10A and FIG. 10B, the first electrode 1202a of the first light-emitting element comprises a first body portion 1211 and a protrusion portion 1212. The light-emitting region 1201a of the first light-emitting element is located in the first body portion 1211. The protrusion portion 1212 protrudes along the second direction X from the side of the first body portion 1211 away from the bonding region 103 (for example, the upper side, that is, the side close to the first via hole structure 1205a), and is configured to be connected with the first electrode 1202a of the first light-emitting element and the first via hole structure 1205a electrically connected to the first pixel driving circuit 105a. In this way, the utilization rate of the sub-pixel arrangement space can be improved.

For example, as illustrated in FIG. 10A and FIG. 10B, the first electrode 1202b of the second light-emitting element comprises a second body portion 1221 and a first lead line 1222. The light-emitting region 1201b of the second light-emitting element is located in the second body portion 1221. The first lead line 1222 passes between the first electrode 1202a of the first light-emitting element and the first electrode 1202c of the third light-emitting element from the side of the second body portion 1221 away from the bonding region 103 (for example, the upper left side), and extends toward one side close to the first via hole structure 1205b. The first lead line 1222 is a bent line, and is configured to be connected to the first via hole structure 1205b electrically connected to the first electrode 1202b of the second light-emitting element and the second pixel driving circuit 105b. The orthographic projection of the first lead line 1222 on the board surface S of the base substrate 10 partially overlaps with the orthographic projection of the first pixel driving circuit 105a and the orthographic projection of the second pixel driving circuit 105b on the board surface S of the base substrate 10. In this way, the utilization rate of the sub-pixel arrangement space can be improved, and at the same time, the first electrode 1202b of the second light-emitting element does not occupy the space of the lower frame.

For example, as illustrated in FIG. 10A, the first lead line 1222 comprises a first line segment 1222A, a second line segment 1222B, and a third line segment 1222C. For example, the first lead 1222 is a lead line that has a plurality of segments and is bent and extended. One end of the first line segment 1222A close to the first electrode 1202b of the second light-emitting element is connected to the second body portion 1221 of the first electrode 1202b of the second light-emitting element. One end of the third line segment 1222C away from the first electrode 1202b of the second light-emitting element is connected to the first via hole structure 1205b electrically connected to the second pixel driving circuit 105b. Two ends of the second line segment 1222B are respectively connected to the other end of the first line segment 1222A (the end close to the second line segment 1222B) and the other end of the third line segment 1222C (the end close to the second line segment 1222B). The second line segment 1222B extends in the second direction X, and the first line segment 1222A and the third line segment 1222C extend in a direction different from the second direction X. That is, the first line segment 1222A extends obliquely and has a certain angle with the second line segment 1222B, and the third line segment 1222C extends obliquely and has a certain angle with the second line segment 1222B, so that a bent and extended structure is formed to improve a space utilization and make the line arrangement more compact.

For example, as illustrated in FIG. 10A, an included angle r1 between the extending direction of the first line segment 1222A and the second direction X (the extending direction of the second line segment 1222B) is 120 degrees to 150 degrees. The included angle r2 between the extending direction of the third line segment 1222C and the second direction X (the extending direction of the second line segment 1222B) is 120 degrees to 150 degrees. It should be noted that, in the embodiments of the present disclosure, the included angle r1 and the included angle r2 are obtuse angles.

For example, as illustrated in FIG. 10A and FIG. 10B, the first electrode 1202c of the third light-emitting element comprises a third body portion 1231 and a second lead line 1232. The light-emitting region 1201c of the third light-emitting element is located in the third body portion 1231. The second lead line 1232 extends from the side of the third body portion 1231 away from the bonding region 103 (for example, the upper left side) to the side close to the first via hole structure 1205c. The second lead line 1232 extends obliquely upward, and is configured to be connected to the first electrode 1202c of the third light-emitting element and the first via hole structure 1205c electrically connected to the third pixel driving circuit 105c. The orthographic projection of the second lead line 1232 on the board surface S of the base substrate 10 partially overlaps with the orthographic projection of the second pixel driving circuit 105b and the orthographic projection of the third pixel driving circuit 105c on the board surface S of the base substrate. In this way, the utilization rate of the sub-pixel arrangement space can be improved, and at the same time, the first electrode 1202b of the third light-emitting element does not occupy the space of the lower frame.

For example, as illustrated in FIG. 10A, the orthographic projection of the second lead line 1232 on the board surface S of the base substrate 10 partially overlaps with the orthographic projection of the first signal line 1301b (illustrated in FIG. 8A) electrically connected to the second pixel driving circuit 105b on the board surface S of the base substrate 10. For example, the first signal line 1301 extends along the second direction X, the second lead line 1232 extends obliquely, and the orthographic projection of the second lead line 1232 intersects with the orthographic projection of the first signal line 1301 on the board surface S of the base substrate 10.

For example, as illustrated in FIG. 10A and FIG. 10B, the first electrode 1202b of the second light-emitting element further comprises at least one first light shielding portion 1223 connected to the second body portion 1221, and the orthographic projection of the at least one first light shielding portion 1223 on the board surface S of the base substrate 10 at least partially overlaps with the orthographic projection of the sixth transistor T6 of the first pixel driving circuit 105a and the orthographic projection of the sixth transistor T6 of the third pixel driving circuit 105b on the board surface S of the base substrate 10. The at least one first light shielding portion 1223 as illustrated in the figure comprises two first light shielding portions 1223. The orthographic projection of the first light shielding portion 1223 on the left side of the second body portion 1221 and the orthographic projection of the second body portion 1221 on the board surface S of the base substrate 10 overlap with the orthographic projection of the sixth transistor T6 of the third pixel driving circuit 105c on the board surface S of the base substrate 10. In the figure, the orthographic projections of the other first light shielding portion 1223 and the second body portion 1221 on the board surface S of the base substrate 10 overlap with the orthographic projection of the sixth transistor T6 of the first pixel driving circuit 105a on the board surface S of the base substrate 10. Because the threshold voltage of the sixth transistor is shifted in the case where the light is irradiated on the gate electrode of the sixth transistor. In the embodiments of the present disclosure, by arranging the first electrode 1202b to shield the gate electrode of the sixth transistor, the stability of the sixth transistor is improved, thereby the display uniformity is improved.

For example, as illustrated in FIG. 10A and FIG. 10B, the orthographic projection of the second body portion 1221 of the first electrode 1202b of the second light-emitting element on the board surface S of the base substrate 10 at least partially overlaps with the orthographic projection of the third transistor T3 of the first pixel driving circuit 105a on the board surface S of the base substrate 10. Because the threshold voltage of the third transistor is shifted in the case where the light is irradiated on the gate electrode of the third transistor. In the embodiments of the present disclosure, by arranging the first electrode 1202b to shield the gate electrode of the third transistor, the stability of the third transistor is improved, thereby the display uniformity is improved.

For example, as illustrated in FIG. 10A and FIG. 10B, the first electrode 1202c of the third light-emitting element further comprises at least one second light shielding portion 1233 connected to the third body portion 1231, and the at least one second light shielding portion 1233 extends along the first direction Y, the orthographic projection of the at least one light shielding portion 1233 on the board surface S of the base substrate 10, at least partially overlaps with the orthographic projection of the third transistor T3 of the second pixel driving circuit 105b and the orthographic projection of the third transistor T3 of the third pixel driving circuit 105c on the board surface S of the base substrate 10. For example, the at least one second light shielding portion 1233 as illustrated in the figure comprises two second light shielding portions 1233, which are respectively located on the left side and the right side of the third body portion 1231. The orthographic projection of the second light shielding portion 1233 located on the left side of the third body portion 1231 on the board surface S of the base substrate 10, overlaps with the orthographic projection of the third transistor T3 of the second pixel driving circuit 105b on the board surface S of the base substrate 10. In the figure, the orthographic projection of the other second light shielding portion 1233 on the board surface S of the base substrate 10, overlaps with the orthographic projection of the third transistor T3 of the third pixel driving circuit 105c on the board surface S of the base substrate 10. Because the threshold voltage of the third transistor T3 is shifted in the case where the light is irradiated on the gate electrode of the third transistor T3. In the embodiments of the present disclosure, by arranging the first electrode 1202c to shield the gate electrode of the third transistor T3, the stability of the third transistor T3 is improved, and the display uniformity is improved.

For example, as illustrated in FIG. 10A and FIG. 10B, the first electrode 1202c of the third light-emitting element further comprises a third light shielding portion 1234 connected to the third body portion 1231. The third light shielding portion 1234 extends in the second direction, and the orthographic projection of the third light shielding portion 1234 on the board surface S of the base substrate 10, at least partially overlaps with the orthographic projection of the sixth transistor T6 of the second pixel driving circuit 105b on the board surface S of the base substrate 10. Because the threshold voltage of the sixth transistor is shifted in the case where the light is irradiated on the gate electrode of the sixth transistor. In the embodiments of the present disclosure, by arranging the first electrode 1202c to shield the gate electrode of the sixth transistor, the stability of the sixth transistor is improved, and the display uniformity is improved.

For example, FIG. 11 is a layout diagram of a pixel definition layer in the display substrate provided by an embodiment of the present disclosure. FIG. 3 is obtained by stacking FIG. 5A, FIG. 5B, FIG. 6A, FIG. 7A, FIG. 8A, FIG. 9A, FIG. 10A, and FIG. 11.

For example, as illustrated in FIG. 11, FIG. 3 and FIG. 12, the display substrate 1 comprises the pixel definition layer 147, and the pixel definition layer 147 is disposed on a side of the pixel driving circuit 105 of the plurality of sub-pixels 100 away from the base substrate 10. The pixel definition layer 147 comprises a plurality of openings 1471. The plurality of openings 1471 are located in the light-emitting elements 120 of the plurality of sub-pixels 100 in one-to-one correspondence, and each of the plurality of openings 1471 is configured to expose the first electrode 1202 of the light-emitting element 120 to form the light-emitting region 1201 of the light-emitting element 120. For example, the opening 1471a in FIG. 11 corresponds to the first light-emitting element of the first sub-pixel 1001, to form the light-emitting region 1201a of the first light-emitting element of the first sub-pixel 1001. The opening 1471b in FIG. 11 corresponds to the second light-emitting element of the second sub-pixel 1002, to form the light-emitting region 1201b of the second light-emitting element of the second sub-pixel 1002. The opening 1471c in FIG. 11 corresponds to the third light-emitting element of the third sub-pixel 1003, to form the light-emitting region 1201c of the third light-emitting element of the third sub-pixel 1003. For example, the light-emitting region 1201a and the light-emitting region 1201b are arranged along the second direction X, for example, a width X2 of the light-emitting region 1201a along the first direction Y and a width X3 of the light-emitting region 1201b along the first direction Y are equal. For example, the light-emitting region 1201c is located on a side of the light-emitting region 1201a and the light-emitting region 1201b (for example, the left side). A width X4 of the light-emitting region 1201c along the first direction Y is greater than the width X2 of the light-emitting region 1201a along the first direction Y and the width X3 of the light-emitting region 1201b along the first direction Y.

For example, in other embodiments, the width X2 of the light-emitting region 1201a along the first direction Y is unequal to the width X3 of the light-emitting region 1201b along the first direction Y, which is depended on design requirements, and the embodiments of the present disclosure are not limited to this.

For example, as illustrated in FIG. 3, the light-emitting region 1201a of the first light-emitting element of the first sub-pixel 1001 may be located in the middle of the body portion 1211 of the first electrode 1202a of the first light-emitting element, that is, the light-emitting region 1201a coincides with a center line of the body portion 1211 along the second direction X. The light-emitting region 1201b of the second light-emitting element of the second sub-pixel 1002 may be located in the middle of the body portion 1221 of the first electrode 1202b of the second light-emitting element, that is, the light-emitting region 1201b coincides with a center line of the body portion 1231 along the second direction X. The light-emitting region 1201c of the second light-emitting element of the third sub-pixel 1003 may be located in the middle of the body portion 1231 of the first electrode 1202c of the third light-emitting element, that is, the light-emitting region 1201c coincides with a center line of the body portion 1231 along the second direction X. For example, in other embodiments, the center line of the light-emitting region of the light-emitting element may not overlap with the center line of the first electrode of the light-emitting element, and the embodiments of the present disclosure is not limited thereto.

For example, as illustrated in FIG. 12, the light-emitting element 120 further comprises a light-emitting layer 1203 and a second electrode 1204 (for example, a cathode). The light-emitting layer 1203 is disposed in the opening 1471, and the second electrode 1204 is disposed on the side of the light-emitting layer 1203 and the pixel definition layer 147 away from the base substrate 10. For example, the second electrode 1204 is formed on the display substrate 1 with an entire surface. The light-emitting layer 1203 emits light under an action of a voltage difference between the first electrode 1201 and the second electrode 1204.

For example, for an OLED, the light-emitting layer 1203 may comprise small molecular organic materials or polymer molecular organic materials, may be fluorescent light-emitting materials or phosphorescent light-emitting materials, and may emit red light, green light and blue light, or may emit white light; and as required the light-emitting layer may further comprise functional layers such as an electron injection layer, an electron transport layer, a hole injection layer, and a hole transport layer. For the QLED, the light-emitting layer 1203 may comprise quantum dot materials, for example, a silicon quantum dot, a germanium quantum dot, a cadmium sulfide quantum dot, a cadmium selenide quantum dot, a cadmium telluride quantum dot, a zinc selenide quantum dot, a lead sulfide quantum dot, a lead selenide quantum dot, an indium phosphide quantum dot and an indium arsenide quantum dot and so on, and the particle size of the quantum dot is 2 nm to 20 nm.

For example, the second electrode 1204 may comprise various conductive materials. For example, the second electrode 1204 may comprise metal materials such as lithium (Li), aluminum (Al), magnesium (Mg), and silver (Ag).

For example, the material of the pixel definition layer 147 may comprise organic insulating materials such as polyimide, polyphthalimide, polyphthalamide, acrylic resin, benzocyclobutene, or phenolic resin, or comprise inorganic and insulation materials such as silicon oxide and silicon nitride, which is not limited in the embodiments of the present disclosure.

Figure 13:
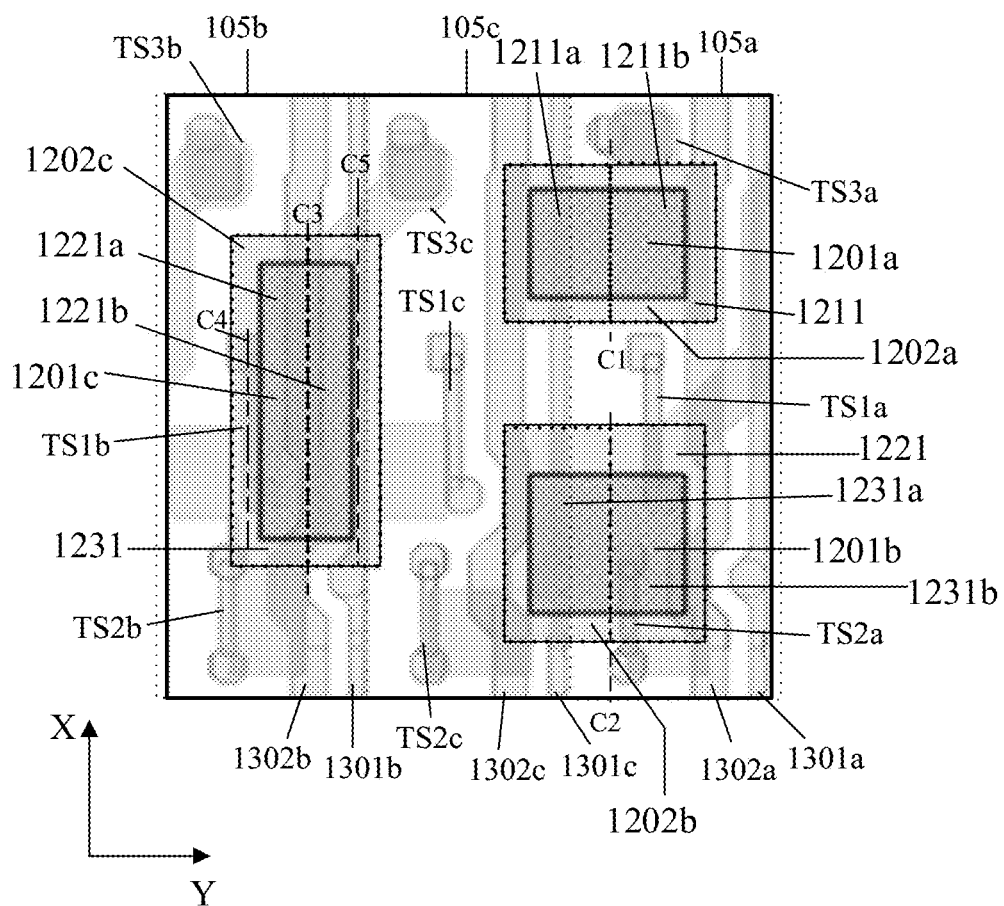
FIG. 13 is a layout diagram of a partial film layer structure of a pixel unit of a display substrate provided by an embodiment of the present disclosure.

For example, in some examples, the first electrode of each of the plurality of sub-pixels comprises a body portion, the body portion comprises a first body sub-portion and a second body sub-portion, and the first body sub-portion and the second body sub-portion are located at two sides of the center line extending in the second direction of the body portion. FIG. 13 is a layout diagram of a partial layer structure of the pixel unit in the display substrate provided by an embodiment of the present disclosure. As illustrated in FIG. 10A and FIG. 13, the body portion 1211 of the first electrode 1202a of the first sub-pixel 1001 comprises a first body sub-portion 1211a and a second body sub-portion 1211b. The body portion 1221 of the first electrode 1202b of the second sub-pixel 1002 comprises a first body sub-portion 1221*a* and a second body sub-portion 1221*b*. The body portion 1231 of the first electrode 1202*c* of the third sub-pixel 1003 comprises a first body sub-portion 1231*a* and a second body sub-portion 1231*b*. In FIG. 13, the first body sub-portion 1211*a* and the second body sub-portion 1211*b* are located at two sides of a center line C1 of the body portion 1211 extending along the second direction X, for example, the first body sub-portion 1211*a* and the second body sub-portion 1211*b* can be regarded as two left-right symmetrical portions of the first electrode 1202*a*. The first body sub-portion 1221*a* and the second body sub-portion 1221*b* are located on two sides of a center line C2 of the body portion 1221 extending along the second direction X, for example, the first body sub-portion 1221*a* and the second body sub-portion 1221*b* can be regarded as two left-right symmetrical portions of the first electrode 1202*b*. The first body sub-portion 1231*a* and the second body sub-portion 1231*b* are located on two sides of a center line C3 of the body portion 1231 extending along the second direction X, for example, the first body sub-portion 1231*a* and the second body sub-portion 1231*b* can be regarded as two left-right symmetrical portions of the first electrode 1202*c*.

For example, as illustrated in FIG. 8A and FIG. 13, the value of the ratio of the area of the overlapping portion of the orthographic projection of the first body sub-portion (for example, the first body sub-portion 1211*a*, the first body sub-portion 1221*a*, and the first body sub-portion 1231*a*) on the board surface S of the base substrate 10 and the orthographic projection of the first electrode layer SD on the board surface S of the base substrate 10, and the area of the overlapping portion of the orthographic projection of the second body sub-portion (for example, the second body sub-portion 1211*b*, the second body sub-portion 1221*b* and the second body sub-portion 1231*b*) on the board surface S of the base substrate 10 and the orthographic projection of the first electrode layer SD on the board surface S of the base substrate 10 ranges from 0.82 to 1.02. That is, the value of the ratio of the area of the overlapping portion of the orthographic projection of the first body sub-portion (for example, the first body sub-portion 1211*a*, the first body sub-portion 1221*a*, and the first body sub-portion 1231*a*) on the board surface S of the base substrate 10 and the orthographic projection of the first power supply voltage line 1302, the first signal line 1301, the first transfer electrode TS1, the second transfer electrode TS2 and the third transfer electrode TS3 at the first electrode layer SD on the board surface S of the base substrate 10, and the area of the overlapping portion of the orthographic projection of the second body sub-portion (for example, the second body sub-portion 1211*b*, the second body sub-portion 1221*b* and the second body sub-portion 1231*b*) on the board surface S of the base substrate 10 and the orthographic projection of the first power supply voltage line 1302, the first signal line 1301, the first transfer electrode TS1, the second transfer electrode TS2 and the third transfer electrode TS3 at the first electrode layer SD on the board surface S of the base substrate 10 ranges from 0.82 to 1.02. For example, in the case where the value is in the range of about 0.82 to 1.02, the difference between the overlapping regions of the lines in the first electrode layer and the two sides of the body of the light-emitting region is small, which is beneficial to improve the flatness of the body portion of the first electrode of the light-emitting element, so as to improve the flatness of the light-emitting region. If the range is too small or too large, for example, less than 0.82 or greater than 1.02, the difference between the overlapping regions of the lines in the first electrode layer and the two sides of the body of the light-emitting region is large, which will deteriorate the flatness of the body portion of the first electrode of the light-emitting element. The orthographic projections of the light-emitting regions 1201 of the light-emitting elements 120 of a part of sub-pixels 100 do not overlap with the orthographic projections of the plurality of first power supply voltage lines 1302 on the board surface S of the base substrate 10. For example, the orthographic projection of the light-emitting region 1201*a* of the first sub-pixel 1001 does not overlap with the orthographic projections of the first power supply voltage line 1302*a* and the first power supply voltage line 1302*c* on the board surface S of the base substrate 10. In this way, the number of the lines in the first electrode layer under the first electrode of the light-emitting element can be reduced, and the lines can be arranged on two sides of the body of the light-emitting region of the first electrode of the light-emitting element as much as possible, so that the lines at the first electrode layer appear symmetrically as much as possible, or the difference between the overlapping regions of the lines in the first electrode layer and the two sides of the body of the light-emitting region is small, which is beneficial to improve the flatness of the body portion of the first electrode of the light-emitting element, so as to improve the flatness of the light-emitting region, and help to optimize the display effect.

For example, in some examples, as illustrated in FIG. 13, at least partial of the light-emitting regions 1201 of the light-emitting elements of the sub-pixels 100 are located between the orthographic projections of two adjacent first power supply voltage lines 1302 on the board surface S of the base substrate 10. For example, the light-emitting region 1201*a* of the first sub-pixel 1001 is located between the orthographic projection of the first power supply voltage line 1302*a* and the orthographic projection of the first power supply voltage line 1302*c* on the board surface S of the base substrate 10, so as to improve the flatness of the light-emitting region 1201*a*, and help to optimize the display effect.

For example, in some examples, as illustrated in FIG. 13, the orthographic projections of the light-emitting regions 1201 (for example, light-emitting regions 1201*a*) of the light-emitting elements of a part of the sub-pixels 100 do not overlap with the orthographic projections of a plurality of first power supply voltage lines 1302 on the board surface S of the base substrate 10, to improve the flatness of the light-emitting region and help to optimize the display effect.

For example, in some examples, as illustrated in FIG. 13, the orthographic projections of the light-emitting regions 1201 of the light-emitting elements of a part of the sub-pixels 100 do not overlap with the orthographic projections of the plurality of first signal lines 1301 on the board surface S of the base substrate 10. For example, the orthographic projections of the light-emitting region 1201*c* of the third sub-pixel 1003 do not overlap with the orthographic projections the plurality of first signal lines 1301 on the board surface S of the base substrate 10, so as to improve the flatness of the light-emitting region and optimize the display effect.

For example, as illustrated in FIG. 8A and FIG. 11, a width X1 of the region between two adjacent first power supply voltage lines 1302 (for example, the first power supply voltage line 1302*a* and the first power supply voltage line 1302*c*) along the first direction Y, is larger than the width of the light-emitting region 1201 of the light-emitting element of the plurality of sub-pixels 100 along the first direction Y (for example, the width X2 of the light-emitting region 1201*a* along the first direction Y, the width X3 of the light-emitting region 1201b along the first direction Y, and the width X4 of the light-emitting region 1201c along the first direction Y). For example, the value range of the width X1 of the region between two adjacent first power supply voltage lines 1302 (for example, the first power supply voltage line 1302a and the first power supply voltage line 1302c) is about 21 microns to 23 microns, for example, the value of X1 is about 22 microns. The value range of the width of the light-emitting region 1201 of the light-emitting element of the plurality of sub-pixels 100 along the first direction Y (for example, the width X2 of the light-emitting region 1201a along the first direction Y, the width X3 of the light-emitting region 1201b along the first direction Y, and the width X4 of the light-emitting region 1201c along the first direction Y) is about 10 microns to 20.5 microns. For example, the width X2 of the light-emitting region 1201a along the first direction Y is about 20.31 microns, the width X3 of the light-emitting region 1201b along the first direction Y is about 20.31 microns, and the width X4 of the light-emitting region 1201c along the first direction Y is about 11.69 microns. In this way, the number of lines in the first electrode layer under the first electrode of the light-emitting element can be reduced, thereby improving the flatness of the body of the first electrode of the light-emitting element, so as to improve the flatness of the light-emitting region, and help to optimize the display effect.

It should be noted that, in the embodiments of the present disclosure, the word "about" indicates that the value range or the value may fluctuate within a range of, for example, ±5%, and for example, ±10%.

For example, as illustrated in FIG. 8A and FIG. 11, the value range of a distance X5 between the center points of the corresponding positions of the two adjacent first power supply voltage lines 1302 (for example, the first power supply voltage line 1302a and the first power supply voltage line 1302b) along the first direction Y (for example, the center points are located on the center line C6 of the first power supply voltage line 1302a and the center line C6' of the first power supply voltage line 1302b, respectively) is about 24 microns to 30 microns, for example, the value of the distance X5 is about 26 microns. The value range of the width X6 of any one of the plurality of first power supply voltage lines 1302 (for example, the first power supply voltage line 1302a, the first power supply voltage line 1302b and the first power supply voltage line 1302c) along the first direction Y is about 3.3 microns to 7.3 microns.

For example, as illustrated in FIG. 8A, the value range of the width of the first signal line 1301 (for example, the first signal line 1301a, the first signal line 1301b, and the first signal line 1301c) along the first direction Y is, for example, about 1.5 microns to 2.5 microns, the value of the width is, for example, about 2 microns. For example, the value range of the width of the first transfer electrode TS1 along the first direction Y is, for example, about 1.5 microns to 2.5 microns, and the value of the width is, for example, about 2 microns. For example, the value range of the width of the second transfer electrode TS2 along the first direction Y is, for example, about 1.5 microns to 2.5 microns, and the value of the width is, for example, about 2 microns.

For example, as illustrated in FIG. 13, the orthographic projections of the light-emitting regions 1201 of the light-emitting elements of a part of sub-pixels 100 partially overlap with the orthographic projection of at least one of the plurality of first power supply voltage lines 1301 on the board surface S of the base substrate 10. The overlapping portion of the orthographic projection of at least one of the plurality of first power supply voltage lines 1301 on the board surface S of the base substrate 10, and the orthographic projection of the light-emitting region 1201 of the light-emitting elements of the plurality of sub-pixels 100 are symmetrical about the center line extending in the first direction Y of the light-emitting regions 1201. For example, the light-emitting region 1201a of the first sub-pixel 1001 may extend to the left side and the right side, so that the overlapping portion of the orthographic projection of the light-emitting region 1201a, and the orthographic projection of the first power supply voltage line 1301a and the first power supply voltage line 1301c on the board surface S of the base substrate 10 are symmetrical about the center line extending in the second direction X of the light-emitting regions 1201a. In this way, the flatness of the light-emitting region 1201a is improved, and the display effect is optimized.

For example, as illustrated in FIG. 13, the orthographic projection of the first body sub-portion 1211a of the first electrode 1202a of the first light-emitting element of the first sub-pixel 1001 on the board surface S of the base substrate 10, partially overlaps with the orthographic projections of the first power supply voltage line 1032c and the first signal line 1031c electrically connected to the third pixel driving circuit 105c on the board surface S of the base substrate 10. The orthographic projection of the second body sub-portion 1211b of the first electrode 1202a on the board surface S of the base substrate 10, partially overlaps with the orthographic projection of the first power supply voltage line 1302a electrically connected to the first pixel driving circuit 105a on the board surface S of the base substrate 10. For example, the first power supply voltage line 1032c and the first signal line 1031c appear on the left side of the body sub-portion 1211 of the first electrode 1202a, and the first power supply voltage line 1302a appears on the right side of the body sub-portion 1211 of the first electrode 1202a. The overlapping portion of the orthographic projection of the second body sub-portion 1211b and the orthographic projection of the first power supply voltage line 1302a on the board surface S of the base substrate 10 is larger than the overlapping portion of the orthographic projection of the first body sub-portion 1211a and the orthographic projection the first power supply voltage line 1032c on the board surface S of the base substrate 10. That is, the orthographic projection of the first body sub-portion 1211a on the board surface S of the base substrate 10 overlaps with the orthographic projections of the first power supply voltage line 1032c and the first signal line 1031c on the board surface S of the base substrate 10, to balance the overlapping portion of the orthographic projections of the first body sub-portion 1211a and the first power supply voltage line 1032c on the board surface S of the base substrate 10. In this way, the flatness of the light-emitting region is improved, and the display effect is optimized.

For example, as illustrated in FIG. 8A and FIG. 8B, the plurality of first power supply voltage lines comprise S-shaped bent portions 1303. For example, the first power supply voltage line 1302a electrically connected to the first pixel driving circuit 105a comprises a bent portion 1303a. The first power supply voltage line 1302b electrically connected to the second pixel driving circuit 105b comprises a bent portion 1303b. The first power supply voltage line 1302b electrically connected to the third pixel driving circuit 105c comprises a bent portion 1303c. As illustrated in FIG. 8B, the bent portion is routed around the second via hole VH2 and the eighth via hole VH8 to prevent a signal crosstalk.

For example, as illustrated in FIG. 13, the orthographic projection of the first body sub-portion 1231a of the first electrode 1202b of the second light-emitting element of the second sub-pixel 1002 on the board surface S of the base substrate 10 partially overlaps with the orthographic projection of the bent portion 1303c of the first power supply voltage line 1302c and the first signal line 1301c electrically connected to the third pixel driving circuit 105c on the board surface S of the base substrate 10. The orthographic projection of the second body sub-portion 1231b of the first electrode 1202b on the board surface S of the base substrate 10 partially overlaps with the orthographic projections of the bent portion 1303a of the first power supply voltage line 1302a electrically connected to the first pixel driving circuit 105a, the first connection electrode TS1a of the first pixel driving circuit 105a and the second connection electrode TS2a of the first pixel driving circuit 105a on the board surface S of the base substrate 10. For example, the area of the overlapping portion of the orthographic projection of the bent portion 1303c of the first body sub-portion 1231a and the orthographic projection of the first power supply voltage line 1302c on the board surface S of the base substrate 10 is substantially equal to the area of the overlapping portion of the orthographic projection of the second body sub-portion 1231b and the orthographic projection of the bent portion 1303a of the first power supply voltage line 1302a. The area of the overlapping portion of the orthographic projection of the first body sub-portion 1231a and the orthographic projection of the first signal line 1301c on the board surface S of the base substrate 10, is substantially equal to the area of the overlapping portion of the orthographic projection of the second body sub-portion 1231b and the orthographic projections of the first connection electrode TS1a and the second connection electrode TS2a. In this way, the flatness of the light-emitting region 1201b is improved, and the display effect is optimized.

For example, as illustrated in FIG. 13, a center line C4 of the first connection electrode TS1b of the second pixel driving circuit 105b extending along the second direction X and a center line C5 of the first signal line 1301b electrically connected to the second pixel driving circuit 105b extending along the second direction X are symmetrical with respect to the center line C3 extending along the second direction X of the body portion 1221 of the first electrode 1202c of the third light-emitting element of the third sub-pixel 1003. The orthographic projection of the first body sub-portion 1221a of the first electrode 1202c on the board surface S of the base substrate 10 partially overlaps with the orthographic projection of the first connection electrode TS1b of the second pixel driving circuit 105b on the board surface S of the base substrate 10. The orthographic projection of the second body sub-portion 1221b of the first electrode 1202c on the board surface S of the base substrate 10 partially overlaps with the orthographic projection of the first signal line 1301b electrically connected to the second pixel driving circuit 105b. The orthographic projection of the center line C3 of the body portion 1221 of the first signal line 1301b extending along the second direction X on the board surface S of the base substrate 10 overlaps with the orthographic projection of the first power supply voltage line 1302b electrically connected to the second pixel driving circuit 105b on the board surface S of the base substrate 10. For example, the first signal line 1301b and the first connection electrode TS1b appear symmetrically below the left side and the right side of the body portion 1221, and the first power supply voltage line 1302b is located in the middle of the first power supply voltage line 1302b, so as to improve the flatness of the light-emitting region 1201c, and help to optimize the display effect.

For example, as illustrated in FIG. 12, the display substrate 1 further comprises a buffer layer 141, a barrier layer 142, a planarization layer 144, a spacer PS, and an encapsulation layer 148.

As illustrated in FIG. 12, the buffer layer 141 is disposed on the base substrate 10, and the buffer layer 211 serves as a transition layer, which can not only prevent harmful substances in the base substrate from invading the interior of the display substrate, but also increase an adhesion of the film layer in the display substrate on the base substrate 100. The barrier layer 142 is located on the side of the buffer layer 141 away from the base substrate 10. The barrier layer 142 can prevent impurities or gases from entering the pixel driving circuit.

For example, the base substrate 10 may be a glass plate, a quartz plate, a metal plate, a resin-based plate, or the like. For example, the material of the base substrate may comprise an organic material, for example, the organic material may be resin materials such as polyimide, polycarbonate, polyacrylate, polyetherimide, polyethersulfone, polyethylene terephthalate and polyethylene naphthalate, and so on, the base substrate 10 may be a flexible substrate or a non-flexible substrate, which is not limited in the embodiments of the present disclosure.

For example, the material of the buffer layer 141 may comprise insulating materials such as silicon oxide, silicon nitride, and silicon oxynitride.

For example, as illustrated in FIG. 12, an active layer T51 of the fifth transistor T5 and an active layer T11 of the first transistor T1 are disposed on the side of the barrier layer 142 away from the base substrate 10. For example, the active layer T51 comprises the channel region T5a of the fifth transistor T5, and the active layer T11 comprises the channel region T1a of the first transistor T1. The first gate insulating layer 143 is disposed on the side of the active layer T51 and the active layer T11 away from the base substrate 10. The active layer T51 and the active layer T11 are located in the semiconductor layer PL (as illustrated in FIG. 5A). The gate electrode T5g of the fifth transistor T5 and the second capacitor electrode Cb (for example, the gate electrode T1g of the first transistor T1) are disposed on the side of the first gate insulating layer 143 away from the base substrate 10. The gate electrode T5g of the fifth transistor T5 and the second capacitor electrode Cb (for example, the gate electrode T1g of the first transistor T1) are located in the first conductive layer GAT1 (as illustrated in FIG. 5B). The second gate insulating layer 144 is disposed on the side of the gate electrode T5g of the fifth transistor T5 and the second capacitor electrode Cb (for example, the gate electrode T1g of the first transistor T1) away from the base substrate 10. The first capacitor electrode Ca is located on the side of the second gate insulating layer 144 away from the base substrate 10. The first capacitor electrode Ca is located in the second conductive layer GAT2 (as illustrated in FIG. 6A). The interlayer insulating layer 145 is disposed on the side of the first capacitor electrode Ca away from the base substrate 10. The first electrode T5s and the second electrode T5d of the fifth transistor 5 and the first transfer electrode TS1 are located on the side of the interlayer insulating layer 145 away from the base substrate 10. The first electrode T5s and the second electrode T5d of the fifth transistor 5 and the first transfer electrode TS1 are located in the first electrode layer SD (as illustrated in FIG. 8A). The first electrode T5s and the second electrode T5d of the fifth transistor 5 are electrically connected to the active layer T51 of the fifth transistor T5 through via holes penetrating through the first gate insulating layer 143, the second gate insulating layer 144 and the interlayer insulating layer 145. The first transfer electrode TS1 is electrically connected to the second capacitor electrode Cb through a via hole penetrating through the second gate insulating layer 144 and the interlayer insulating layer 145.

For example, materials of one or more of the first gate insulating layer 143, the second gate insulating layer 144 and the interlayer insulating layer 145 may comprise insulating materials such as silicon oxide, silicon nitride, and silicon oxynitride. The materials of the first gate insulating layer 143, the second gate insulating layer 144 and the interlayer insulating layer 145 may be the same or different.

For example, as illustrated in FIG. 12, the planarization layer 144 is disposed on the side of the first electrode T5$s$ and the second electrode T5$d$ of the fifth transistor T5 and the first transfer electrode TS1 away from the base substrate 10, to provide a planarization surface to the pixel driving circuit. For example, the first via hole structure 1205 penetrates through the planarization layer 144 and exposes the second electrode T5$d$ of the fifth transistor T5. For example, the material of the planarization layer 144 comprises inorganic insulating materials such as silicon oxide, silicon nitride, and silicon oxynitride, and may further comprise organic insulating materials such as polyimide, polyphthalimide, polyphthalamide, acrylic resin, and benzocyclobutene or phenolic resin, which are not limited in the embodiments of the present disclosure.

For example, as illustrated in FIG. 12, the first electrode 1202 of the light-emitting element 120 is electrically connected to the second electrode T5$d$ of the fifth transistor T5 through the first via hole structure 1205. The pixel definition layer 147 comprises a plurality of openings 1471 disposed on a side of the planarization layer 144 away from the base substrate 10. The light-emitting layer 1203, the second electrode 1204 and the pixel definition layer 147 of the light-emitting element 120 are described in detail above and will not be repeated here.

For example, as illustrated in FIG. 12, the spacer PS is provided on the side of the pixel definition layer 147 away from the base substrate 10. The spacer PS is located on the side of the first electrode 1204 close to the base substrate 10. For example, the material of the spacer PS may comprise a transparent insulating material. For example, the transparent insulating material is a transparent organic material such as polyimide and resin.

For example, as illustrated in FIG. 12, the encapsulation layer 148 is provided on the side of the first electrode 1204 away from the base substrate 10. The encapsulation layer 148 seals the light-emitting element 120, so that the deterioration of the light-emitting element 12 caused by moisture and/or oxygen comprised in the environment can be reduced or prevented. For example, the encapsulation layer 148 may be a single-layer structure, or may be a composite layer structure, and the composite layer structure comprises a structure in which an inorganic layer and an organic layer are stacked. The encapsulation layer 148 comprises at least one encapsulation sub-layer. For example, the encapsulation layer 148 may comprise a first inorganic encapsulation layer, a first organic encapsulation layer, and a second inorganic encapsulation layer arranged in sequence.

For example, the material of the encapsulation layer 148 may comprise the insulating materials such as silicon nitride, silicon oxide, silicon oxynitride, and polymer resin. Inorganic materials such as silicon nitride, silicon oxide, and silicon oxynitride have high compactness and can prevent the intrusion of water and oxygen; the material of the organic encapsulation layer can be a polymer material containing a desiccant or a polymer material that can block water vapor, and the like. For example, the polymer resin can be used to flatten the surface of the display substrate, and a stress of the first inorganic encapsulation layer and the second inorganic encapsulation layer can be relieved, and water-absorbing materials such as desiccant can also be comprised to absorb the water and oxygen intruding inside the display substrate.

Figure 14:
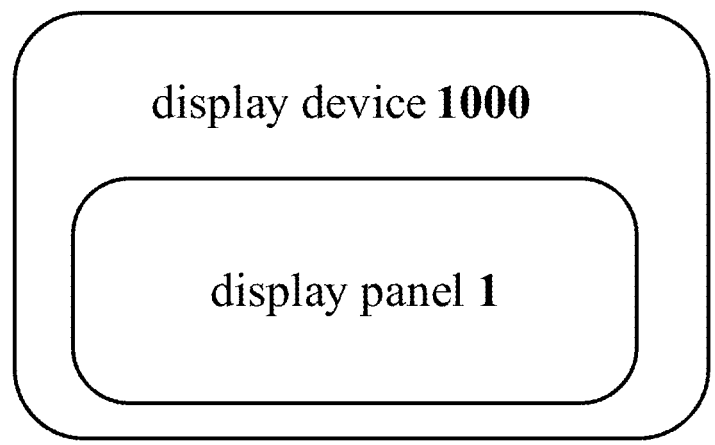
FIG. 14 is a schematic diagram of a display device provided by an embodiment of the present disclosure.

At least one embodiment of the present disclosure further provides a display device. FIG. 14 is a schematic diagram of a display device according to an embodiment of the disclosure. As illustrated in FIG. 14, the display device 1000 comprises the display substrate 1 provided by any one of the embodiments of the present disclosure, for example, the display substrate 1 illustrated in FIG. 2.

It should be noted that, the display device 1000 can be any product or component with a display function, such as an OLED panel, an OLED TV, a QLED panel, a QLED TV, a mobile phone, a tablet computer, a notebook computer, a digital photo frame, and a navigator. The display device 1000 may further comprise other components, such as a data driving circuit, a timing controller and so on, which are not limited in the embodiments of the present disclosure.

It should be noted that, for clarity and brevity, the embodiments of the present disclosure do not provide all the constituent units of the display device. In order to realize the basic function of the display device, those skilled in the art can provide or set other structures not illustrated according to specific needs, which are not limited by the embodiments of the present disclosure.

The technical effect of the display device 1000 provided by the above embodiment can refer to the technical effect of the display substrate 1 provided in the embodiment of the present disclosure, which will not be repeated herein.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other to obtain new embodiments.

What are described above is related to only the illustrative embodiments of the present disclosure and not limitative to the protection scope of the present application. Any technical personnel familiar with the technical field can easily think of changes or replacements within the technical scope of the disclosure, which should be covered by the protection scope of the present disclosure. Therefore, the protection scope of the present application shall be defined by the accompanying claims.

What is claimed is:

1. A display substrate, comprising:
a base substrate, comprising a display region, wherein the display region comprises a plurality of sub-pixels, and each of the plurality of sub-pixels comprises a pixel driving circuit and a light-emitting element, the light-emitting element comprises a light-emitting region and a first electrode located in the light-emitting region of the light-emitting element, the pixel driving circuit is configured to drive the light-emitting element to emit light,
wherein the pixel driving circuit comprises a driving sub-circuit, a data writing sub-circuit, a compensation sub-circuit, and a storage sub-circuit, a first light emission control sub-circuit and a second light emission control sub-circuit, a first reset sub-circuit and a second reset sub-circuit, the driving sub-circuit is electrically connected to a first node and a second node, and is configured to control a driving current flowing through the light-emitting element under a control of a level of the first node;

the data writing sub-circuit is electrically connected to the second node, and is configured to receive a scanning signal and write a data signal to the driving sub-circuit in response to the scanning signal;

the compensation sub-circuit is electrically connected to the first node and a third node, and is configured to receive the scanning signal and perform threshold compensation on the driving sub-circuit in response to the scanning signal;

the storage sub-circuit is electrically connected to the first node and is configured to store the data signal;

the first light emission control sub-circuit is electrically connected to the second node, and is configured to apply the first power supply voltage to the driving sub-circuit in response to a light emission control signal;

the second light emission control sub-circuit is electrically connected to the third node and a fourth node, and is configured to enable the driving current to be applied to the light-emitting element in response to the light emission control signal;

the first reset sub-circuit is electrically connected to the first node, and is configured to apply a first reset voltage to the first node in response to a first reset control signal;

the second reset sub-circuit is electrically connected to the fourth node, and is configured to apply a second reset voltage to the fourth node in response to a second reset control signal;

the driving sub-circuit comprises a first transistor, the data writing sub-circuit comprises a second transistor, the compensation sub-circuit comprises a third transistor, and the storage sub-circuit comprises a storage capacitor, the first light emission control sub-circuit comprises a fourth transistor, the second light emission control sub-circuit comprises a fifth transistor, the first reset sub-circuit comprises a sixth transistor, the second reset sub-circuit comprises a seventh transistor, a plurality of reset signal lines, extending along a first direction, and each of the plurality of reset signal lines is electrically connected to the pixel driving circuits of the plurality of sub-pixels located in one row in one-to-one correspondence to provide a reset signal;

a first electrode layer, comprising a plurality of first power supply voltage lines, a plurality of first signal lines, a plurality of first transfer electrodes, a plurality of second transfer electrodes and a plurality of third transfer electrodes, each of the first transfer electrodes, each of the second transfer electrodes, and each of the third transfer electrodes are located in the pixel driving circuit of each of the plurality of sub-pixels, wherein the plurality of first power supply voltage lines extend along a second direction different from the first direction, the plurality of first power supply voltage lines are electrically connected to the pixel driving circuits of the plurality of sub-pixels, and the plurality of first power supply voltage lines are configured to provide the first power supply voltages to the pixel driving circuits, the plurality of first signal lines extend along the second direction and are arranged side by side with the plurality of first power supply voltage lines, and the plurality of first signal lines are configured to provide first display signals to the pixel driving circuits of the plurality of sub-pixels, each of the first transfer electrodes extends along the second direction and is electrically connected to the first transistor and the third transistor, each of the second transfer electrodes extends along the second direction and is electrically connected to the sixth transistor and the reset signal line, each of the third transfer electrodes is electrically connected to the fifth transistor and the light-emitting element, wherein the first electrode of each of the plurality of sub-pixels comprises a body portion, the body portion comprises a first body sub-portion and a second body sub-portion, and the first body sub-portion and the second body sub-portion are located at two sides of a center line extending in the second direction of the body portion, a value of a ratio of an area of an overlapping portion of an orthographic projection of the first body sub-portion on a board surface of the base substrate and an orthographic projection of the first electrode layer on the board surface of the base substrate, to an area of an overlapping portion of an orthographic projection of the second body sub-portion on the board surface of the base substrate and the orthographic projection of the first electrode layer on the board surface of the base substrate ranges from 0.82 to 1.02.

2. The display substrate according to claim 1, wherein a width of a region between two adjacent first power supply voltage lines along the first direction is larger than a width of the light-emitting region of the light-emitting element of each of the plurality of sub-pixels along the first direction.

3. The display substrate according to claim 2, wherein the light-emitting regions of the light-emitting elements of at least a part of the sub-pixels are located between the orthographic projections of two adjacent first power supply voltage lines on the board surface of the base substrate.

4. The display substrate according to claim 3, wherein the light-emitting regions of the light-emitting elements of a part of sub-pixels partially overlap with an orthographic projection of at least one of the plurality of first power supply voltage lines on the board surface of the base substrate, an overlapping portion of an orthographic projection of at least one of the plurality of first power supply voltage lines on the board surface of the base substrate and the light-emitting regions of the light-emitting elements of a part of the plurality of sub-pixels are symmetrical about a center line extending in the second direction of the light-emitting regions.

5. The display substrate according to claim 2, wherein a value range of a width of a region between two adjacent first power supply voltage lines is 21 microns to 23 microns, a value range of a width of the light-emitting region of the light-emitting element of each of the plurality of sub-pixels along the first direction is about 10 microns to 20.5 microns.

6. The display substrate according to claim 5, wherein a value range of a distance between center points of corresponding positions of the two adjacent first power supply voltage lines along the first direction is about 24 microns to 30 microns; and a value range of a width of each of the plurality of first power supply voltage lines along the first direction is about 3.3 microns to 7.3 microns.

7. The display substrate according to claim 2, wherein the light-emitting regions of the light-emitting elements of a part of sub-pixels partially overlap with an orthographic projection of at least one of the plurality of first power supply voltage lines on the board surface of the base substrate,
an overlapping portion of an orthographic projection of at least one of the plurality of first power supply voltage lines on the board surface of the base substrate and the light-emitting regions of the light-emitting elements of a part of the plurality of sub-pixels are symmetrical about a center line extending in the second direction of the light-emitting regions.

8. The display substrate according to claim 2, further comprising a pixel definition layer,
wherein the pixel definition layer is disposed on a side of the pixel driving circuits of the plurality of sub-pixels away from the base substrate, and the pixel definition layer comprises a plurality of openings,
the plurality of openings are located in the light-emitting elements of the plurality of sub-pixels in one-to-one correspondence, and each of the plurality of openings is configured to expose the body portion of the first electrode to form the light-emitting region of the light-emitting element.

9. The display substrate according to claim 1, wherein the light-emitting regions of the light-emitting elements of a part of the sub-pixels do not overlap with the orthographic projections of the plurality of first power supply voltage lines on the board surface of the base substrate.

10. The display substrate according to claim 1, wherein a center line extending along the second direction of the light-emitting regions of the light-emitting elements of a part of the plurality of sub-pixels at least partially overlaps with an orthographic projection of one of the plurality of first power supply voltage lines on the board surface of the base substrate.

11. The display substrate according to claim 1, wherein the light-emitting regions of the light-emitting elements of a part of sub-pixels partially overlap with an orthographic projection of at least one of the plurality of first power supply voltage lines on the board surface of the base substrate,
an overlapping portion of an orthographic projection of at least one of the plurality of first power supply voltage lines on the board surface of the base substrate and the light-emitting regions of the light-emitting elements of a part of the plurality of sub-pixels are symmetrical about a center line extending in the second direction of the light-emitting regions.

12. The display substrate according to claim 1, further comprising a pixel definition layer,
wherein the pixel definition layer is disposed on a side of the pixel driving circuits of the plurality of sub-pixels away from the base substrate, and the pixel definition layer comprises a plurality of openings,
the plurality of openings are located in the light-emitting elements of the plurality of sub-pixels in one-to-one correspondence, and each of the plurality of openings is configured to expose the body portion of the first electrode to form the light-emitting region of the light-emitting element.

13. The display substrate according to claim 1, wherein the light-emitting regions of the light-emitting elements of a part of the sub-pixels do not overlap with orthographic projections of the plurality of first signal lines on the board surface of the base substrate.

14. The display substrate according to claim 1, further comprising a plurality of sub-pixel units arranged in a plurality of rows and a plurality of columns, wherein each of the plurality of pixel units comprises a plurality of sub-pixels,
the sub-pixels of each of the pixel units comprise a first sub-pixel, a second sub-pixel and a third sub-pixel,
the first sub-pixel comprises a first light-emitting element and a first pixel driving circuit,
the second sub-pixel comprises a second light-emitting element and a second pixel driving circuit,
the third sub-pixel comprises a third light-emitting element and a third pixel driving circuit,
a first electrode of the first light-emitting element and a first electrode of the second light-emitting element are arranged along the second direction, and a first electrode of the third light-emitting element is located on a side of both the first electrode of the first light-emitting element and the first electrode of the second light-emitting element along the first direction,
wherein an orthographic projection of the first electrode of the first light-emitting element of the first sub-pixel on the board surface of the base substrate partially overlaps with an orthographic projection of the first pixel driving circuit and an orthographic projection of the third pixel driving circuit on the board surface of the base substrate,
an orthographic projection of the first electrode of the second light-emitting element of the second sub-pixel on the board surface of the base substrate partially overlaps with the orthographic projection of the first pixel driving circuit and the orthographic projection of the third pixel driving circuit on the board surface of the base substrate, and
an orthographic projection of the first electrode of the third light-emitting element of the third sub-pixel on the board surface of the base substrate partially overlaps with an orthographic projection of the second pixel driving circuit and the orthographic projection of the third pixel driving circuit on the board surface of the base substrate.

15. The display substrate according to claim 14, wherein an orthographic projection of the first body sub-portion of the first electrode of the first light-emitting element on the board surface of the base substrate partially overlaps with the orthographic projections of the first power supply voltage line and the first signal line electrically connected to the third pixel driving circuit on the board surface of the base substrate,
an orthographic projection of the second body sub-portion of the first electrode of the first light-emitting element on the board surface of the base substrate partially overlaps with the orthographic projection of the first power supply voltage line electrically connected to the first pixel driving circuit on the board surface of the base substrate,
an overlapping portion of the orthographic projection of the second body sub-portion and the orthographic projection of the first power supply voltage line electrically connected to the first pixel driving circuit on the board surface of the base substrate is larger than an overlapping portion of the orthographic projection of the first body sub-portion and the orthographic projection of the first power supply voltage line electrically connected to the third pixel driving circuit on the board surface of the base substrate.

16. The display substrate according to claim 15, wherein the light-emitting region of the first light-emitting element does not overlap with the orthographic projection of the first power supply voltage line of the sub-pixel unit where the first light-emitting element is located on the board surface of the base substrate.

17. The display substrate according to claim 14, wherein each of the plurality of first power supply voltage lines comprises an S-shaped bent portion,
- an orthographic projection of the first body sub-portion of the first electrode of the second light-emitting element on the board surface of the base substrate partially overlaps with an orthographic projection of the bent portion of the first power supply voltage line electrically connected to the third pixel driving circuit and the orthographic projection of the first signal line on the board surface of the base substrate,
- an orthographic projection of the second body sub-portion of the first electrode of the second light-emitting element on the board surface of the base substrate partially overlaps an orthographic projection of the bent portion of the first power supply voltage line electrically connected to the first pixel driving circuit, an orthographic projection of a first connection electrode of the first pixel driving circuit and an orthographic projection of a second connection electrode of the first pixel driving circuit on the board surface of the base substrate.

18. The display substrate according to claim 14, wherein a center line of a first connection electrode of the second pixel driving circuit extending along the second direction and a center line of the first signal line electrically connected to the second pixel driving circuit extending along the second direction are symmetrical with respect to a center line extending along the second direction of the body portion of the first electrode of the third light-emitting element,
- an orthographic projection of the first body sub-portion of the first electrode of the third light-emitting element on the board surface of the base substrate partially overlaps with an orthographic projection of a first connection electrode of the second pixel driving circuit on the board surface of the base substrate,
- an orthographic projection of the second body sub-portion of the first electrode of the third light-emitting element on the board surface of the base substrate partially overlaps with the orthographic projection of the first signal line electrically connected to the second pixel driving circuit on the board surface of the base substrate,
- an orthographic projection of the center line of the body portion of the first electrode of the third light-emitting element on the board surface of the base substrate partially overlaps with the orthographic projection of the first power supply voltage line electrically connected to the second pixel driving circuit on the board surface of the base substrate.

19. The display substrate according to claim 14, wherein the first sub-pixel is a red sub-pixel, the second sub-pixel is a green sub-pixel, and the third sub-pixel is a blue sub-pixel.

20. A display device, comprising the display panel according to claim 1.

* * * * *